(12) United States Patent
Liu et al.

(10) Patent No.: US 12,435,270 B2
(45) Date of Patent: Oct. 7, 2025

(54) ORGANIC COMPOUND, OLED, AND APPLICATION THEREOF

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Ying Liu, Wuhan (CN); Dong Jiang, Wuhan (CN); Dongyang Deng, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 798 days.

(21) Appl. No.: 17/830,610

(22) Filed: Jun. 2, 2022

(65) Prior Publication Data

US 2022/0320437 A1    Oct. 6, 2022

(30) Foreign Application Priority Data

Dec. 30, 2021 (CN) .......................... 202111653990.5

(51) Int. Cl.
    C09K 11/06    (2006.01)
    C07F 5/02     (2006.01)
    (Continued)

(52) U.S. Cl.
    CPC .............. C09K 11/06 (2013.01); C07F 5/027 (2013.01); H10K 85/322 (2023.02);
    (Continued)

(58) Field of Classification Search
    CPC . C09K 11/06; C09K 2211/1014; C07F 5/027; H10K 85/322; H10K 85/658; H10K 50/11; H10K 50/858
    See application file for complete search history.

(56) References Cited

U.S. PATENT DOCUMENTS

| | | | |
|---|---|---|---|
| 9,073,948 B2 * | 7/2015 | Kottas | .................. H10K 50/11 |
| 2014/0014922 A1 | 1/2014 | Lin et al. | |
| 2023/0309399 A1 * | 9/2023 | Zink | .................... H10K 85/658 |

FOREIGN PATENT DOCUMENTS

| | | |
|---|---|---|
| CN | 112174992 A | 1/2021 |
| JP | 2021063067 A | 4/2021 |
| WO | 2021245221 A1 | 12/2021 |

OTHER PUBLICATIONS

Luo, X. F., Ni, H. X., Lv, A. Q., Yao, X. K., Ma, H. L., & Zheng, Y. X. (2022). High-Efficiency and Narrowband OLEDs from Blue to Yellow with Ternary Boron/Nitrogen-Based Polycyclic Heteroaromatic Emitters. Advanced Optical Materials, 10(16), 2200504. (Year: 2022).*

(Continued)

*Primary Examiner* — Dawn L Garrett
(74) *Attorney, Agent, or Firm* — KDW Firm PLLC

(57) ABSTRACT

Provided are an organic compound, an OLED, and an application thereof. The organic compound has a structure shown in Formula I; the compound is a polycyclic aromatic compound with large conjugate plane, which is formed by connecting aromatic fused rings with heterogeneous elements such as boron and nitrogen. Through the design of skeleton structure and substituents, the compound has narrow half-peak width, high color purity and internal quantum efficiency; and with substituents introduction, the intermolecular aggregation can be effectively inhibited, thereby avoiding fluorescence decrease induced by aggregation and improving luminescence efficiency of the device, and meanwhile, can also effectively regulate triplet energy level of molecules, and effectively prolong the device lifetime. The organic compound is used for OLED devices, especially for light-emitting layer materials, which can effectively improve the luminescence efficiency, reduce turn-on voltage and (Continued)

energy consumption, prolong working life, and enable the OLED device to have better comprehensive performance.

19 Claims, 1 Drawing Sheet

(51) Int. Cl.
  *H10K 50/11* (2023.01)
  *H10K 85/30* (2023.01)
  *H10K 85/60* (2023.01)
(52) U.S. Cl.
  CPC .... *H10K 85/658* (2023.02); *C09K 2211/1014* (2013.01); *H10K 50/11* (2023.02)

(56) References Cited

OTHER PUBLICATIONS

Yang, M., Park, I. S., & Yasuda, T. (2020). Full-color, narrowband, and high-efficiency electroluminescence from boron and carbazole embedded polycyclic heteroaromatics. Journal of the American Chemical Society, 142(46), 19468-19472. (Year: 2020).*

* cited by examiner

ORGANIC COMPOUND, OLED, AND APPLICATION THEREOF

CROSS-REFERENCE TO RELATED APPLICATION(S)

This present disclosure claims priority to Chinese Patent Application No. CN 202111653990.5 filed on Dec. 30, 2021, the disclosure of which is incorporated herein by reference in its entirety.

TECHNICAL FIELD

The present disclosure belongs to the technical field of electroluminescent materials, and specifically, relates to an organic compound, an OLED, and an application thereof.

BACKGROUND

Organic electroluminescence (EL) technology is a new generation of display technology with broad development prospects. Compared with inorganic electroluminescence devices, organic light-emitting diode (OLED) devices have the advantages of high luminescence efficiency, flexible, ultra-thinness, self-luminescence, wide viewing angle, fast response, good temperature adaptability, simple production process, low drive voltage, low energy consumption, full luminescence color and the like, and are widely used in flexible display, flat panel display, solid-state lighting and vehicle display.

The OLED device usually has a sandwich-like stacked structure which includes a cathode, an anode and an organic thin-film layer disposed between the cathode and the anode. The organic thin-film layer is the core of OLED devices, and the types and properties of the material of the organic thin-film layer directly affect the photoelectric performance of the OLED. The organic thin-film layer includes a variety of organic functional materials, mainly including a hole injection material, a hole transport material, an electron blocking material, a hole blocking material, an electron transport material, an electron injection material, a light-emitting host material and a light-emitting guest material. When the device is energized, electrons and holes are injected, transported to a light-emitting region and recombined, thus generating excitons and emitting light.

The light emitting mechanism of the organic electroluminescent materials may be divided into two types: electroluminescence and electrophosphorescence, where electroluminescence is the radiative decay and transition of singlet excitons while the electrophosphorescence is light emitted when triplet excitons radioactively decay to a ground state. According to the spin quantum statistics theory, the probability ratio of the formation of singlet excitons and triplet excitons is 1:3. Therefore, the internal quantum efficiency of electroluminescent materials does not exceed 25%, and the external quantum efficiency is generally lower than 5%. The internal quantum efficiency of electrophosphorescent materials reaches 100% in theory, and the external quantum efficiency may reach 20%. In 1998, Prof. Ma Yuguang, Jilin University and Prof. Forrest, Princeton University, USA, had reported the discoveries of doping osmium complex and platinum complex as dyes into the light-emitting layer, respectively. They, for the first time, obtained and explained the phenomenon of phosphorescent electroluminescence and had applied the prepared phosphorescent materials to organic electroluminescent devices.

With the continuous development of display technology, there are higher requirements for the photoelectric properties of OLED devices. However, the current organic electroluminescent materials still have many shortcomings in luminescence performance, stability, light color, processability and the like and cannot meet the actual requirements of high-performance OLED devices. Therefore, it is an urgent problem to be solved to develop more types of organic electroluminescent materials with higher performance in the art.

SUMMARY

To develop more types of organic electroluminescent materials with higher performance, a first aspect of the present disclosure is to provide an organic compound having a structure as shown in Formula I:

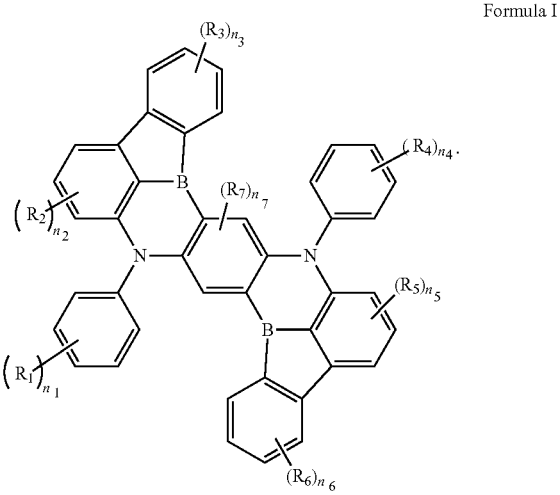

Formula I

In Formula I, $R_1$, $R_2$, $R_3$, $R_4$, $R_5$, $R_6$, and $R_7$ are each independently selected from any one of substituted or unsubstituted C1 to C30 linear or branched alkyl, substituted or unsubstituted C3 to C30 cycloalkyl, or substituted or unsubstituted C6 to C30 aryl.

In Formula I, $n_1$ and $n_4$ are each independently selected from integers from 0 to 5 and may be, for example, 0, 1, 2, 3, 4 or 5.

In Formula I, $n_2$, $n_3$, $n_5$, and $n_6$ are each independently selected from integers from 0 to 4 and may be, for example, 0, 1, 2, 3 or 4.

In Formula I, $n_7$ is selected from integers from 0 to 2 and may be, for example, 0, 1 or 2.

The organic compound provided by the present disclosure has excellent luminescence performance and enhanced stability through the special design of molecular structure; the organic compound, when used in an OLED device, is suitable for a light-emitting layer material and especially suitable for a doped material of the light-emitting layer, which endows the device with higher luminescence efficiency and lower energy consumption and effectively prolongs the working life of the device.

In the present disclosure, the C1 to C30 linear or branched alkyl may be C1, C2, C3, C4, C5, C6, C8, C9, C10, C12, C13, C14, C15, C16, C18, C20, C22, C24, C26 or C28 linear or branched alkyl.

The C3 to C30 cycloalkyl may be C3, C4, C5, C6, C8, C9, C10, C12, C13, C14, C15, C16, C18, C20, C22, C24, C26 or C28 cycloalkyl.

The C6 to C30 aryl may be C6, C8, C9, C10, C12, C13, C14, C15, C16, C18, C20, C22, C24, C26 or C28 aryl.

A second aspect of the present disclosure is to provide an OLED device. The OLED device includes an anode, a cathode and an organic thin-film layer disposed between the anode and the cathode, and the organic thin-film layer includes at least one organic compound as described in the first aspect.

A third aspect of the present disclosure is to provide a display panel including the OLED device as described in the second aspect.

A fourth aspect of the present disclosure is to provide an electronic device including the OLED device as described in the second aspect or the display panel as described in the third aspect.

Figure 1:
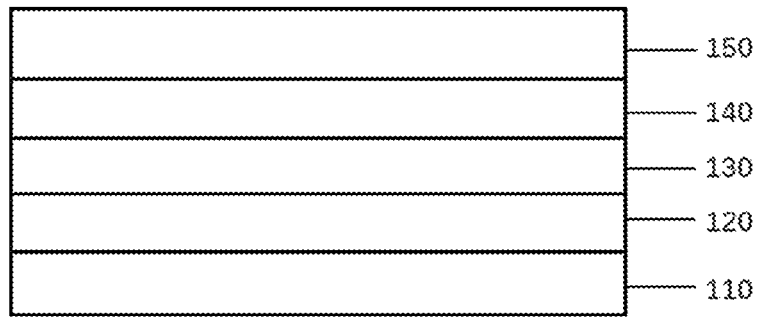
FIG. 1 is a structural schematic diagram of an OLED device according to an embodiment of the present disclosure.
Figure 2:
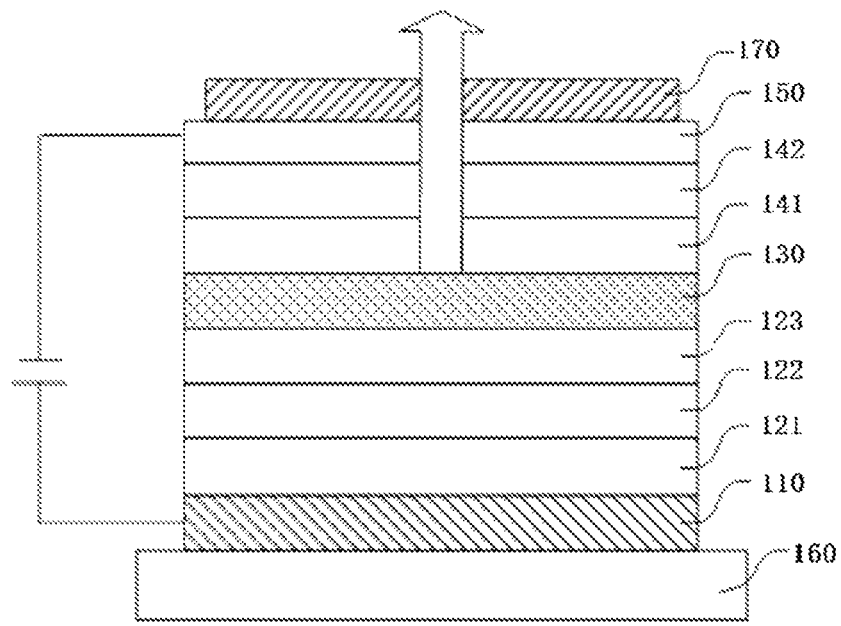
FIG. 2 is a structural schematic diagram of an OLED device according to another embodiment of the present disclosure.

in the drawings: 110: anode; 120: first organic thin-film layer; 121: first hole transport layer; 122: second hole transport layer; 123: electron blocking layer; 130: light-emitting layer; 141: first electron transport layer; 142: second electron transport layer; 140: second organic thin-film layer; 150: cathode; 160: substrate; 170: capping layer.

DETAILED DESCRIPTION

The technical solutions of the present disclosure are further described below through specific embodiments. Those skilled in the art should understand that the embodiments described herein are used for a better understanding of the present disclosure and should not be construed as specific limitations to the present disclosure.

A first aspect of the present disclosure is to provide an organic compound having a structure as shown in Formula I:

Formula 1

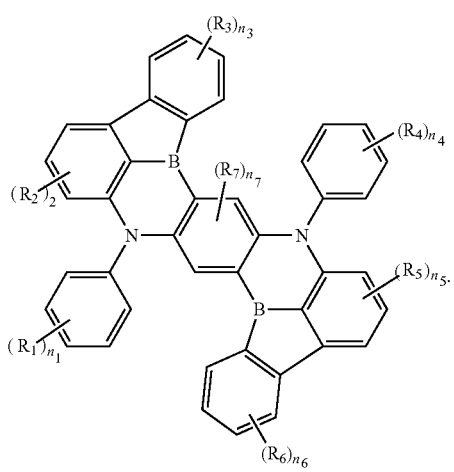

In Formula I, $R_1$, $R_2$, $R_3$, $R_4$, $R_5$, $R_6$, and $R_7$ are each independently selected from any one of substituted or unsubstituted C1 to C30 linear or branched alkyl, substituted or unsubstituted C3 to C30 cycloalkyl or substituted or unsubstituted C6 to C30 aryl.

In Formula I, $n_1$ and $n_4$ are each independently selected from integers from 0 to 5 and may be, for example, 0, 1, 2, 3, 4 or 5.

In Formula I, $n_2$, $n_3$, $n_5$, and $n_6$ are each independently selected from integers from 0 to 4 and may be, for example, 0, 1, 2, 3 or 4.

In Formula I, $n_7$ is selected from integers from 0 to 2 and may be, for example, 0, 1 or 2.

The organic compound provided by the present disclosure has a structure as shown in Formula I, the molecule of the organic compound includes a B—N skeleton structure centered on a benzene ring, and the N atom and the B boron atom have the opposite resonance effects, which is helpful to separate a HOMO orbital and a LUMO orbital of the compound, so that the compound has better photoelectric properties and enhanced stability; the organic compound is a polycyclic aromatic compound which is formed by connecting aromatic fused rings with heterogeneous elements such as boron and nitrogen and has a large conjugate plane, and has a narrow half-peak width, high color purity and high internal quantum efficiency; and meanwhile, the introduction of substituents can effectively inhibit the intermolecular aggregation, thereby avoiding the fluorescence decrease induced by aggregation and improving the luminescence efficiency of the device, and can also effectively regulate the triplet energy level of molecules, and effectively prolong the lifetime of the device. With the coordination of the specific skeleton structure and substituents, the organic compound has appropriate steric hindrance, and the direct accumulation of molecules is avoided, thereby improving the luminescence efficiency. Furthermore, the organic compound has good stability and can meet the evaporation requirements in the device processing.

The organic compound is used in an OLED device, may be used as a light-emitting layer material, and especially suitable for the doped material of the light-emitting layer, which can improve the transport ability of carriers, improve the transport balance of carriers, achieve red light emission, better light color and narrow half-peak width, endow the OLED device with higher luminescence efficiency, lower turn-on voltage and lower energy consumption, and prolong the working life of the device.

In the present disclosure, the expression of Ca to Cb means that the number of carbon atoms included in the group is a to b, and the number of carbon atoms does not include the number of carbon atoms of the substituent unless otherwise specified.

In the present disclosure, the expression of chemical elements includes the concept of isotopes having the same chemical properties, for example, hydrogen (H) includes $^1H$ (protium), $^2H$ (deuterium, D), $^3H$ (tritium, T) and the like and carbon (C) includes $^{12}C$, $^{13}C$ and the like.

In the present disclosure, the C1 to C30 linear or branched alkyl may be C1, C2, C3, C4, C5, C6, C8, C9, C10, C12, C13, C14, C15, C16, C18, C20, C22, C24, C26 or C28 linear or branched alkyl and includes, for example, but is not limited to, methyl, ethyl, n-propyl, isopropyl, n-butyl, isobutyl, t-butyl, n-amyl, isoamyl, neopentyl, n-hexyl, n-octyl, n-heptyl, n-nonyl, n-decyl and the like.

The C3 to C30 cycloalkyl may be C3, C4, C5, C6, C8, C9, C10, C12, C13, C14, C15, C16, C18, C20, C22, C24, C26 or C28 cycloalkyl and includes, for example, but is not limited to, cyclopropyl, cyclobutyl, cyclopentyl, cyclohexyl, adamantyl and the like.

The C6 to C30 aryl may be C6, C8, C9, C10, C12, C13, C14, C15, C16, C18, C20, C22, C24, C26 or C28 aryl and includes, for example, but is not limited to, phenyl, biphenylyl, terphenyl, naphthyl, anthryl, phenanthryl, fluorenyl, indenyl, perylenyl, fluorenyl and derivatives thereof (9,9-dimethylfluorenyl, 9,9-diethylfluorenyl, 9,9-diphenylfluorenyl, 9,9-dinaphthylluorenyl, spirodifluorenyl, benzofluorenyl and the like), fluoranthenyl, triphenylene, pyrenyl, perylenyl, chrysene, naphthacenyl and the like.

In the present disclosure, the "substituted or unsubstituted" group may be substituted with one substituent or a plurality of substituents. When the substituents are a plurality (at least two), the plurality (at least two) substituents are identical or different groups; and the same expressions involved hereinafter all have the same meaning.

In an embodiment, substituents in the substituted linear or branched alkyl, substituted cycloalkyl and substituted aryl are each independently selected from at least one of halogen, cyano, C1 to C10 (for example, C1, C2, C3, C4, C5, C6, C7, C8, C9 or C10) linear or branched alkyl, C1 to C10 (for example, C1, C2, C3, C4, C5, C6, C7, C8, C9 or C10) alkoxy, C6 to C20 (for example, C6, C9, C10, C12, C14, C16 or C18) aryl or C6 to C20 (for example, C6, C9, C10, C12, C14, C16 or C18) arylamino.

In the present disclosure, the halogen includes fluorine, chlorine, bromine or iodine, and the same expressions involved hereinafter have the same meaning.

In an embodiment, $R_1$, $R_2$, $R_3$, $R_4$, $R_5$, $R_6$, and $R_7$ are each independently selected from any one of C1 to C10 (for example, C1, C2, C3, C4, C5, C6, C7, C8, C9 or C10) linear or branched alkyl, substituted or unsubstituted C3 to C10 (for example, C3, C4, C5, C6, C7, C8, C9 or C10) cycloalkyl, or substituted or unsubstituted C6 to C20 (for example, C6, C9, C10, C12, C14, C16 or C18) aryl.

Substituted substituents in $R_1$, $R_2$, $R_3$, $R_4$, $R_5$, $R_6$, and $R_7$ are each independently selected from at least one of C1 to C10 (for example, C1, C2, C3, C4, C5, C6, C7, C8, C9 or C10) linear or branched alkyl or C3 to C10 (for example, C3, C4, C5, C6, C7, C8, C9 or C10) cycloalkyl.

In an embodiment, $R_1$, $R_2$, $R_3$, $R_4$, $R_5$, $R_6$, and $R_7$ are each independently selected from methyl, isopropyl, t-butyl, cyclohexyl, phenyl, naphthyl,

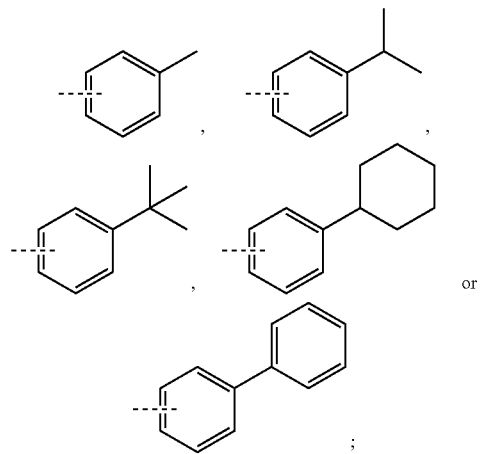

wherein the dotted line represents the linkage site of the group.

In an embodiment, $n_1$, $n_2$, $n_3$, $n_4$, $n_5$, $n_6$, and $n_7$ are each independently selected from integers from 0 to 2 and may be, for example, 0, 1 or 2.

In an embodiment, the sum of $n_1$, $n_2$, $n_3$, $n_4$, $n_5$, $n_6$, and $n_7$ ranges from 1 to 8 and may be, for example, 1, 2, 3, 4, 5, 6, 7 or 8.

In an embodiment, the expression that the sum of $n_1$, $n_2$, $n_3$, $n_4$, $n_5$, $n_6$, and $n_7$ ranges from 1 to 8, that is, the number of substituents ($R_1$, $R_2$, $R_3$, $R_4$, $R_5$, $R_6$, and $R_7$) in the skeleton structure is 1 to 8, so that the organic compound has excellent photoelectric properties, stability and processability. If there is no substituent in the molecular structure ($n_1$, $n_2$, $n_3$, $n_4$, $n_5$, $n_6$, and $n_7$ are all 0), the steric hindrance of the compound is small, which is not helpful to improve luminescence properties; if the number of substituents in the molecular structure is too much, the stability of the compound may be affected, which is not helpful for evaporation processing.

In an embodiment, the molecular structure of the organic compound is symmetrical, that is, $R_1$ and $R_4$ are identical, $R_2$ and $R_5$ are identical, and $R_3$ and $R_6$ are identical. The organic compound having symmetry is more helpful for synthesis.

In an embodiment, the organic compound has a structure as shown in Formula II:

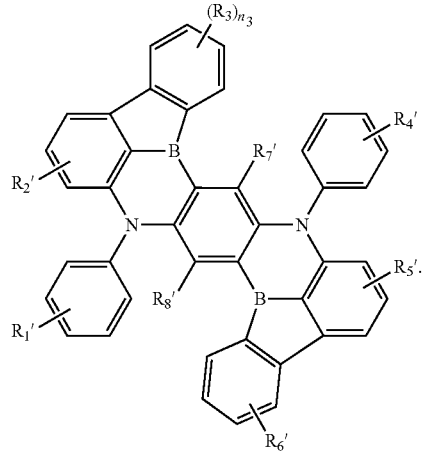

Formula II

In Formula II, $R_1'$, $R_2'$, $R_3'$, $R_4'$, $R_5'$, $R_6'$, $R_7'$, and $R_8'$ are each independently selected from any one of hydrogen, substituted or unsubstituted C1 to C30 (for example, C1, C2, C3, C4, C5, C6, C8, C9, C10, C12, C13, C14, C15, C16, C18, C20, C22, C24, C26 or C28) linear or branched alkyl, substituted or unsubstituted C3 to C30 (for example, C3, C4, C5, C6, C8, C9, C10, C12, C13, C14, C15, C16, C18, C20, C22, C24, C26 or C28) cycloalkyl, or substituted or unsubstituted C6 to C30 (for example, C6, C8, C9, C10, C12, C13, C14, C15, C16, C18, C20, C22, C24, C26 or C28) aryl.

Substituted substituents in $R_1'$, $R_2'$, $R_3'$, $R_4'$, $R_5'$, $R_6'$, $R_7'$, and $R_8'$ are each independently selected from at least one of halogen, cyano, C1 to C10 (for example, C1, C2, C3, C4, C5, C6, C7, C8, C9 or C10) linear or branched alkyl, C1 to C10 (for example, C1, C2, C3, C4, C5, C6, C7, C8, C9 or C10) alkoxy, C6 to C20 (for example, C6, C9, C10, C12, C14, C16 or C18) aryl, or C6 to C20 (for example, C6, C9, C10, C12, C14, C16 or C18) arylamino.

In an embodiment, the organic compound has a structure as shown in Formula III:

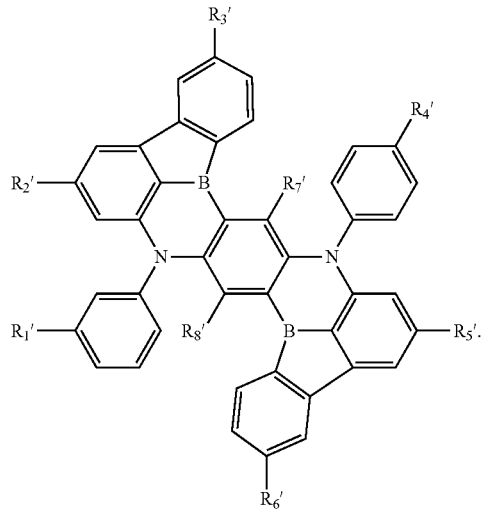

Formula III

In Formula III, $R_1'$, $R_2'$, $R_3'$, $R_4'$, $R_5'$, $R_6'$, $R_7'$, and $R_8'$ have the same range as defined in Formula II.

In an embodiment, $R_1'$, $R_2'$, $R_3'$, $R_4'$, $R_5'$, $R_6'$, $R_7'$, and $R_8'$ are each independently selected from any one of hydrogen, C1 to C10 (for example, C1, C2, C3, C4, C5, C6, C7, C8, C9 or C10) linear or branched alkyl, substituted or unsubstituted C3 to C10 (for example, C3, C4, C5, C6, C7, C8, C9 or C10) cycloalkyl or substituted or unsubstituted C6 to C20 (for example, C6, C9, C10, C12, C14, C16 or C18) aryl.

Substituted substituents in $R_1'$, $R_2'$, $R_3'$, $R_4'$, $R_5'$, $R_6'$, $R_7'$, and $R_8'$ are each independently selected from at least one of C1 to C10 (for example, C1, C2, C3, C4, C5, C6, C7, C8, C9 or C10) linear or branched alkyl or C3 to C10 (for example, C1, C2, C3, C4, C5, C6, C7, C8, C9 or C10) cycloalkyl.

In an embodiment, $R_1'$, $R_2'$, $R_3'$, $R_4'$, $R_5'$, $R_6'$, $R_7'$, and $R_8'$ are each independently selected from hydrogen, methyl, isopropyl, t-butyl, cyclohexyl, phenyl, naphthyl,

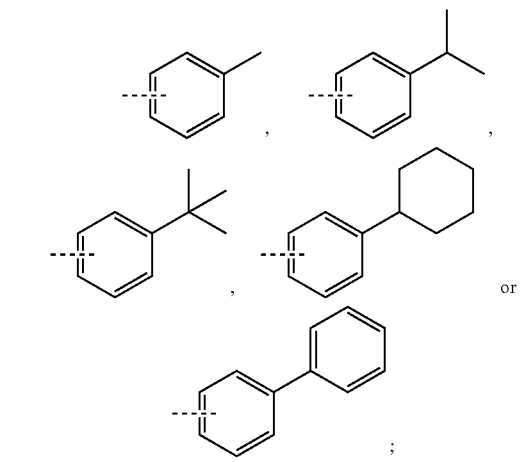

wherein the dotted line represents the linkage site of the group.

In an embodiment, $R_1'$ and $R_4'$ are identical groups, $R_2'$ and $R_5'$ are identical groups, and $R_3'$ and $R_6'$ are identical groups.

In an embodiment, not all of $R_1'$, $R_2'$, $R_3'$, $R_4'$, $R_5'$, $R_6'$, $R_7'$, and $R_8'$ are hydrogen.

In an embodiment, the number of groups that are not hydrogen in $R_1'$, $R_2'$, $R_3'$, $R_4'$, $R_5'$, $R_6'$, $R_7'$ and $R_8'$ is 1 to 6 and may be, for example, 1, 2, 3, 4, 5 or 6.

In an embodiment, the expression that the number of groups that are not hydrogen in $R_1'$, $R_2'$, $R_3'$, $R_4'$, $R_5'$, $R_6'$, $R_7'$ and $R_8'$ is 1 to 6 means that the number of substituents on the skeleton structure is 1 to 6, so that the organic compound has appropriate steric hindrance, and the planar stacking of molecules can be avoided, thereby improving the luminescence efficiency. Meanwhile, the organic compound has photoelectric properties and stability, which is helpful for evaporation processing, can improve the luminescence efficiency of the OLED device, reduce energy consumption and prolong the service life of the device.

In a specific embodiment, the organic compound is selected from any one of the following compounds D1 to D105:

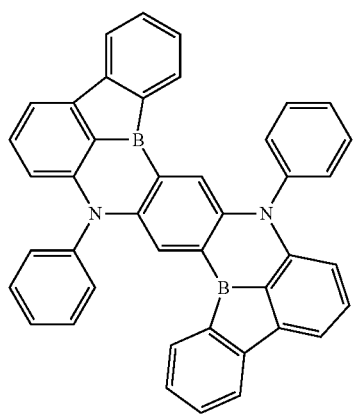

D1

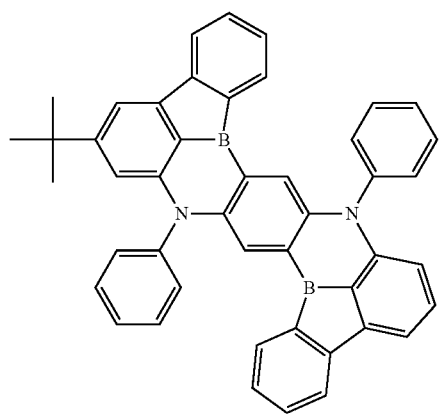

D2

-continued
| | |
|---|---|
| D3 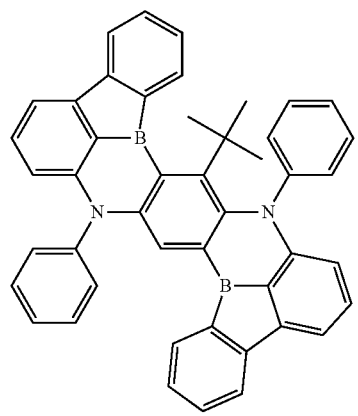 | D4 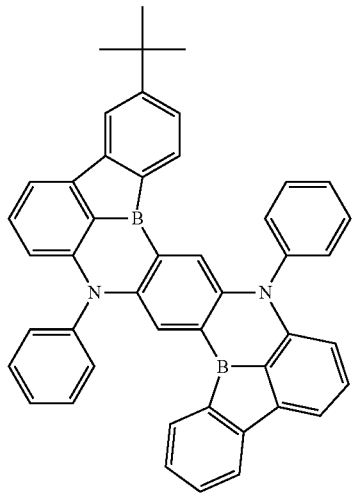 |
| D5 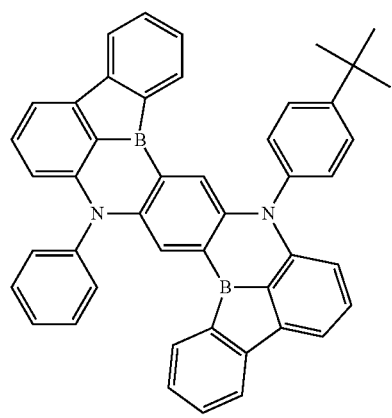 | D6 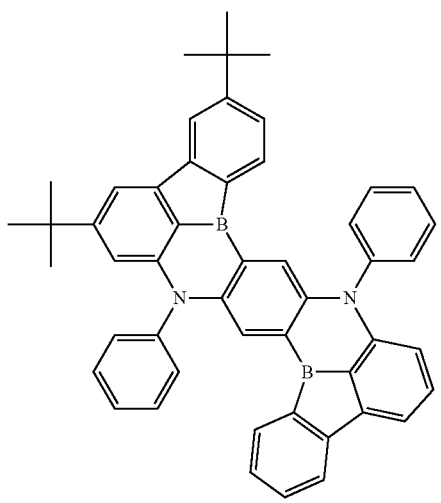 |
| D7 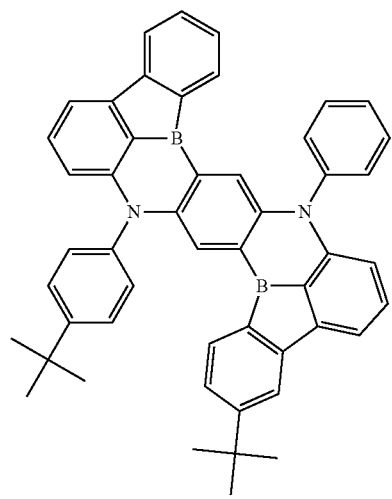 | D8 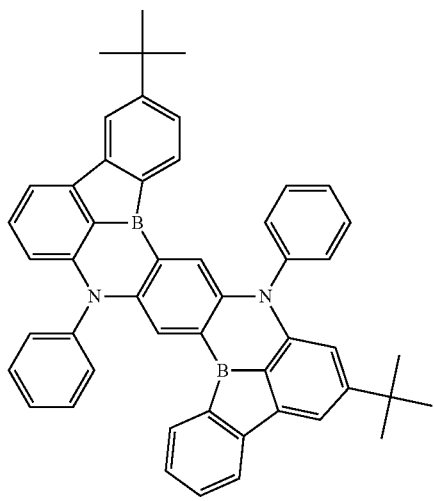 |

-continued
D9
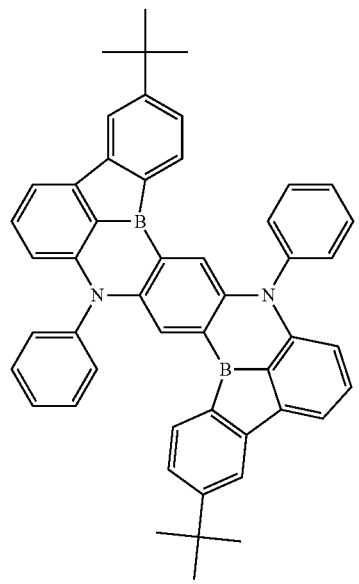
D10
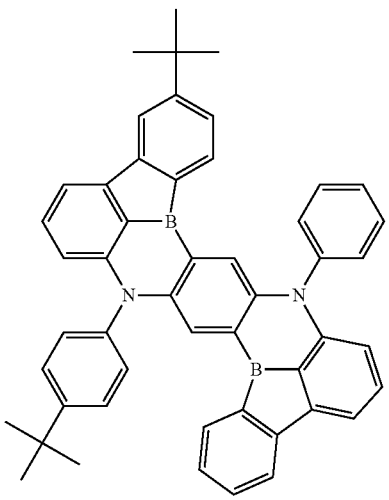
D11
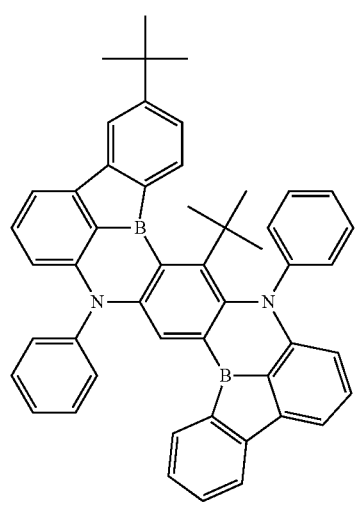
D12
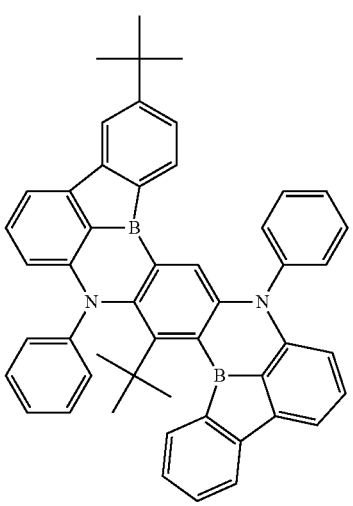
D13
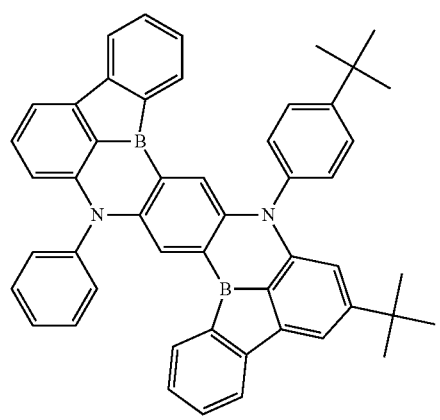
D14
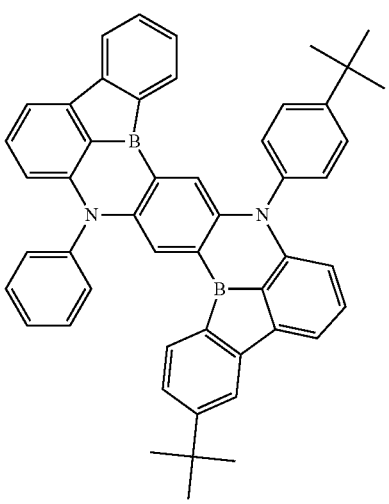

| D15 | D16 |
|---|---|
| 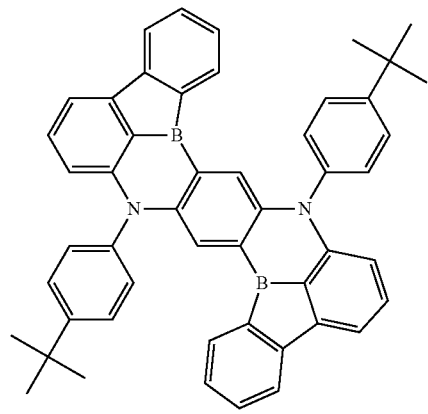 | 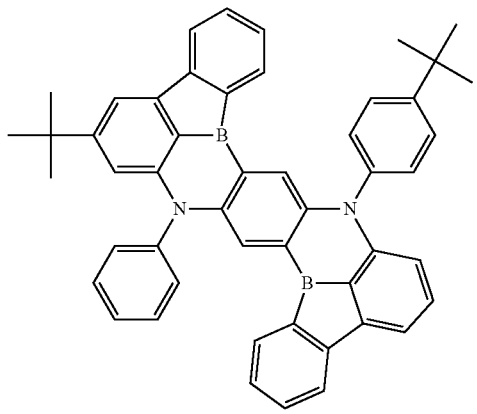 |
| D17 | D18 |
|---|---|
| 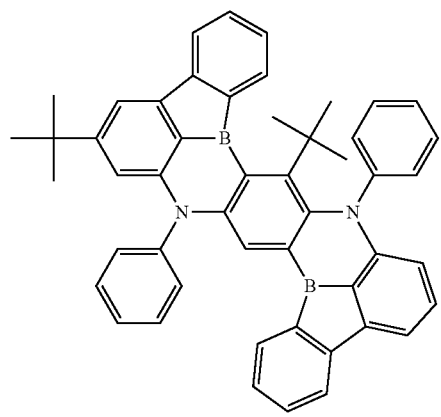 | 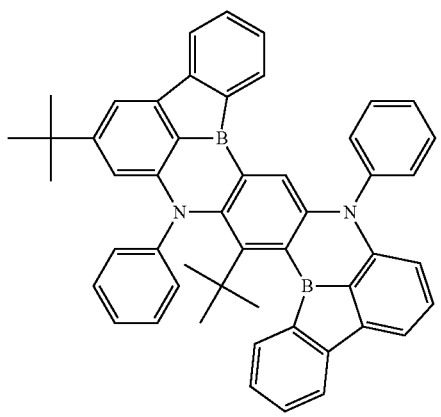 |
| D19 | D20 |
|---|---|
| 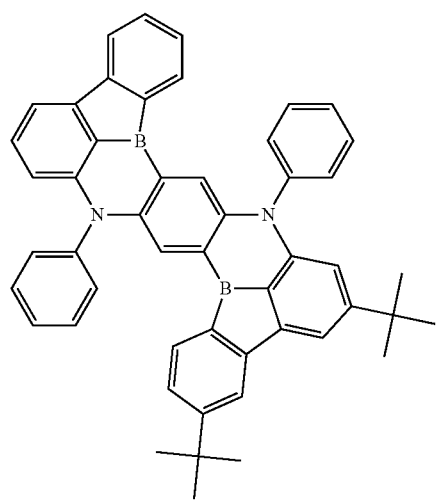 | 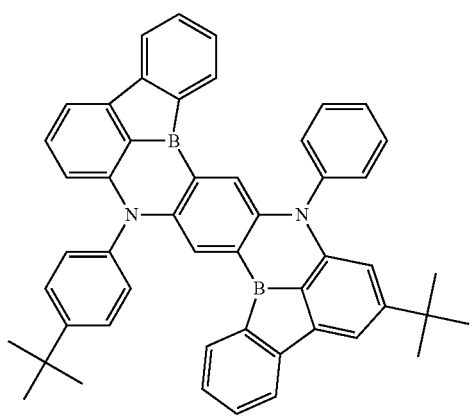 |

-continued
D21
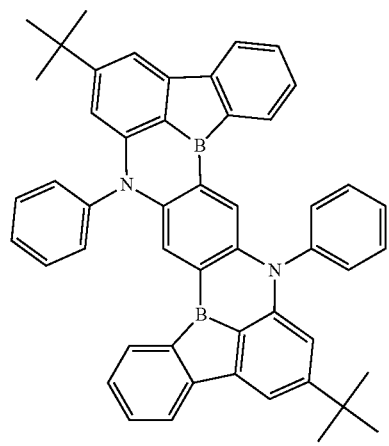
D22
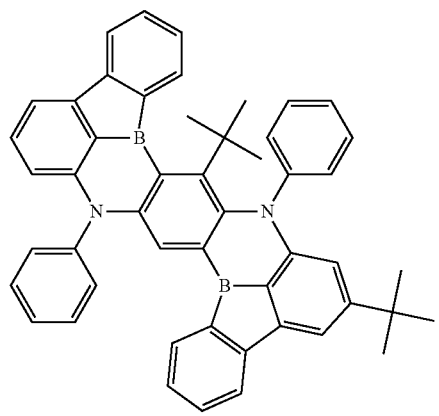
D23
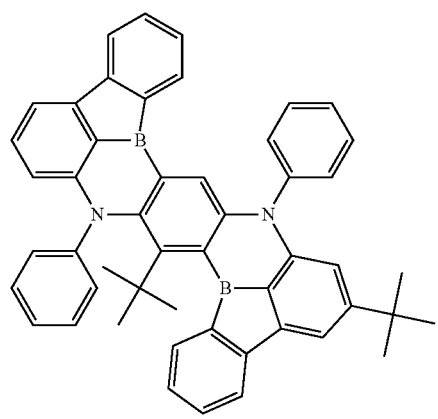
D24
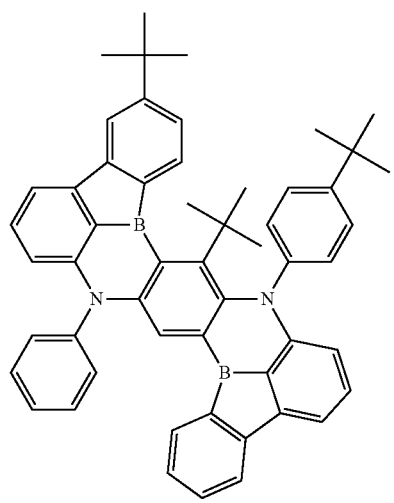
D25
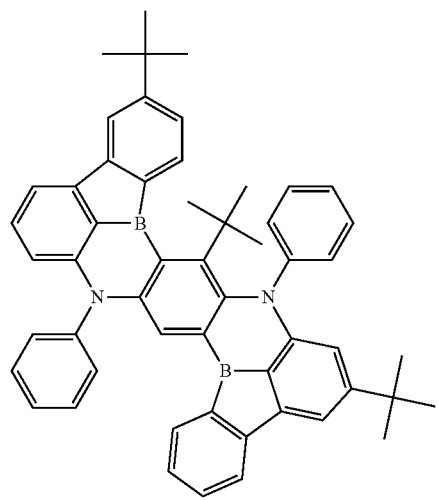
D26
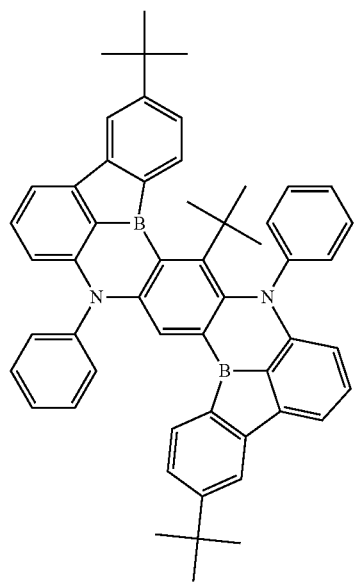

-continued
D27
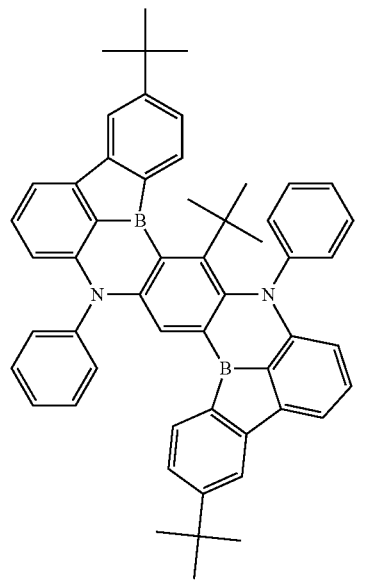
D28
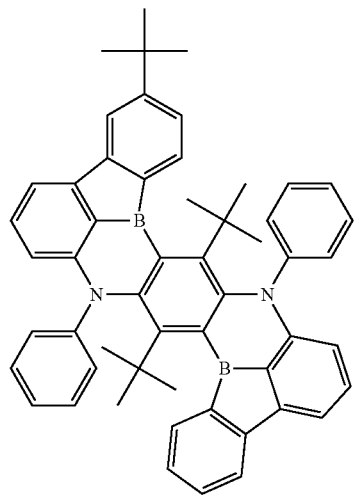
D29
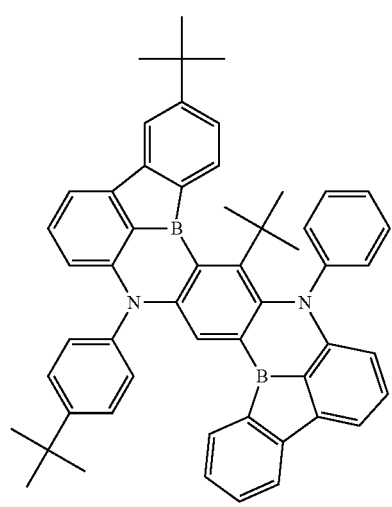
D30
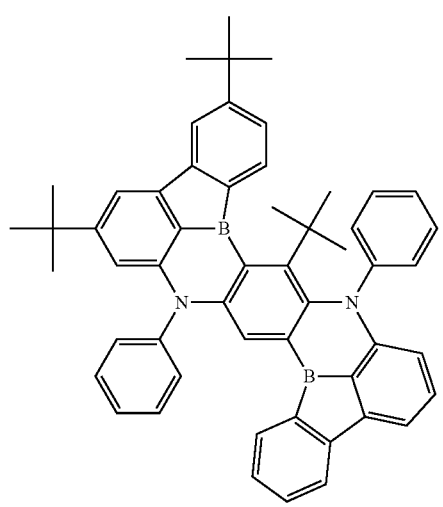
D31
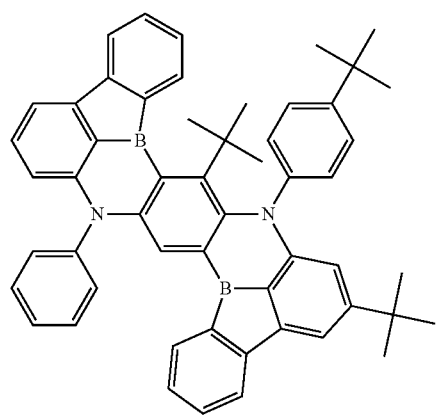
D32
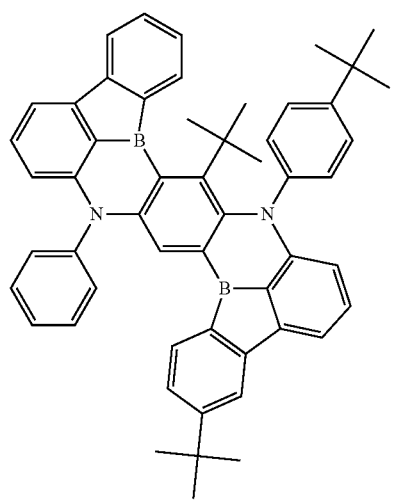

-continued
D33
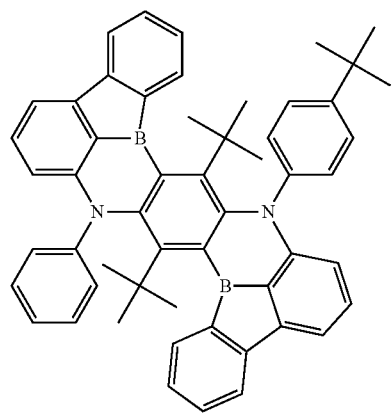
D34
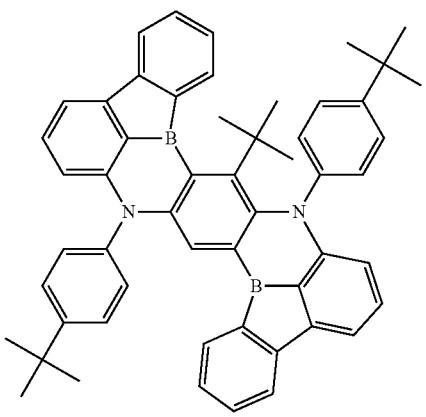
D35
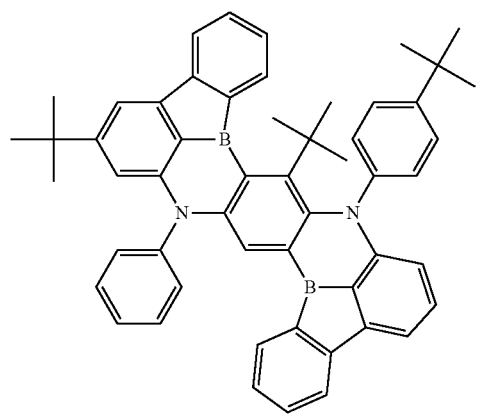
D36
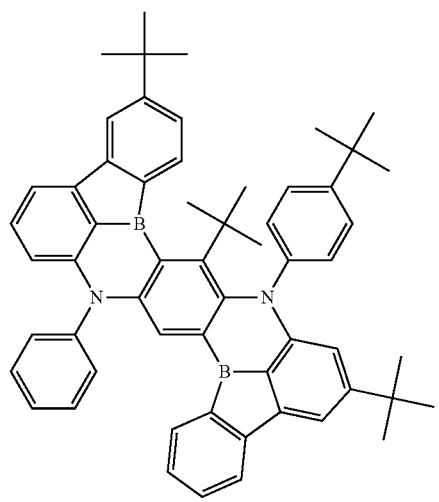
D37
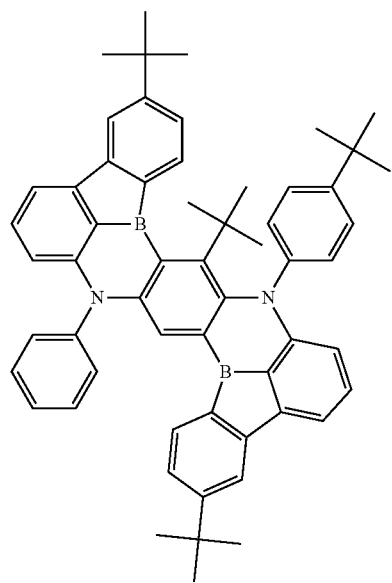
D38
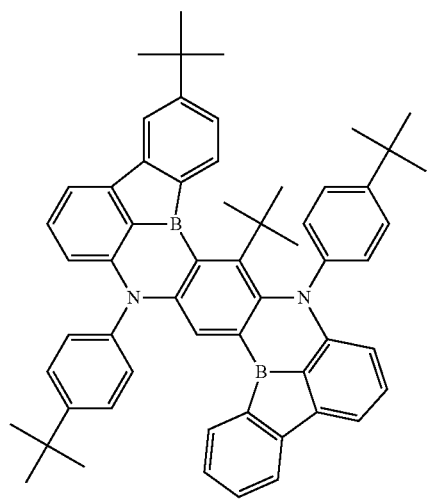

-continued
D39
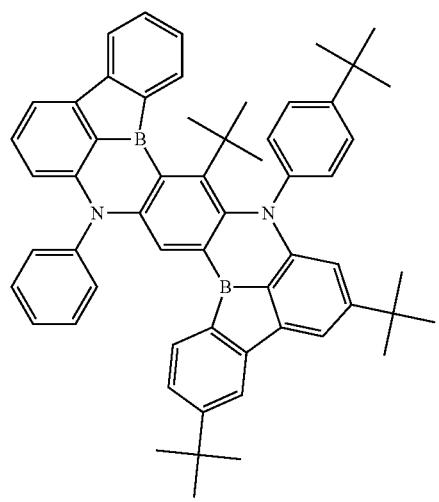
D40
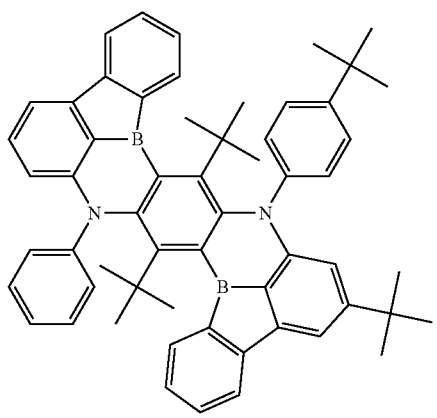
D41
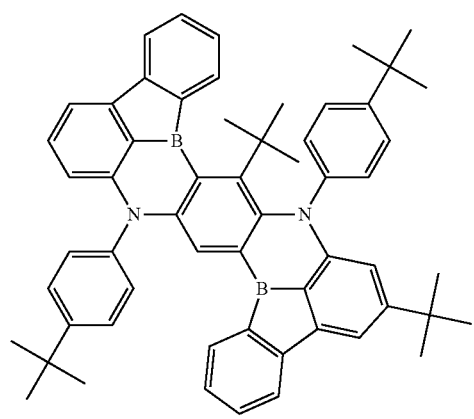
D42
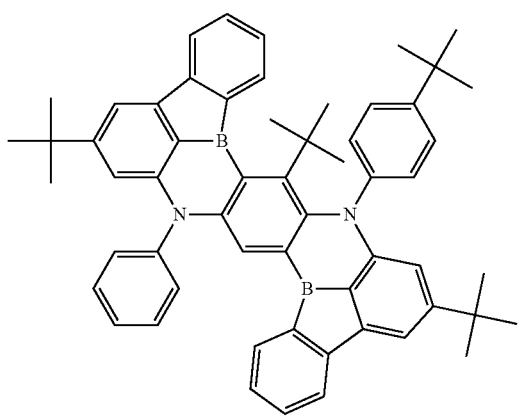
D43
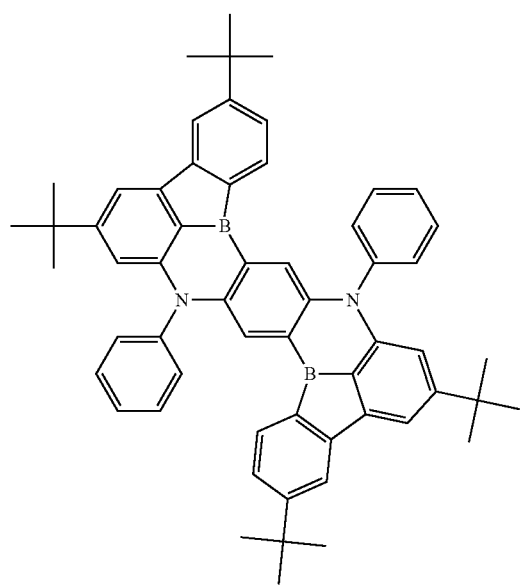
D44
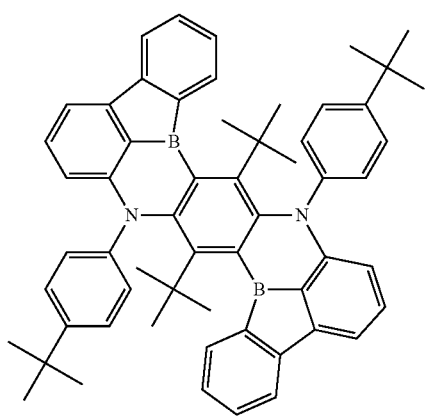

D45
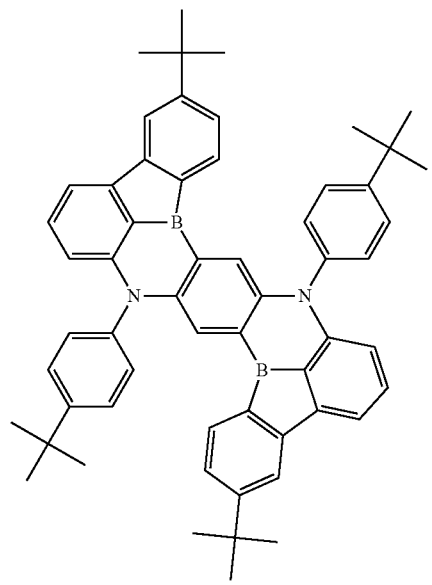
D46
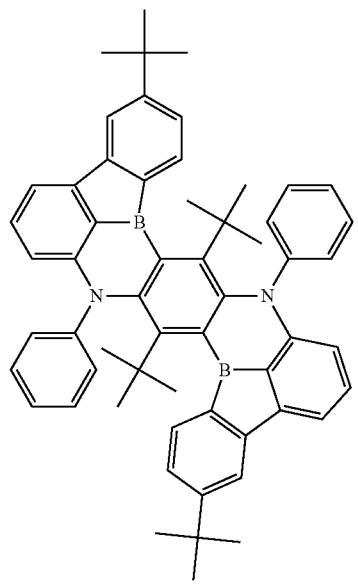
D47
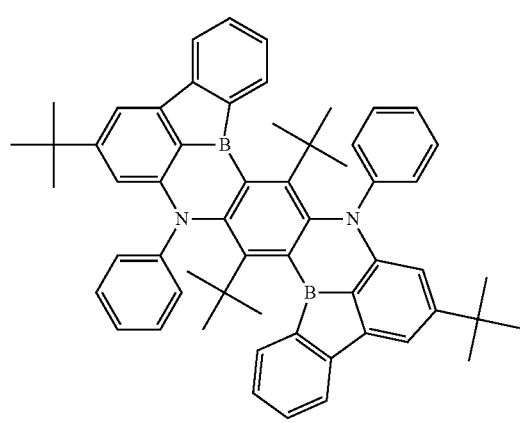
D48
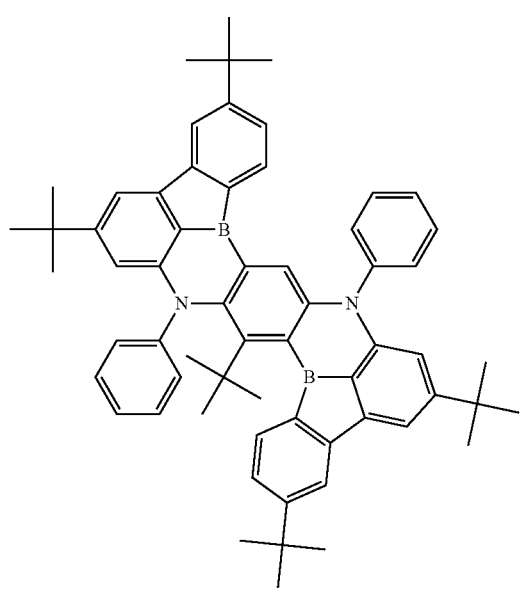

-continued
D49
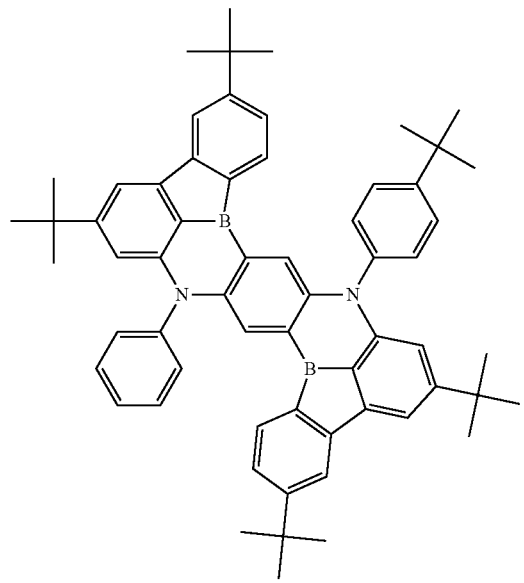
D50
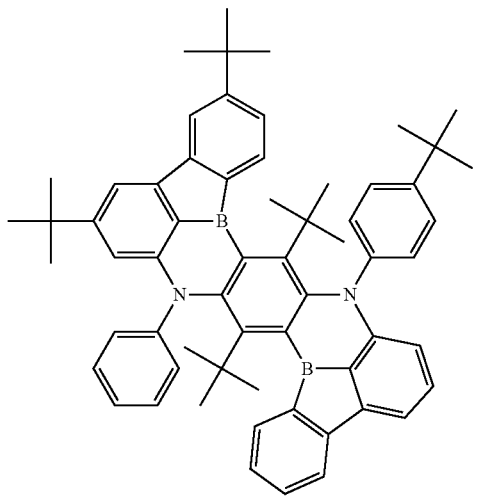
D51
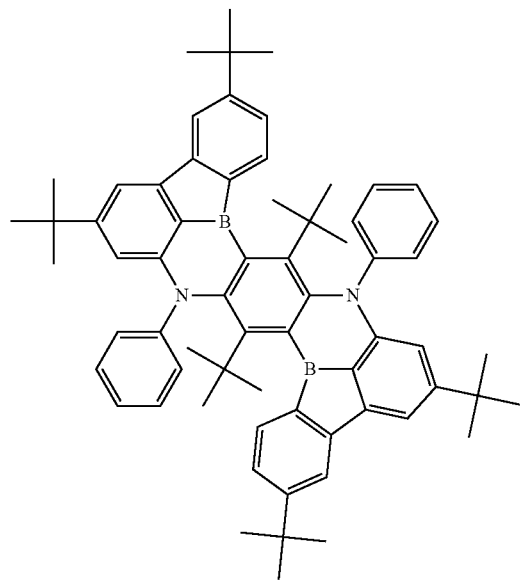
D52
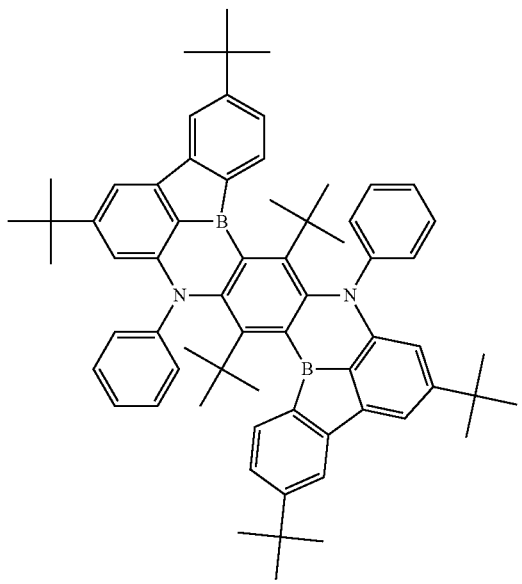

-continued
D53
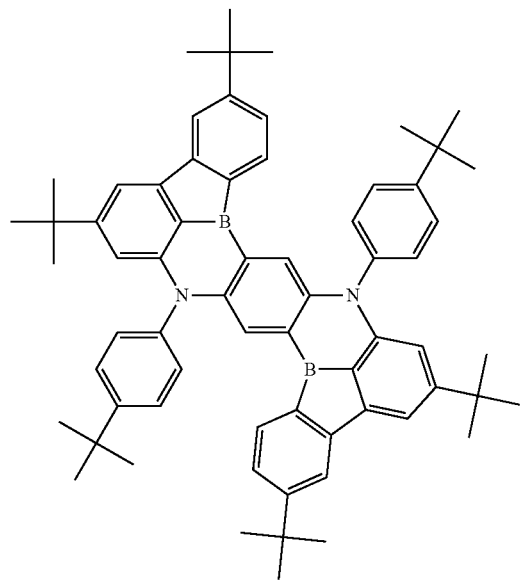
D54
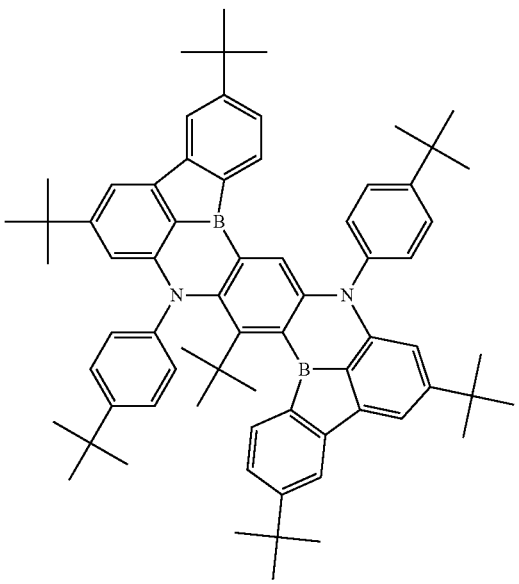
D55
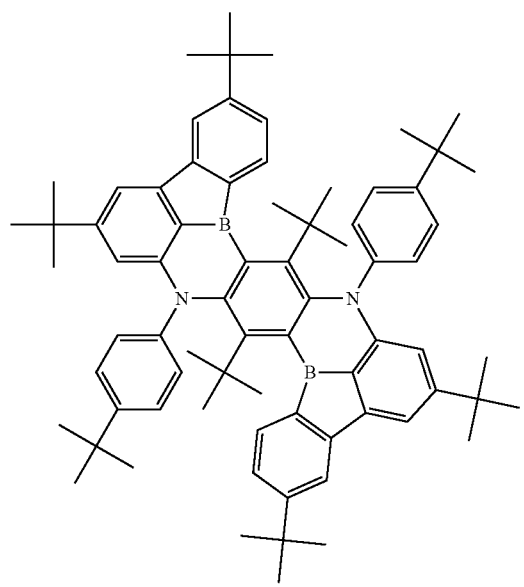
D56
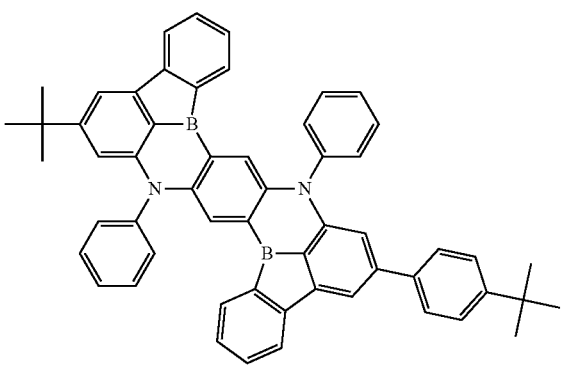
D57
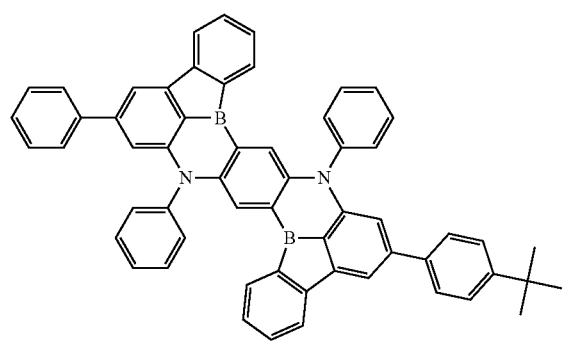
D58
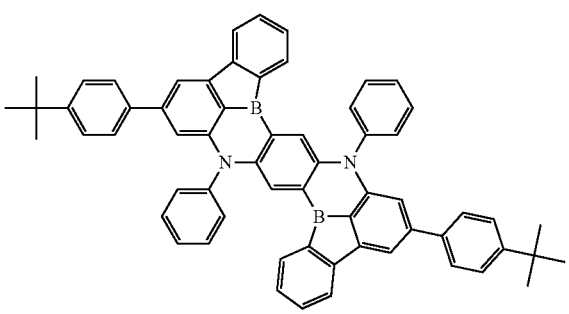

-continued
D59
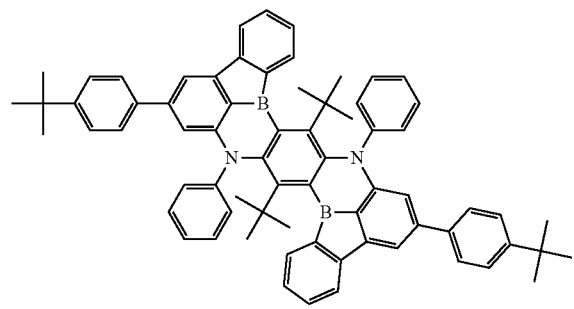
D60
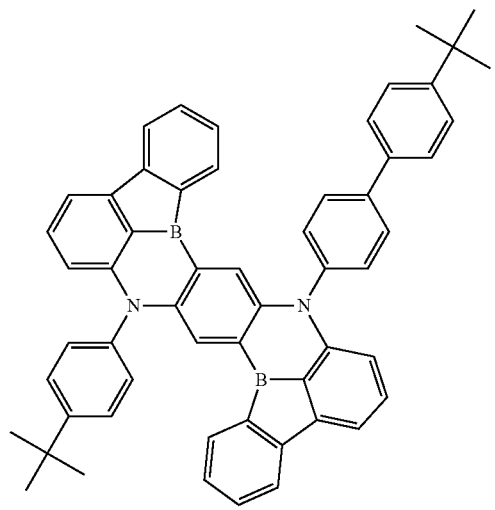
D61
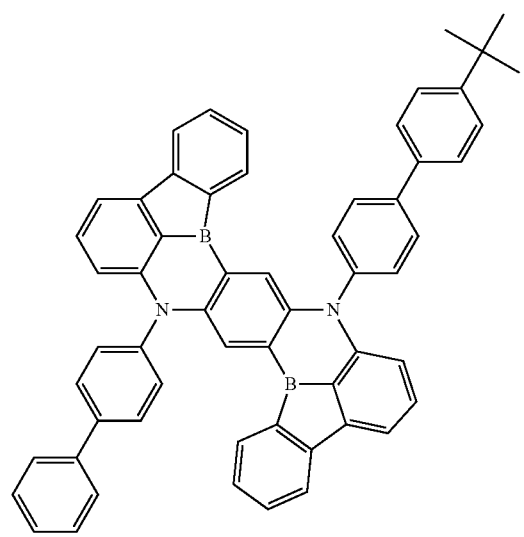
D62
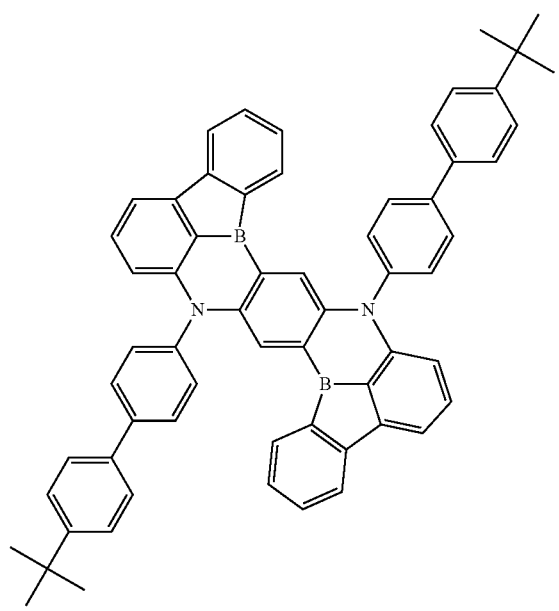

-continued
D63
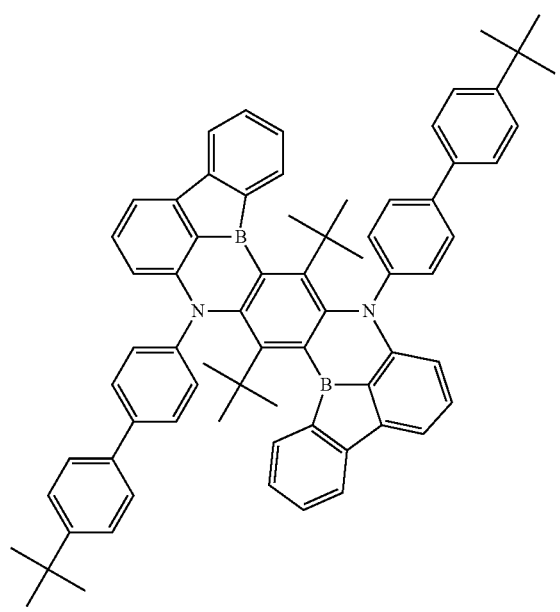
D64
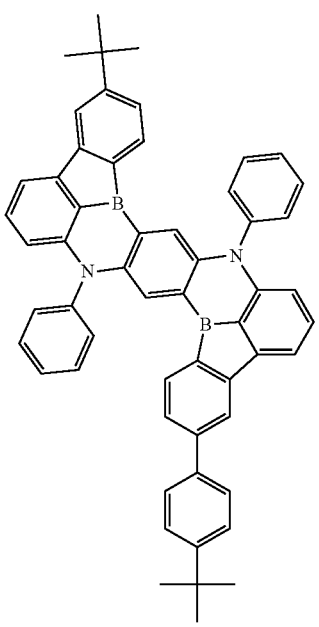
D65
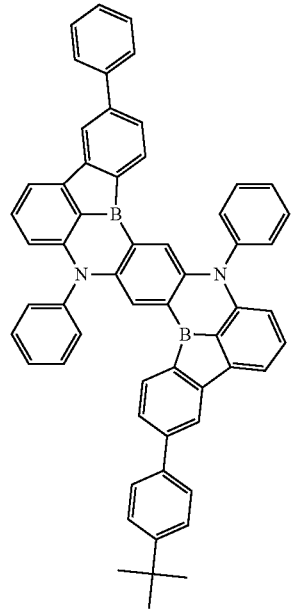
D66
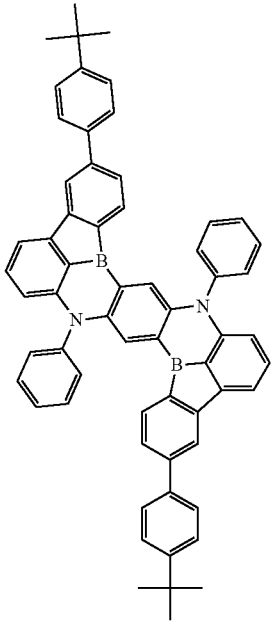

-continued
D67
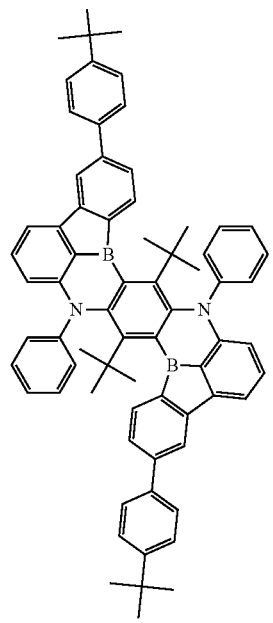
D68
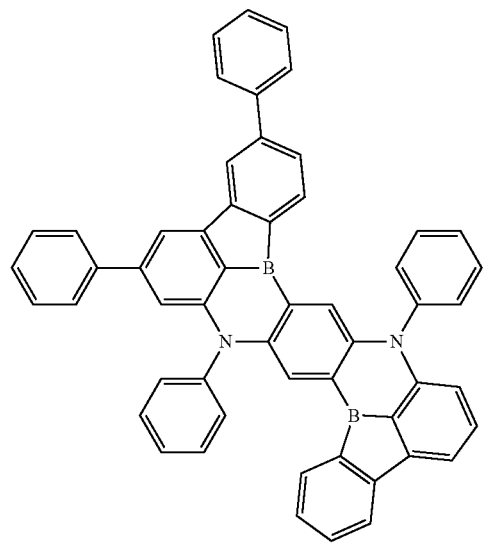
D69
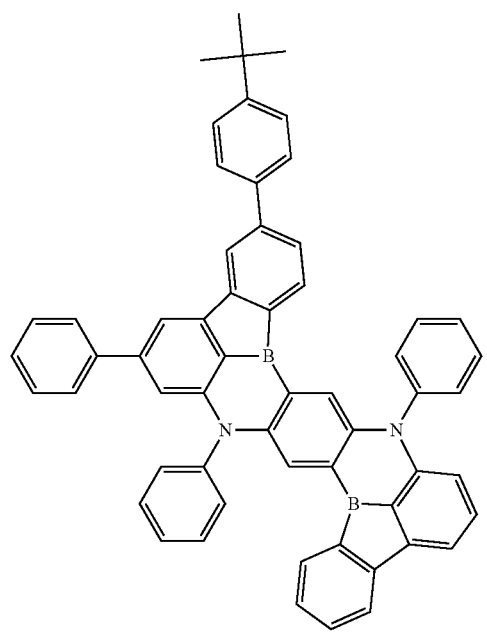
D70
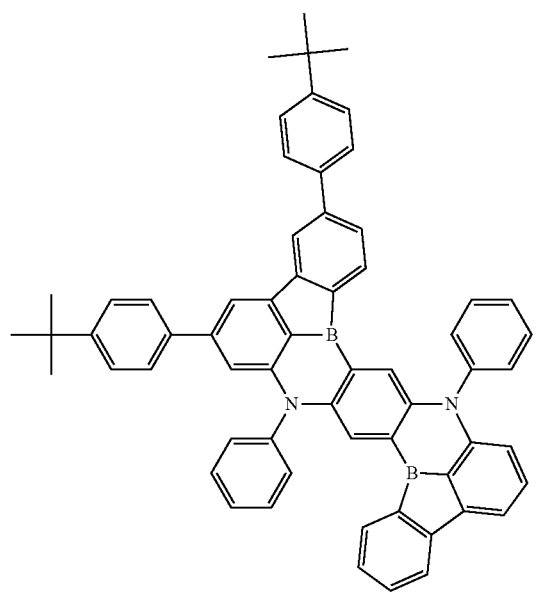

-continued
D71
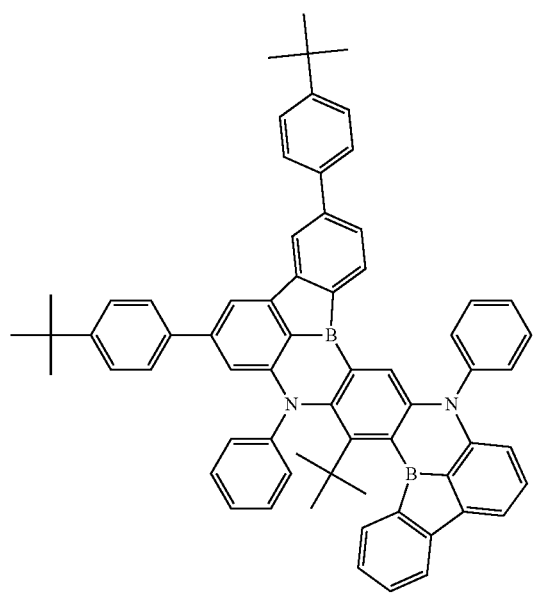
D72
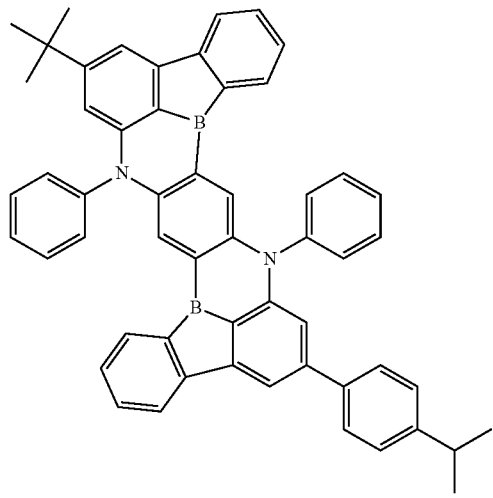
D73
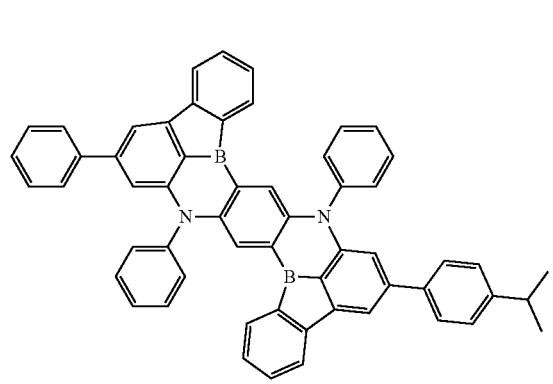
D74
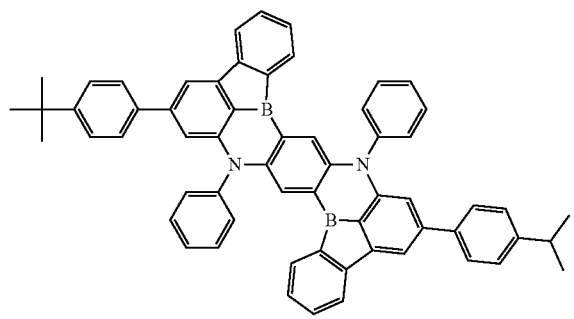
D75
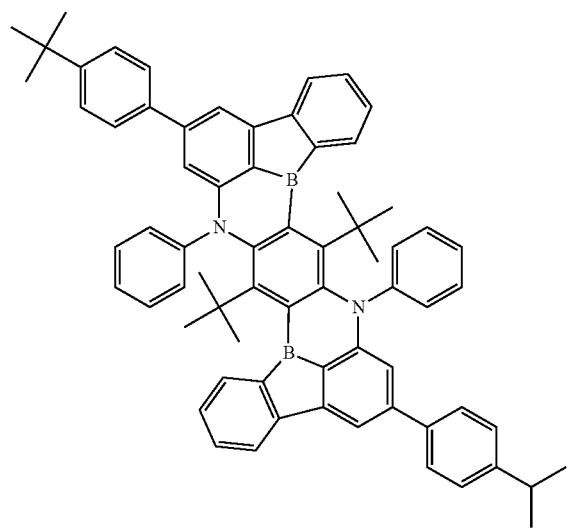
D76
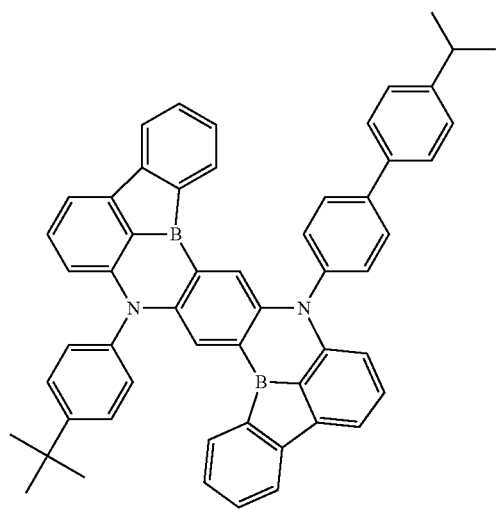

-continued
D77
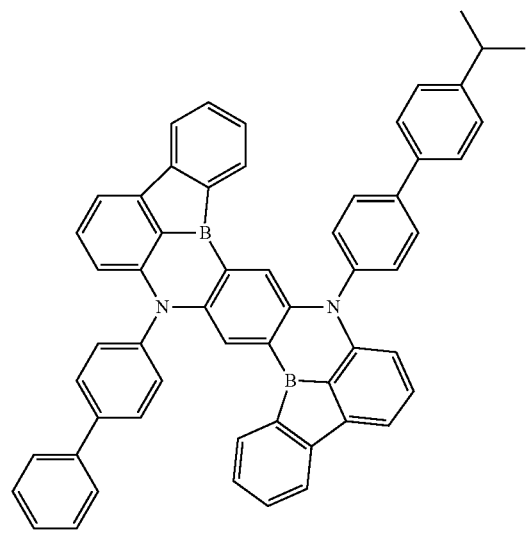
D78
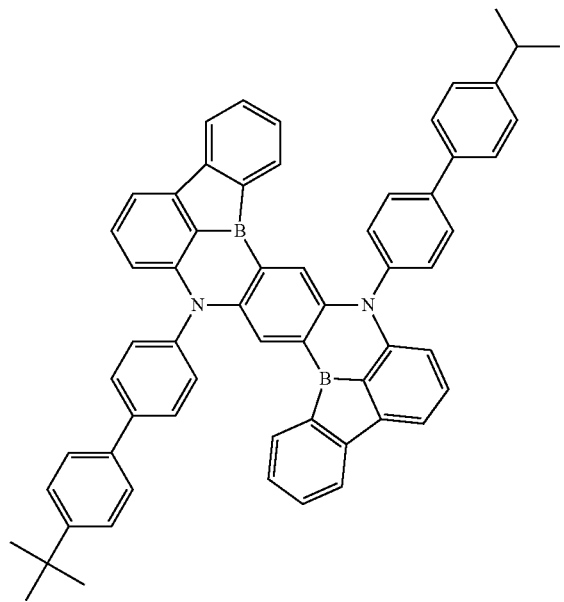
D79
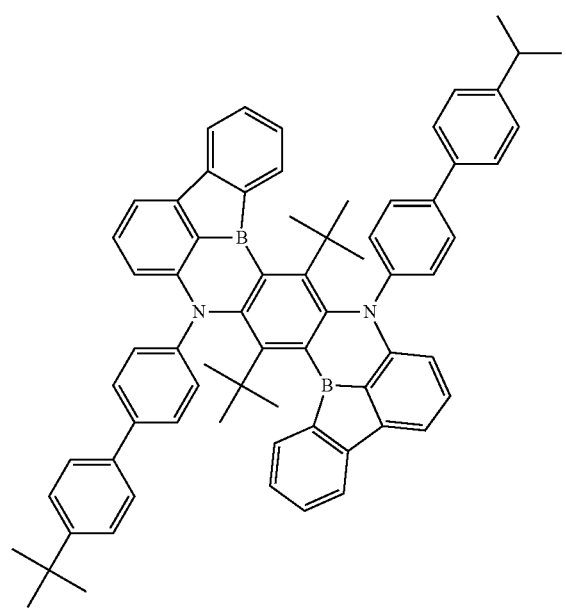
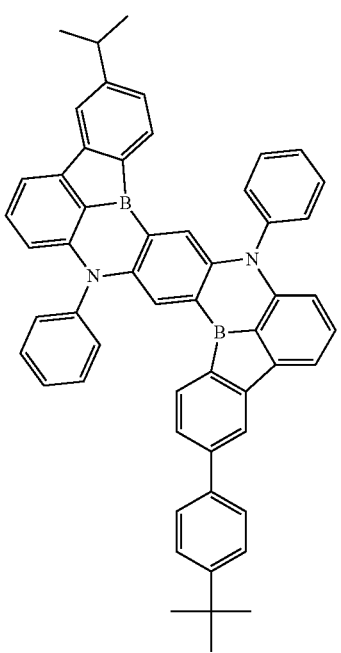

-continued
D81
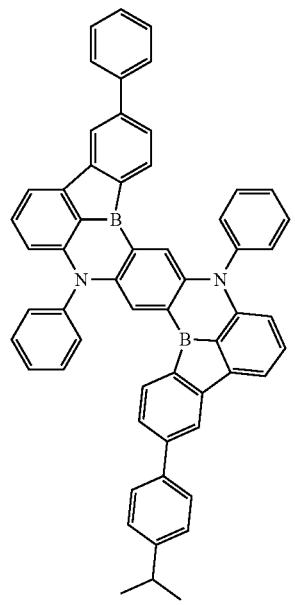
D82
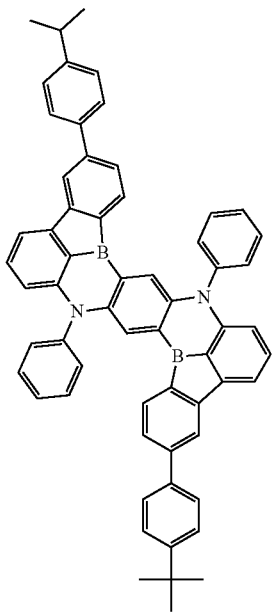
D83
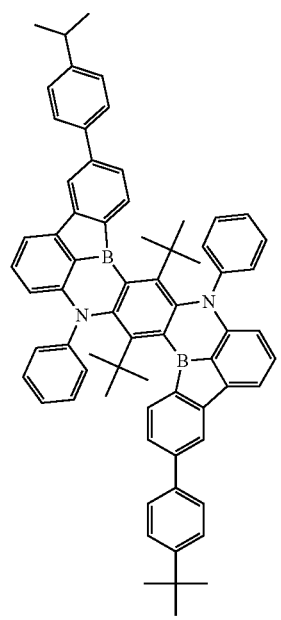
D84
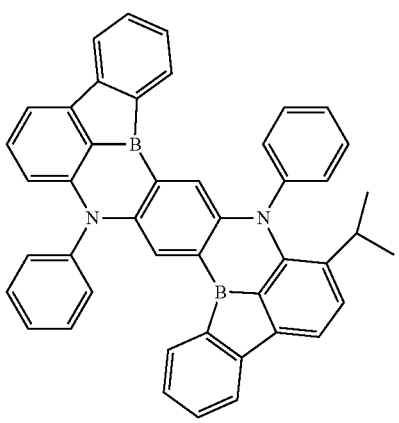
D85
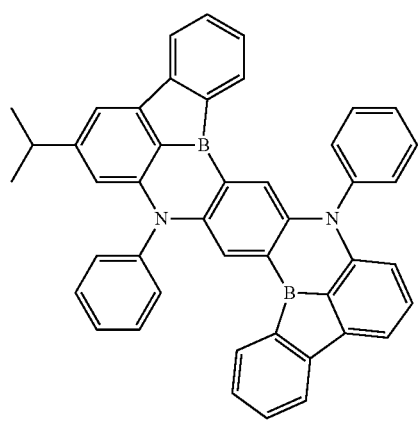
D86
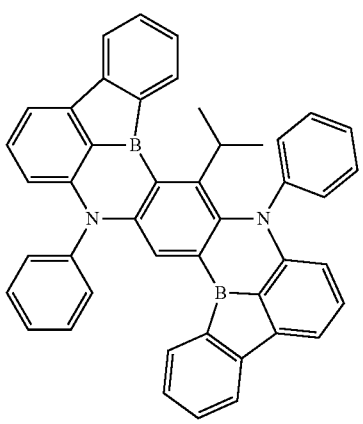

-continued
D87
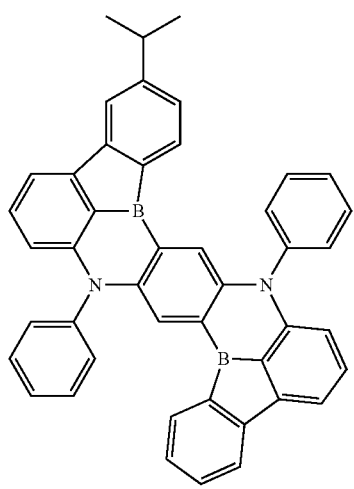
D88
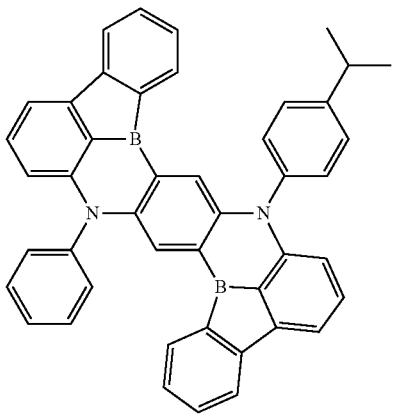
D89
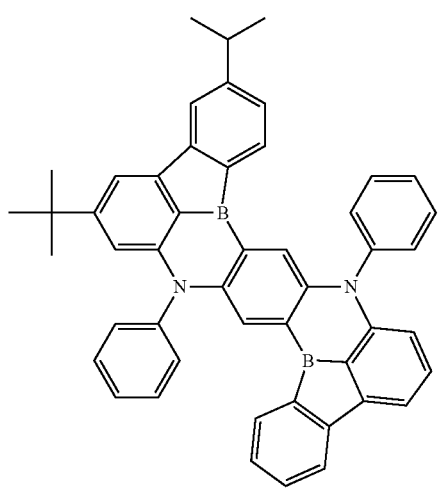
D90
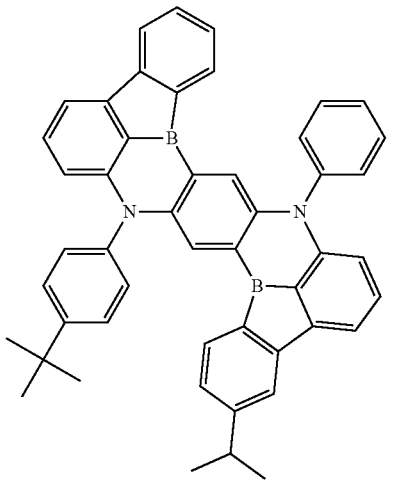
D91
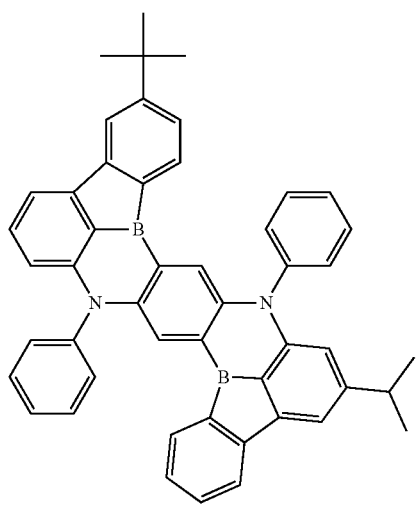
D92
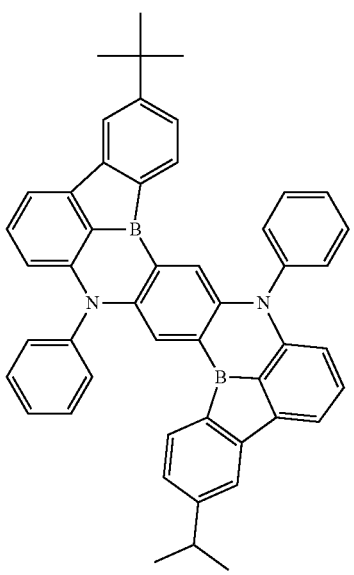

-continued
D93
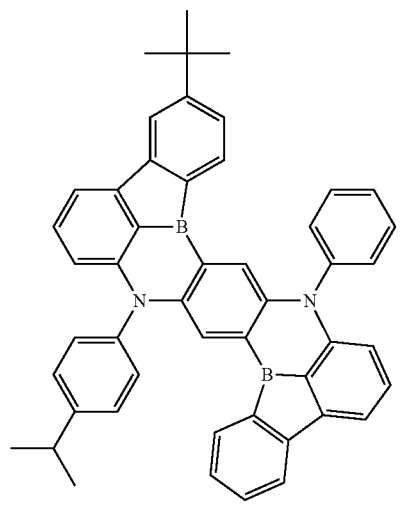
D94
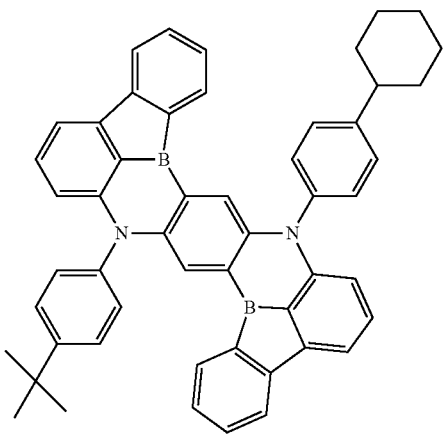
D95
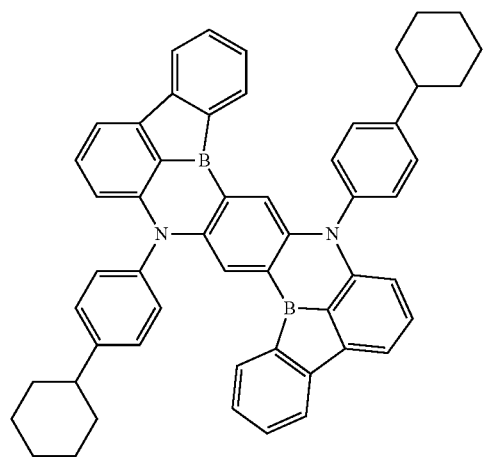
D96
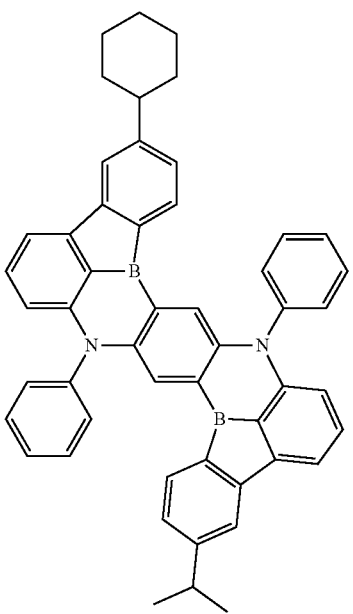

-continued
D97
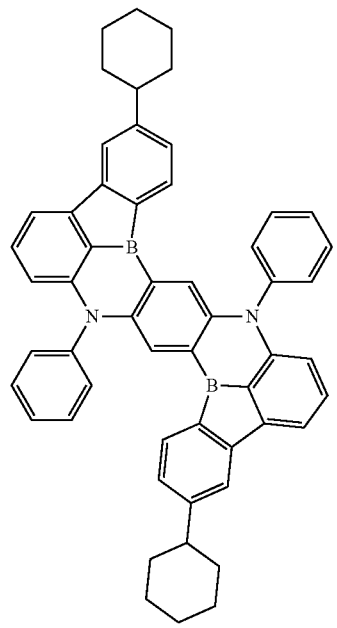
D98
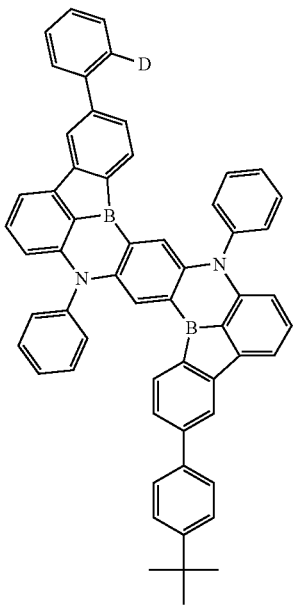
D99
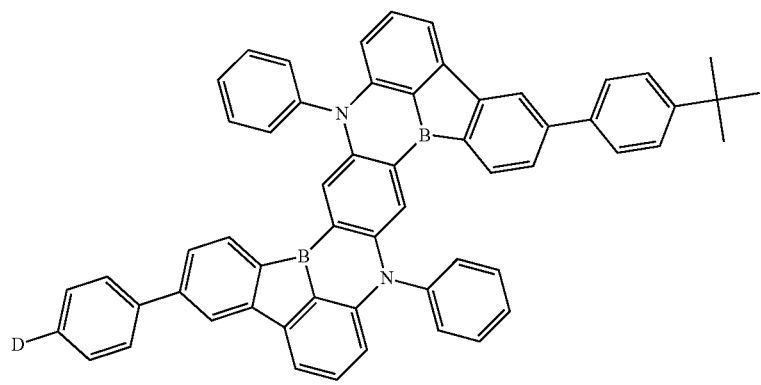
D100
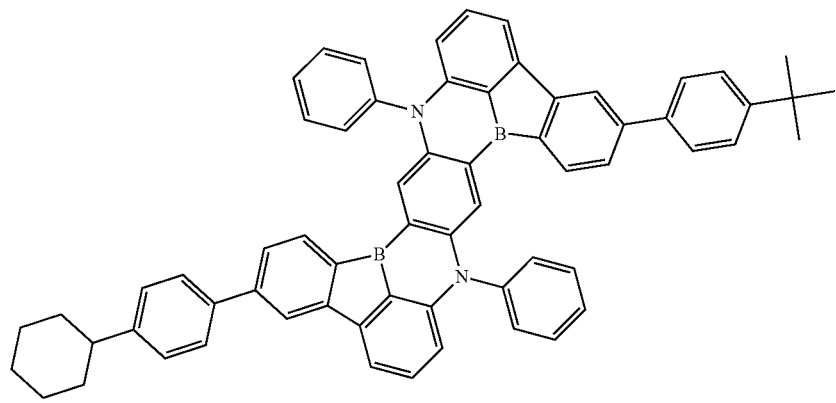

-continued

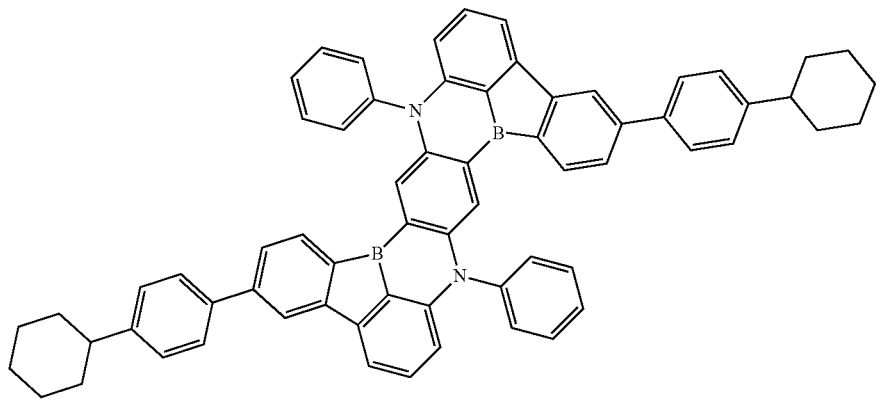
D101

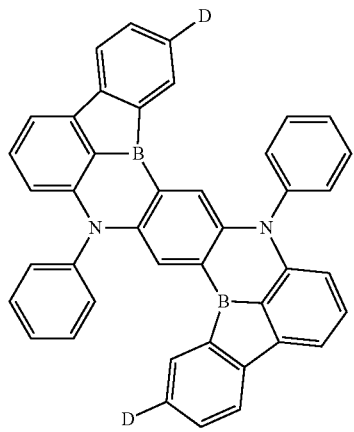
D102

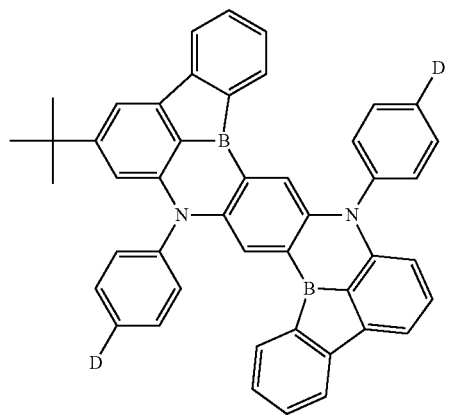
D103

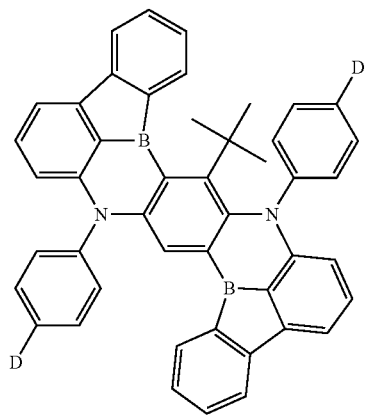
D104

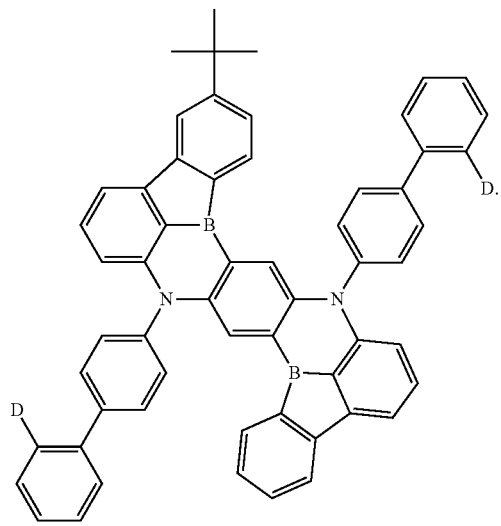
D105

A second aspect of the present disclosure is to provide an OLED device. The OLED device includes an anode, a cathode and an organic thin-film layer disposed between the anode and the cathode, and the organic thin-film layer includes at least one organic compound as described in the first aspect.

In an embodiment, the organic thin-film layer includes a light-emitting layer, and the light-emitting layer includes at least one organic compound as described in the first aspect.

In an embodiment, the organic compound is used as a doped material of the light-emitting layer.

In an embodiment, the organic compound is used as a red light doped material of the light-emitting layer, and is matched with a host material, which can effectively improve the luminescence efficiency and working life of the device and reduce the turn-on voltage and energy consumption.

In an embodiment, an anode material of the OLED device may be a metal, a metal oxide or a conductive polymer, wherein the metal includes copper, gold, silver, iron, chromium, nickel, manganese, palladium, platinum and the like as well as alloys thereof, the metal oxide includes indium tin oxide (ITO), indium zinc oxide (IZO), zinc oxide, indium gallium zinc oxide (IGZO) and the like, and the conductive polymer includes polyaniline, polypyrrole, poly(3-methylthiophene) and the like. In addition to the above-mentioned materials that are helpful for hole injection and combinations thereof, the anode material further includes known materials suitable for use as the anode.

A cathode material of the OLED device may be a metal or a multilayer metal material, wherein the metal includes aluminum, magnesium, silver, indium, tin, titanium and the like as well as alloys thereof, and the multilayer metal material includes LiF/Al, $LiO_2$/Al, $BaF_2$/Al and the like. In addition to the above-mentioned materials that are helpful for electron injection and combinations thereof, the cathode material further includes known materials suitable for use as the cathode.

The organic thin-film layer of the OLED device includes at least one light-emitting layer (EML) and any one or a combination of at least two of an electron transport layer (ETL), a hole transport layer (HTL), a hole injection layer (HIL), an electron blocking layer (EBL), a hole blocking layer (HBL) or an electron injection layer (EIL) which is disposed on two sides of the at least one light-emitting layer, wherein the hole/electron injection and transport layers may be carbazole compounds, arylamine compounds, benzimidazole compounds, metal compounds and the like. The OLED device may further be optionally provided with a capping layer (CPL) disposed on the cathode (a side away from the anode).

In an embodiment, as shown in FIG. 1 which is a structural schematic view of the OLED device, the OLED device includes an anode 110, a cathode 150 and a light-emitting layer 130 between the anode 110 and the cathode 150. A first organic thin-film layer 120 and a second organic thin-film layer 140 are disposed on two sides of the light-emitting layer 130. The first organic thin-film layer 120 is any one or a combination of at least two of a hole transport layer (HTL), a hole injection layer (HIL) or an electron blocking layer (EBL), and the second organic thin-film layer 140 includes any one or a combination of at least two of an electron transport layer (ETL), a hole blocking layer (HBL) or an electron injection layer (EIL).

In an embodiment, the light-emitting layer 130 includes at least one organic compound of the present disclosure.

Optionally, a capping layer (CPL) may further be disposed on the cathode 150 (a side away from the anode 110).

The OLED device may be prepared by the following method: forming an anode on a transparent or opaque smooth substrate, forming an organic thin-film layer on the anode, and forming a cathode on the organic thin-film layer. The organic thin-film layer may be formed using known film-forming methods such as evaporation, sputtering, spin coating, impregnation, ion plating and the like.

A third aspect of the present disclosure is to provide a display panel including the OLED device as described in the second aspect.

A fourth aspect of the present disclosure is to provide an electronic device including the OLED device as described in the second aspect or the display panel as described in the third aspect.

For example, the organic compound provided by the present disclosure having the structure as shown in Formula I may be prepared according to the following synthesis route:

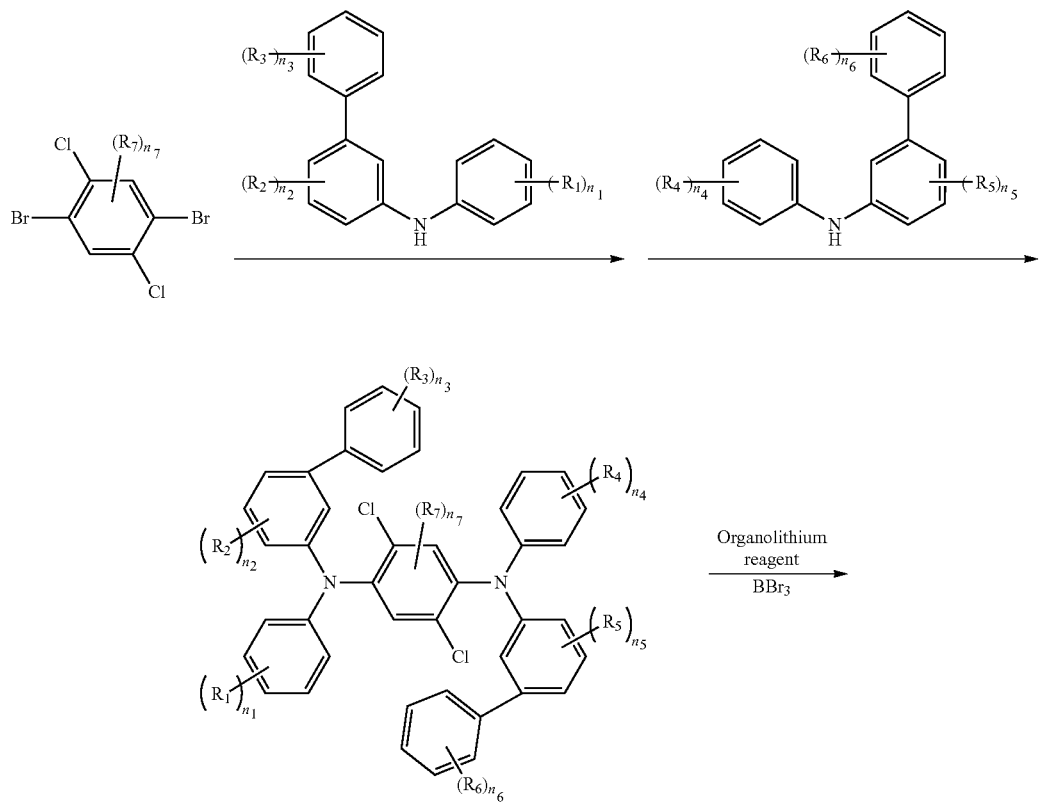

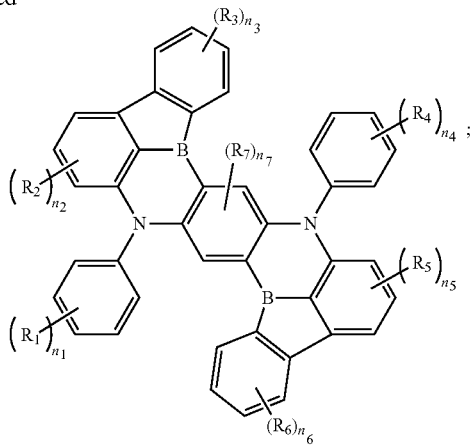

wherein $R_1$, $R_2$, $R_3$, $R_4$, $R_5$, $R_6$, $R_7$, $n_1$, $n_2$, $n_3$, $n_4$, $n_5$, $n_6$, and $n_7$ have the same ranges as defined in Formula I.

Preparation examples of the organic compound of the present disclosure are described below for purposes of example.

Example 1

An organic compound D1 was prepared, whose structure was

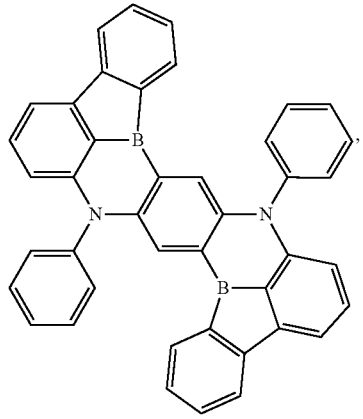

D1 and the preparation method for the organic compound D1 includes the steps described below.

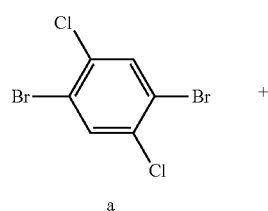

a (1)

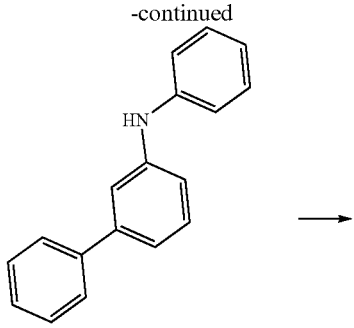

b-1

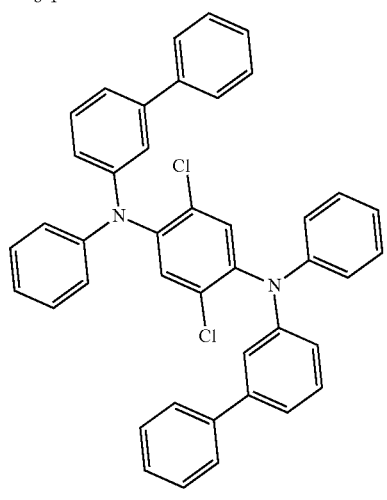

a-1

In a nitrogen atmosphere, solvent 1,2-dichlorobenzene was added to a reaction flask, then reaction intermediate a (2 mmol), compound b-1 (5 mmol), potassium carbonate (14 mmol), catalyst CuI (0.8 mmol) and ligand 18-crown-6 (0.8 mmol) were sequentially added to the reaction flask, and the mixture was heated to 100° C. and reacted for 24 hours. After the reaction was completed, the reaction was cooled to room temperature. The organic phase was collected by suction filtration, then extracted with dichloromethane/$H_2O$, and dried with anhydrous $Na_2SO_4$. The filtrate was collected by suction filtration, the solvent was removed through rotary evaporation, and the residue was purified by column chromatography to give intermediate a-1.

MALDI-TOF data (m/z) obtained through matrix-assisted laser desorption/ionization time-of-flight mass spectrometry is as follows: $C_{42}H_{30}Cl_2N_2$, whose calculated value was 632.18 and measured value was 632.15.

Results of the elemental analysis of the compound are as follows: calculated value was C, 79.62; H, 4.77; Cl, 11.19; N, 4.42; and the measured value was C, 79.60; H, 4.79; Cl, 11.19; N, 4.42.

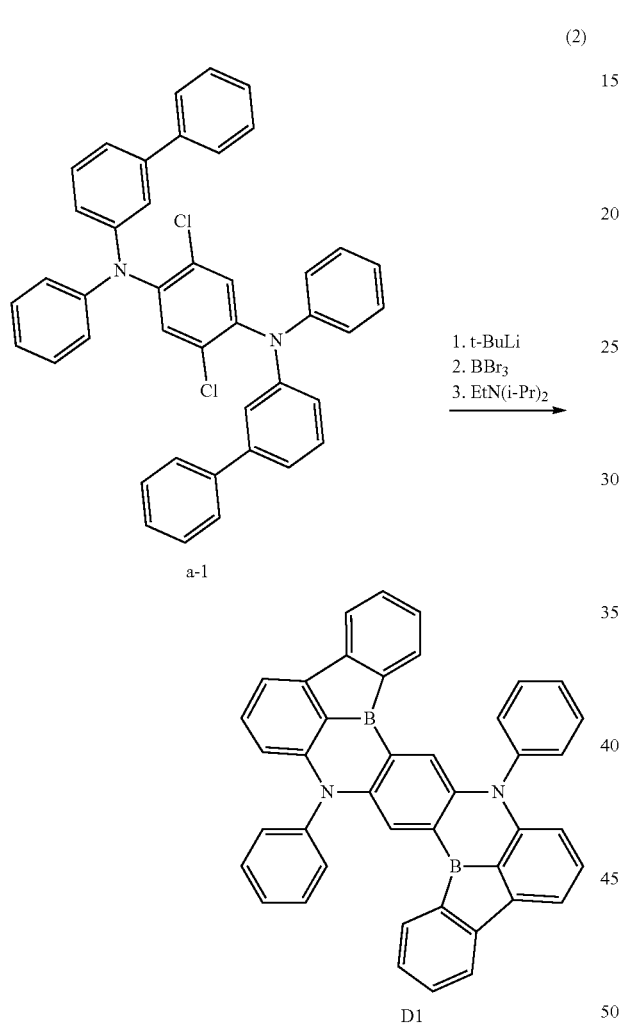

The pentane solution of tert-butyllithium (t-BuLi) (8.0 mL, 1.70 M, 13.5 mmol) was slowly added to the tert-butylbenzene (100 mL) solution of a-1 (2.40 mmol) at −78° C., and then the mixture was heated to 60° C. and reacted for 4 hours. After the reaction was completed, the reaction was cooled to −78° C., boron tribromide (3.0 mL, 30.0 mmol) was slowly added, and the mixture was continuously stirred at room temperature for 1 hour. N,N-diisopropylethylamine (EtN(i-Pr)$_2$) (7.00 mL, 40.20 mmol) was added at room temperature, and the reaction was continued at 145° C. for 6 hours and then stopped. The solvent was spun dried in vacuum and purified by column chromatography to obtain the target product D1.

MALDI-TOF (m/z): $C_{42}H_{26}B_2N_2$, whose calculated value was 580.23 and measured value was 580.33.

Results of the elemental analysis of the compound are as follows: calculated value was C, 86.93; H, 4.52; B, 3.73; N, 4.83, and the measured value was C, 86.95; H, 4.53; B, 3.75; N, 4.81.

Example 2

An organic compound D9 is prepared, whose structure was

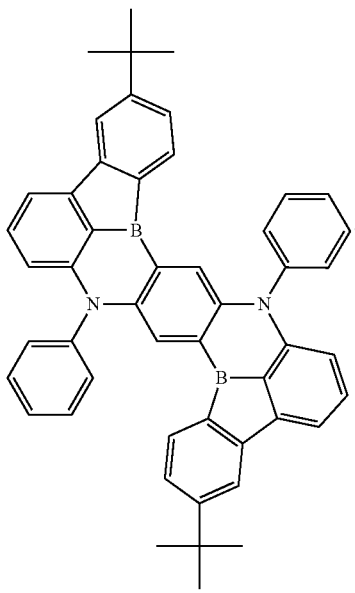

The preparation method of the organic compound D9 differs from the preparation method in Example 1 only in that compound b-1 in step (1) was replaced with an equal molar amount of compound b-2

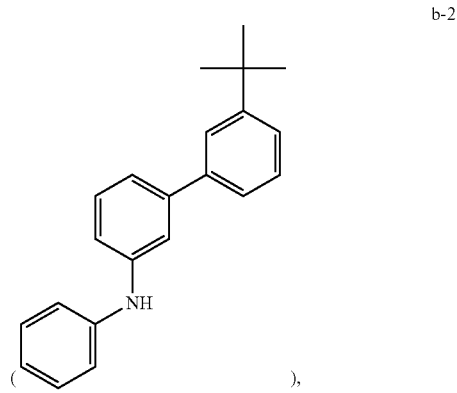 [SMILES: CC(C)(C)c1cccc(-c2cccc(Nc3ccccc3)c2)c1]

while other raw materials, amounts and process parameters were the same as those in Example 1, so as to obtain the target product D9.

MALDI-TOF (m/z): $C_{50}H_{42}B_2N_2$, whose calculated value was 692.35 and measured value was 692.45.

Results of the elemental analysis of the compound are as follows: calculated value was C, 86.72; H, 6.11; B, 3.12; N, 4.05; and the measured value was C, 86.70; H, 6.12; B, 3.12; N, 4.05.

Example 3

An organic compound D15 is prepared, whose structure was

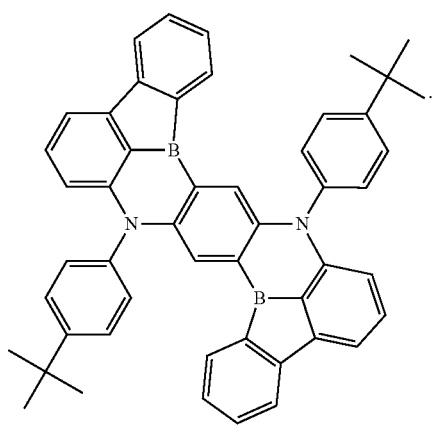

D15

The preparation method of the organic compound D15 differs from the preparation method in Example 1 only in that compound b-1 in step (1) was replaced with an equal molar amount of compound b-3

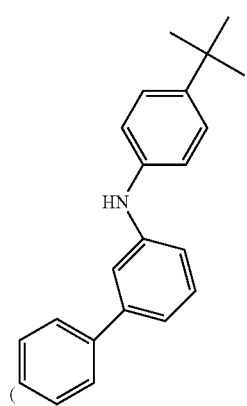

b-3 while other raw materials, amounts and process parameters were the same as those in Example 1, so as to obtain the target product D15.

MALDI-TOF (m/z): $C_{50}H_{42}B_2N_2$, whose calculated value was 692.35 and measured value was 692.41.

Results of the elemental analysis of the compound are as follows: calculated value was C, 86.72; H, 6.11; B, 3.12; N, 4.05; and the measured value was C, 86.71; H, 6.12; B, 3.12; N, 4.05.

Example 4

An organic compound D21 is prepared, whose structure was

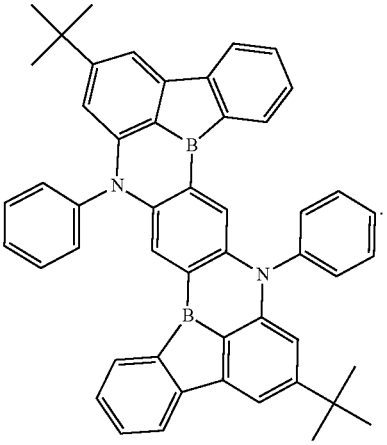

D21

The preparation method of the organic compound D21 differs from the preparation method in Example 1 only in that compound b-1 in step (1) was replaced with an equal molar amount of compound b-4

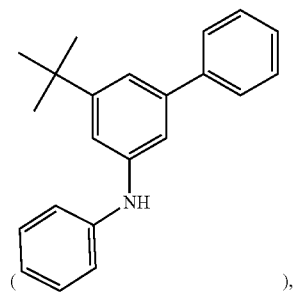

b-4 while other raw materials, amounts and process parameters were the same as those in Example 1, so as to obtain the target product D21.

MALDI-TOF (m/z): $C_{50}H_{42}B_2N_2$, whose calculated value was 692.35 and measured value was 692.50.

Results of the elemental analysis of the compound are as follows: calculated value was C, 86.72; H, 6.11; B, 3.12; N, 4.05; and the measured value was C, 86.70; H, 6.12; B, 3.11; N, 4.06.

Example 5

An organic compound D58 is prepared, whose structure was

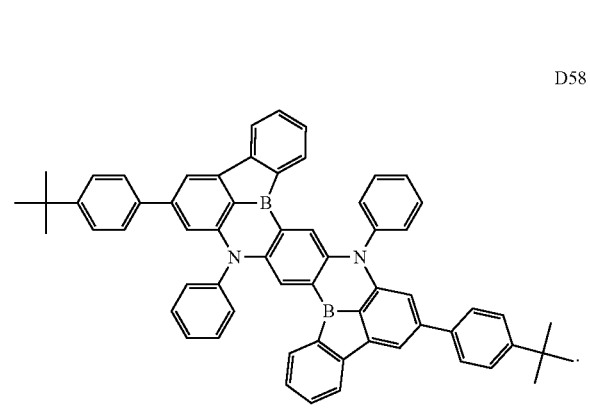

D58

The preparation method of the organic compound D58 differs from the preparation method in Example 1 only in that compound b-1 in step (1) was replaced with an equal molar amount of compound b-5

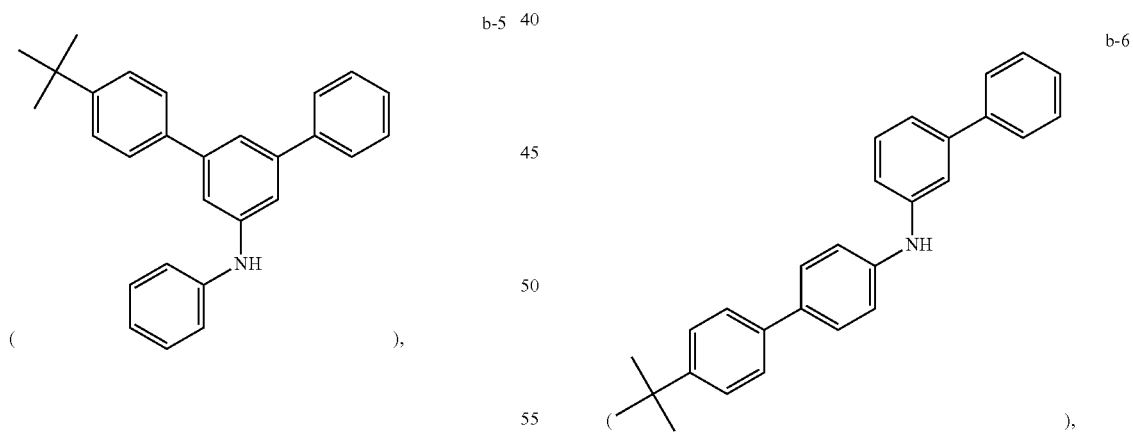

b-5 while other raw materials, amounts and process parameters were the same as those in Example 1, so as to obtain the target product D58.

MALDI-TOF (m/z): $C_{62}H_{50}B_2N_2$, whose calculated value was 844.42 and measured value was 842.50.

Results of the elemental analysis of the compound are as follows: calculated value was C, 88.16; H, 5.97; B, 2.56; N, 3.32; and the measured value was C, 88.15; H, 5.98; B, 2.56; N, 3.31.

Example 6

An organic compound D62 is prepared, whose structure was

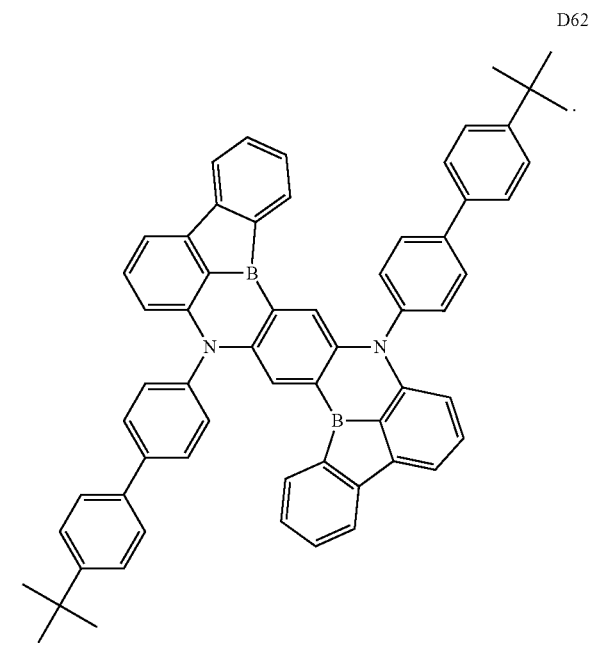 [SMILES: CC(C)(C)c1ccc(-c2ccc(N3c4cc5c(cc4B4c6ccccc6-c6cccc3c64)N(c3ccc(-c4ccc(C(C)(C)C)cc4)cc3)c3cccc4c3B5c3ccccc3-4)cc2)cc1]

D62

The preparation method of the organic compound D62 differs from the preparation method in Example 1 only in that compound b-1 in step (1) was replaced with an equal molar amount of compound b-6 b-6 while other raw materials, amounts and process parameters were the same as those in Example 1, so as to obtain the target product D62.

MALDI-TOF (m/z): $C_{62}H_{50}B_2N_2$, whose calculated value was 844.42 and measured value was 844.68.

Results of the elemental analysis of the compound are as follows: calculated value was C, 88.16; H, 5.97; B, 2.56; N, 3.32; and the measured value was C, 88.15; H, 5.99; B, 2.51; N, 3.32.

Example 7

An organic compound D66 is prepared, whose structure was

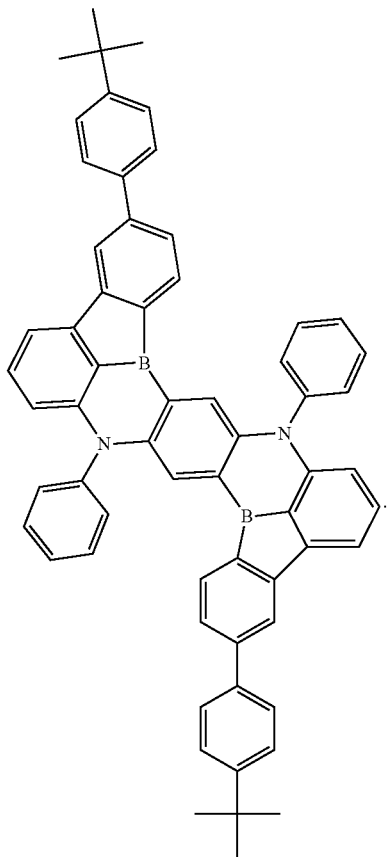

D66

The preparation method of the organic compound D66 differs from the preparation method in Example 1 only in that compound b-1 in step (1) was replaced with an equal molar amount of compound b-7 b-7 while other raw materials, amounts and process parameters were the same as those in Example 1, so as to obtain the target product D66.

MALDI-TOF (m/z): $C_{62}H_{50}B_2N_2$, whose calculated value was 844.42 and measured value was 844.35.

Results of the elemental analysis of the compound are as follows: calculated value was C, 88.16; H, 5.97; B, 2.56; N, 3.32; and the measured value was C, 88.17; H, 5.97; B, 2.55; N, 3.32.

Example 8

An organic compound D95 is prepared, whose structure was

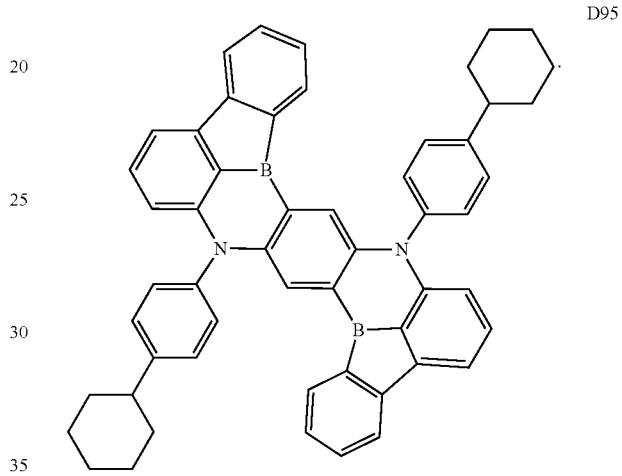

D95

The preparation method of the organic compound D95 differs from the preparation method in Example 1 only in that compound b-1 in step (1) was replaced with an equal molar amount of compound b-8

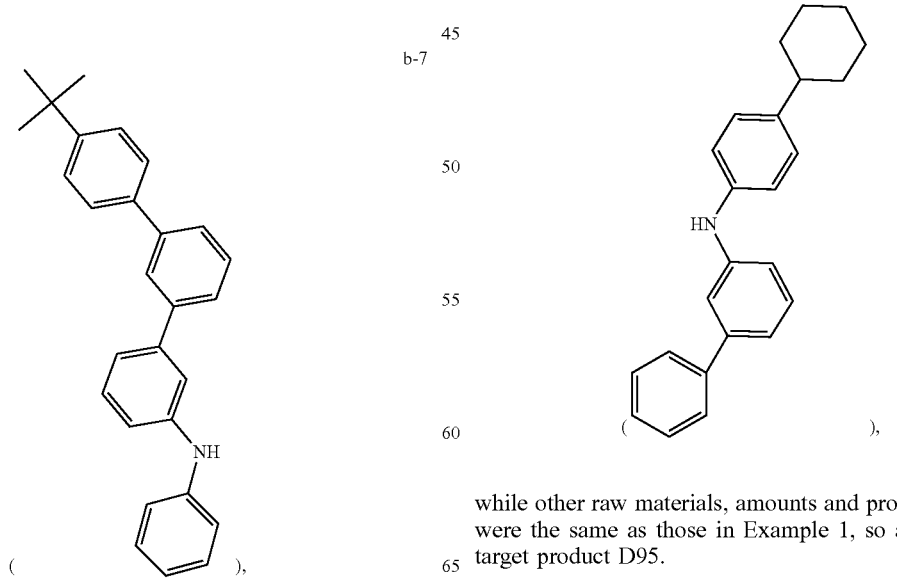

b-8 while other raw materials, amounts and process parameters were the same as those in Example 1, so as to obtain the target product D95.

MALDI-TOF (m/z): $C_{54}H_{46}B_2N_2$, whose calculated value was 744.38 and measured value was 744.30.

Results of the elemental analysis of the compound are as follows: calculated value was C, 87.11; H, 6.23; B, 2.90; N, 3.76; and the measured value was C, 87.10; H, 6.24; B, 2.90; N, 3.76.

Example 9

An organic compound D97 is prepared, whose structure was

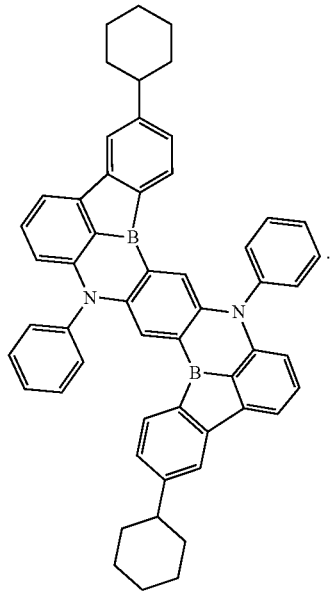

D97

The preparation method of the organic compound D97 differs from the preparation method in Example 1 only in that compound b-1 in step (1) was replaced with an equal molar amount of compound b-9

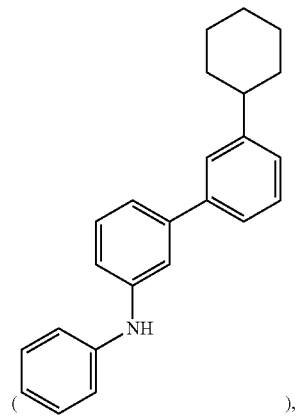

b-9 while other raw materials, amounts and process parameters were the same as those in Example 1, so as to obtain the target product D97.

MALDI-TOF(m/z): $C_{54}H_{46}B_2N_2$, whose calculated value was 744.38 and measured value was 744.37.

Results of the elemental analysis of the compound are as follows: calculated value was C, 87.11; H, 6.23; B, 2.90; N, 3.76; and the measured value was C, 87.11; H, 6.23; B, 2.90; N, 3.75.

Example 10

An organic compound D101 is prepared, whose structure was

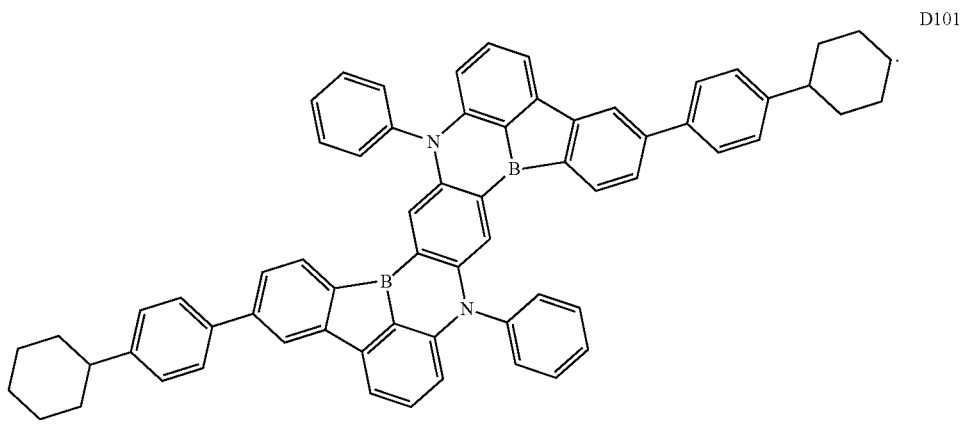 [SMILES: c1ccc(N2c3cc4c(cc3B3c5ccc(-c6ccc(C7CCCCC7)cc6)cc5-c5cccc2c53)N(c2ccccc2)c2cccc3c2B4c2ccc(-c4ccc(C5CCCCC5)cc4)cc2-3)cc1]

D101

The preparation method of the organic compound D101 differs from the preparation method in Example 1 only in that compound b-1 in step (1) was replaced with an equal molar amount of compound b-10

(  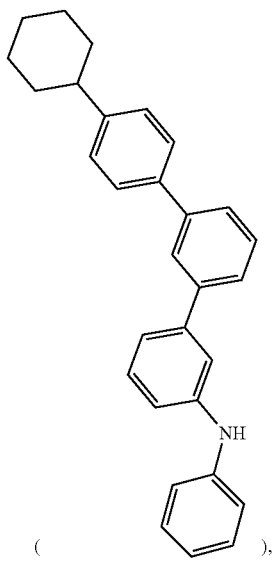  ), while other raw materials, amounts and process parameters were the same as those in Example 1, so as to obtain the target product D101.

MALDI-TOF (m/z): $C_{66}H_{54}B_2N_2$, whose calculated value was 896.45 and measured value was 896.77.

Results of the elemental analysis of the compound are as follows: calculated value was C, 88.40; H, 6.07; B, 2.41; N, 3.12; and the measured value was C, 88.38; H, 6.09; B, 2.41; N, 3.12.

Application examples in which the organic compounds of the present application are applied to the OLED devices are described below for purposes of example.

Application Example 1

An OLED device is provided, whose structural schematic diagram is as shown in FIG. 1. The OLED device includes a substrate 160, an anode 110 (an ITO anode, with a thickness of 15 nm), a first hole transport layer 121 (with a thickness of 10 nm), a second hole transport layer 122 (with a thickness of 95 nm), an electron blocking layer 123 (with a thickness of 30 nm), a light-emitting layer (with a thickness of 30 nm), a first electron transport layer 141 (with a thickness of 30 nm), a second electron transport layer 142 (with a thickness of 5 nm), a cathode 150 (a magnesium-silver electrode where a mass ratio of magnesium to silver was 9:1, with a thickness of 15 nm) and a capping layer 170 (CPL, with a thickness of 100 nm) arranged in sequence.

The preparation method of the OLED device includes the steps described below.

(1) A glass substrate of size 50 mm×50 mm×0.7 mm was cut, sonicated in isopropyl alcohol and deionized water for 30 minutes separately, and exposed to ozone for about 10 minutes for cleaning. The obtained glass substrate with an ITO anode was installed onto a vacuum deposition apparatus.

(2) A hole buffer layer material HT-1:HAT-CN was evaporated by means of vacuum evaporation on the ITO anode to obtain a layer with a thickness of 10 nm, where the mass ratio of compound HT-1 to compound HAT-CN was 98:2, and the layer was used as a first hole transport layer.

(3) A second hole transport layer material HT-1 was vacuum evaporated on the first hole transport layer to obtain a layer with a thickness of 95 nm, and the layer was used as a second hole transport layer.

(4) A material Prime-1 was evaporated on the second hole transport layer to obtain a layer with a thickness of 30 nm, and the layer was used as an electron blocking layer.

(5) A light-emitting layer was co-deposited on the electron blocking layer, where HOST-1 was used as a host material, the organic compound D1 provided by Example 1 of the present application was used as a doped material, the mass ratio of the organic compound HOST-1 to organic compound D1 was 19:1, and the thickness of the light-emitting layer was 30 nm.

(6) A compound ET-1 was vacuum evaporated on the light-emitting layer to obtain a first electron transport layer with a thickness of 30 nm.

(7) LiF was vacuum evaporated on the first electron transport layer to obtain a second electron transport layer with a thickness of 5 nm.

(8) Magnesium and silver were vacuum evaporated on the second electron transport layer to obtain a cathode with a thickness of 15 nm.

(9) A hole-type material CPL-1 with a high refractive index was vacuum evaporated on the cathode to serve as a capping layer (that is, a cathode covering layer or CPL) with a thickness of 100 nm, so as to obtain the OLED device.

The structures of materials used in the OLED device are as follows:

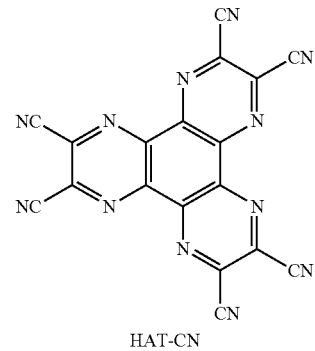

HAT-CN

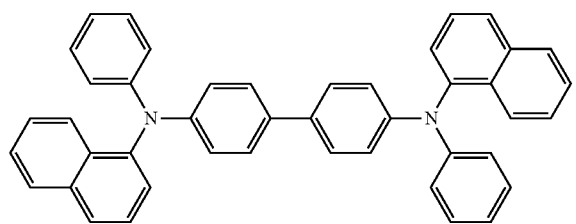

HT-1

-continued

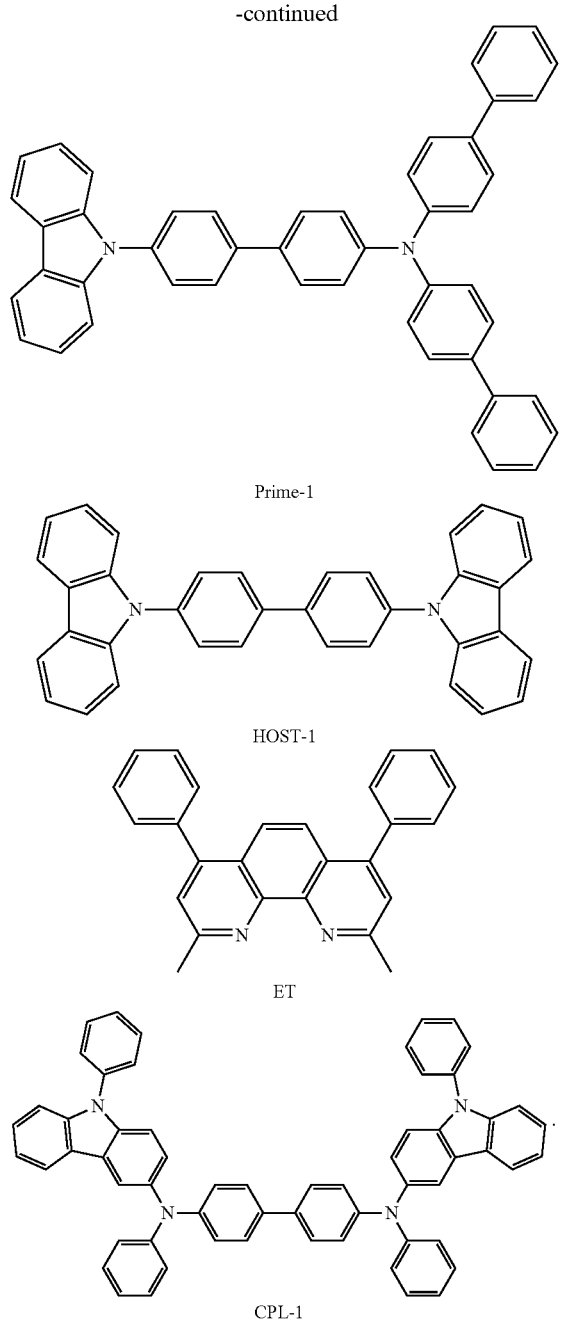

Prime-1

HOST-1

ET

CPL-1

Application Examples 2 to 10

An OLED device is provided in each of Application Examples 2 to 10. Each of Application Examples 2 to 10 differs from Application Example 1 only in that the organic compound D1 in Step (5) was replaced with an equal amount of the organic compounds D9, D15, D21, D58, D62, D66, D95, D97, and D101, respectively, while the device structures, thickness, other materials and preparation methods were the same as those in Application Example 1.

Comparative Example 1

An OLED device is provided. Comparative Example 1 differs from Application Example 1 only in that the organic compound D1 in Step (5) was replaced with an equal amount of the comparative compound M1

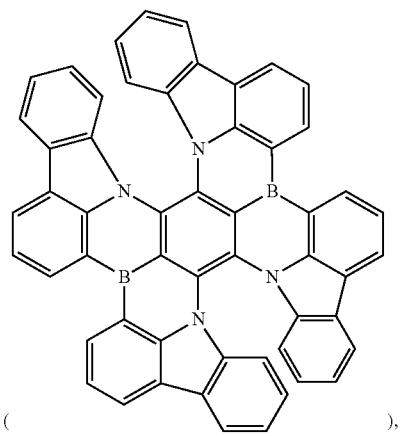 [SMILES: c1ccc2c(c1)c1cccc3c1n2-c1c2c(c4c5c1-n1c6ccccc6c6cccc(c61)B5c1cccc5c6ccccc6n-4c15)-n1c4ccccc4c4cccc(c41)B23]

( ), while the device structure, thickness, other materials and preparation method were the same as those in Application Example 1.

Performance Evaluation of the OLED Devices:

Currents of each OLED device at different voltages were tested by the Keithley 2365A digital nanovoltmeter, and then current densities of each OLED device at different voltages were obtained by dividing the currents by the light-emitting area. The brightness and radiant energy densities of each OLED device at different voltages were tested by the Konicaminolta CS-2000 spectroradiometer. According to the current densities and brightness of each OLED device at different voltages, the turn-on voltage and current efficiency (CE, Cd/A) of each OLED device at the same current density (10 mA/cm$^2$) were obtained, where Von was the turn-on voltage at brightness 1 Cd/m$^2$. The lifetime LT95 (under a testing condition of 50 mA/cm$^2$) was obtained by measuring time when the brightness of each OLED device reached 95% of its initial brightness.

Taking the test data of the turn-on voltage Von, current efficiency CE and lifetime LT95 of Comparative Example 1 as 100%, the Von, CE and LT95 of each of Application Examples 1 to 10 were the ratio of their respective test data to the test data of Comparative Example 1, that is, the Von, CE and LT95 were the relative values with respect to Comparative Example 1. Specific data are shown in Table 1.

TABLE 1

| OLED device | Light-emitting layer doped material | Von | CE | LT95 | Light color |
|---|---|---|---|---|---|
| Application Example 1 | D1 | 98.10% | 103.20% | 101.50% | Red |
| Application Example 2 | D9 | 97.60% | 105.00% | 104.00% | Red |
| Application Example 3 | D15 | 97.70% | 104.10% | 102.50% | Red |
| Application Example 4 | D21 | 97.00% | 104.90% | 103.00% | Red |
| Application Example 5 | D58 | 96.50% | 104.60% | 102.50% | Red |
| Application Example 6 | D62 | 97.40% | 105.10% | 102.20% | Red |
| Application Example 7 | D66 | 96.60% | 103.90% | 103.10% | Red |

TABLE 1-continued

| OLED device | Light-emitting layer doped material | Von | CE | LT95 | Light color |
|---|---|---|---|---|---|
| Application Example 8 | D95 | 97.50% | 105.60% | 101.90% | Red |
| Application Example 9 | D97 | 97.20% | 105.20% | 101.80% | Red |
| Application Example 10 | D101 | 97.6% | 104.80% | 102.90% | Red |
| Comparative Example 1 | M1 | 100% | 100% | 100% | Red |

As can be seen from the data in Table 1, compared with the device in the Comparative Example 1, the OLED devices prepared by using the organic compounds of the present disclosure had a lower turn-on voltage which was reduced by about 1.9% to 3.5%, so the power consumption of the devices can be effectively reduced. The OLED devices prepared by using the organic compounds of the present disclosure had a higher current efficiency which was increased by about 3.2% to 5.6% compared with the current efficiency of the device in the Comparative Example 1. The OLED devices prepared by using the organic compounds of the present disclosure had a longer lifetime which was prolonged by about 1.5% to 4.0% compared with the lifetime of the device in the Comparative Example 1. It can be seen from that the organic compounds of the present disclosure, when used as the light-emitting layer material, can effectively improve the luminescence efficiency of the device, reduce the power consumption, and prolong the device lifetime.

The applicant has stated that although the organic compound, the OLED device and the application thereof in the present disclosure are described through the embodiments described above, the present disclosure is not limited to the processes and steps described above, which means that the implementation of the present disclosure does not necessarily depend on the processes and steps described above. It should be apparent to those skilled in the art that any improvements made to the present disclosure, equivalent replacements of raw materials selected in the present disclosure and addition of adjuvant ingredients thereof, selections of specific methods, etc., all fall within the protection scope and the disclosed scope of the present disclosure.

What is claimed is:

1. An organic compound, having a structure as shown in Formula I:

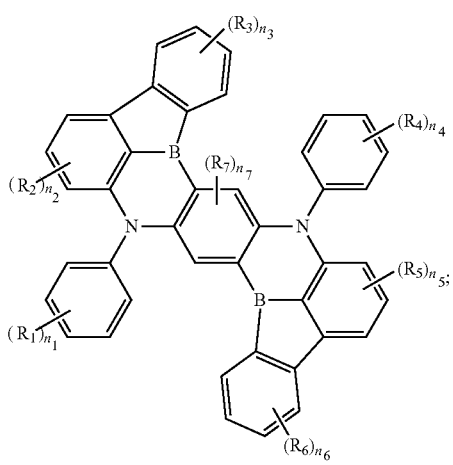

Formula I wherein $R_1$, $R_2$, $R_3$, $R_4$, $R_5$, $R_6$, and $R_7$ are each independently selected from any one of substituted or unsubstituted C1 to C30 linear or branched alkyl, substituted or unsubstituted C3 to C30 cycloalkyl or substituted or unsubstituted C6 to C30 aryl;

$n_1$ and $n_4$ are each independently selected from integers from 0 to 5;

$n_2$, $n_3$, $n_5$, and $n_6$ are each independently selected from integers from 0 to 4; and $n_7$ is selected from integers from 0 to 2.

2. The organic compound according to claim 1, wherein substituents in the substituted linear or branched alkyl, substituted cycloalkyl and substituted aryl are each independently selected from at least one of halogen, cyano, C1 to C10 linear or branched alkyl, C1 to C10 alkoxy, C6 to C20 aryl or C6 to C20 arylamino.

3. The organic compound according to claim 1, wherein $R_1$, $R_2$, $R_3$, $R_4$, $R_5$, $R_6$, and $R_7$ are each independently selected from any one of C1 to C10 linear or branched alkyl, substituted or unsubstituted C3 to C10 cycloalkyl, or substituted or unsubstituted C6 to C20 aryl; and substituted substituents in $R_1$, $R_2$, $R_3$, $R_4$, $R_5$, $R_6$, and $R_7$ are each independently selected from at least one of C1 to C10 linear or branched alkyl or C3 to C10 cycloalkyl.

4. The organic compound according to claim 1, wherein $R_1$, $R_2$, $R_3$, $R_4$, $R_5$, $R_6$, and $R_7$ are each independently selected from methyl, isopropyl, t-butyl, cyclohexyl, phenyl, naphthyl,

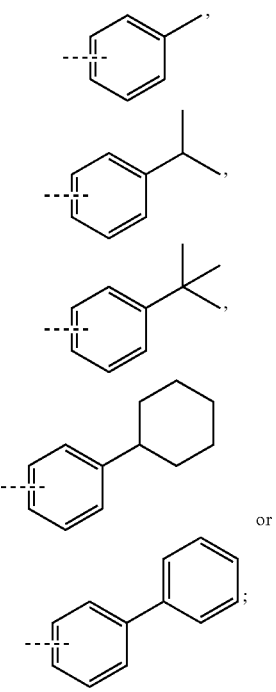

wherein the dotted line represents the linkage site of the group.

5. The organic compound according to claim 1, wherein $n_1$, $n_2$, $n_3$, $n_4$, $n_5$, $n_6$, and $n_7$ are each independently selected from integers from 0 to 2.

6. The organic compound according to claim 1, wherein the sum of $n_1$, $n_2$, $n_3$, $n_4$, $n_5$, $n_6$, and $n_7$ ranges from 1 to 8.

7. The organic compound according to claim 1, having a structure as shown in Formula II:

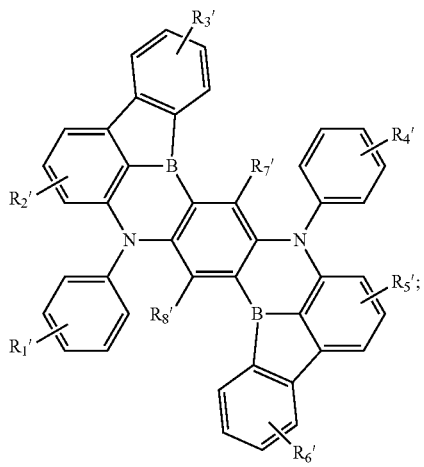

Formula II wherein $R_1'$, $R_2'$, $R_3'$, $R_4'$, $R_5'$, $R_6'$, $R_7'$, and $R_8'$ are each independently selected from any one of hydrogen, substituted or unsubstituted C1 to C30 linear or branched alkyl, substituted or unsubstituted C3 to C30 cycloalkyl, or substituted or unsubstituted C6 to C30 aryl;

substituted substituents in $R_1'$, $R_2'$, $R_3'$, $R_4'$, $R_5'$, $R_6'$, $R_7'$, and $R_8'$ are each independently selected from at least one of halogen, cyano, C1 to C10 linear or branched alkyl, C1 to C10 alkoxy, C6 to C20 aryl or C6 to C20 arylamino.

8. The organic compound according to claim 7, having a structure as shown in Formula III:

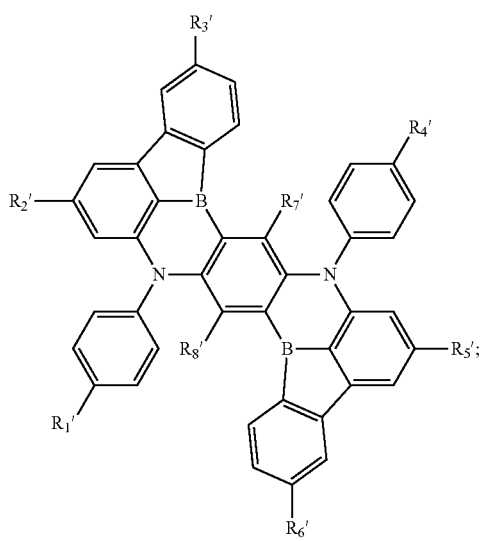

Formula III wherein $R_1'$, $R_2'$, $R_3'$, $R_4'$, $R_5'$, $R_6'$, $R_7'$, and $R_8'$ have the same range as defined in Formula II.

9. The organic compound according to claim 7, wherein $R_1'$, $R_2'$, $R_3'$, $R_4'$, $R_5'$, $R_6'$, $R_7'$, and $R_8'$ are each independently selected from any one of hydrogen, C1 to C10 linear or branched alkyl, substituted or unsubstituted C3 to C10 cycloalkyl, or substituted or unsubstituted C6 to C20 aryl; and substituted substituents in $R_1'$, $R_2'$, $R_3'$, $R_4'$, $R_5'$, $R_6'$, $R_7'$, and $R_8'$ are each independently selected from at least one of C1 to C10 linear or branched alkyl or C3 to C10 cycloalkyl.

10. The organic compound according to claim 7, wherein $R_1'$, $R_2'$, $R_3'$, $R_4'$, $R_5'$, $R_6'$, $R_7'$, and $R_8'$ are each independently selected from hydrogen, methyl, isopropyl, t-butyl, cyclohexyl, phenyl, naphthyl,

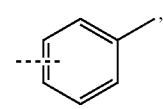,

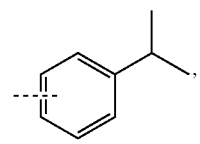,

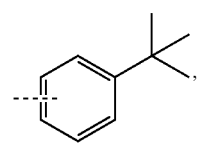,

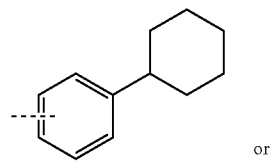 or

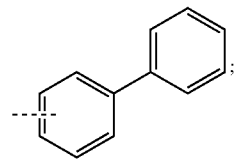;

wherein the dotted line represents the linkage site of the group.

11. The organic compound according to claim 7, wherein $R_1'$ and $R_4'$ are identical groups, $R_2'$ and $R_8'$ are identical groups, and $R_3'$ and $R_6'$ are identical groups.

12. The organic compound according to claim 7, wherein not all of $R_1'$, $R_2'$, $R_3'$, $R_4'$, $R_5'$, $R_6'$, $R_7'$, and $R_8'$ are hydrogen.

13. The organic compound according to claim 7, wherein the number of groups that are not hydrogen in $R_1'$, $R_2'$, $R_3'$, $R_4'$, $R_5'$, $R_6'$, $R_7'$, and $R_8'$ is 1 to 6.

14. The organic compound according to claim 1, selected from any one of the following compounds D1 to D105:

D1
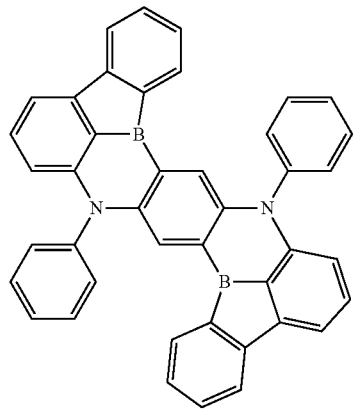
D2
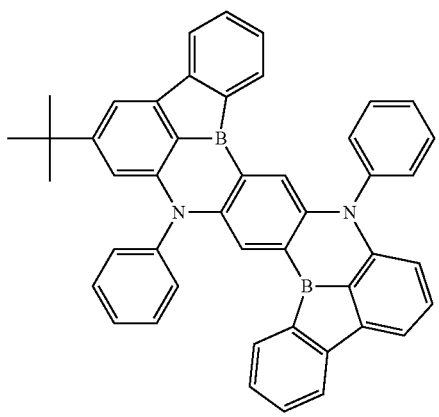
D3
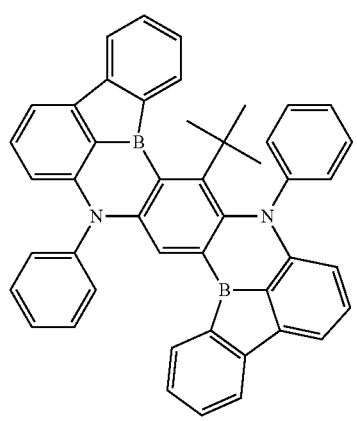
-continued
D4
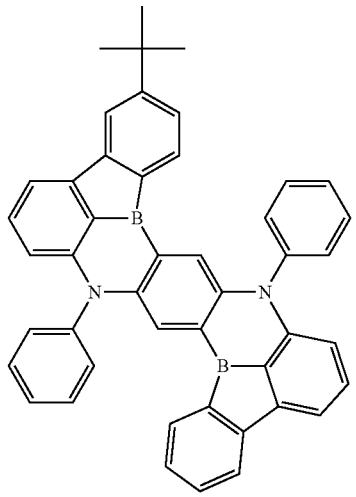
D5
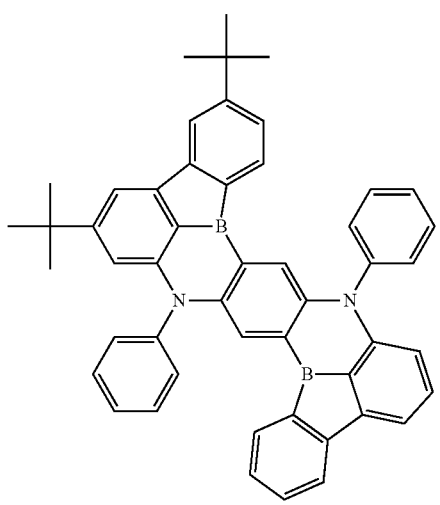
D6

D7
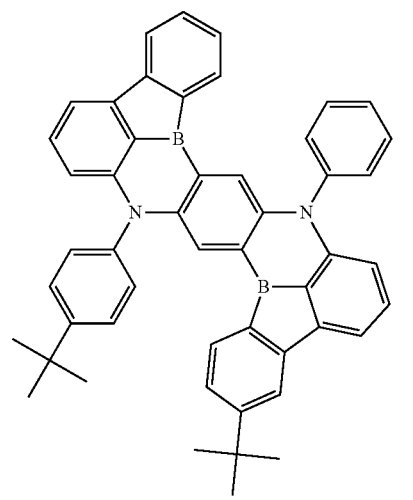
D8
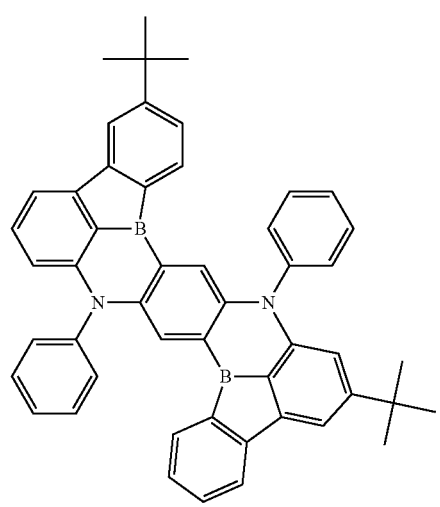
D9
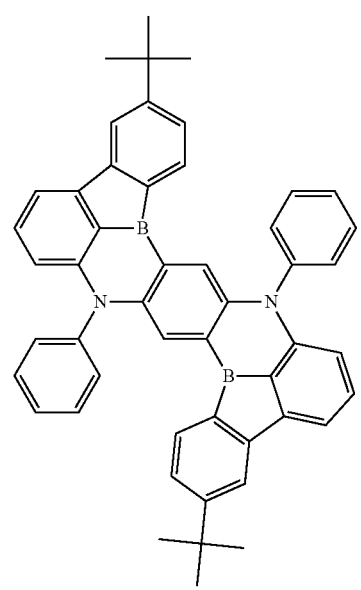
D10
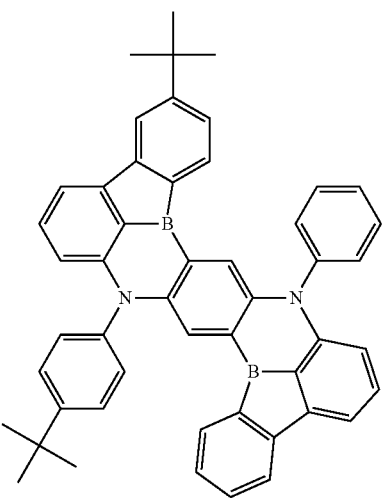
D11
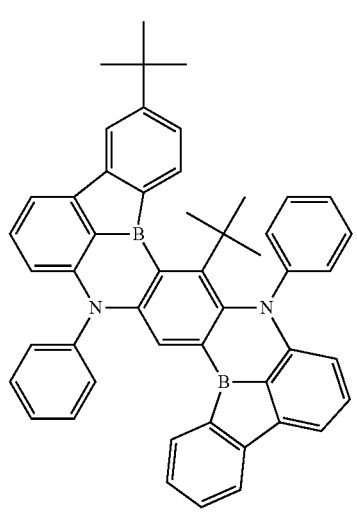
D12
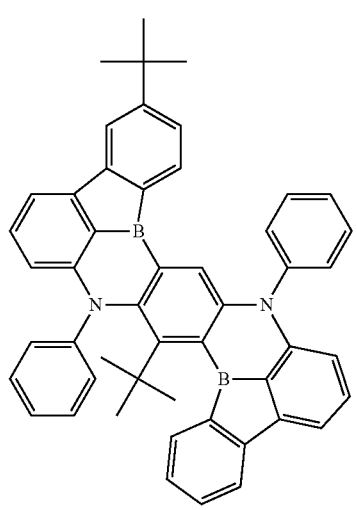

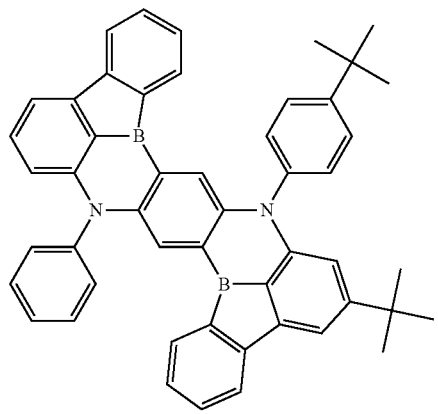
D13
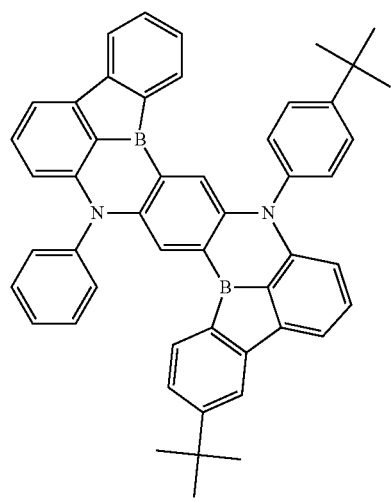
D14
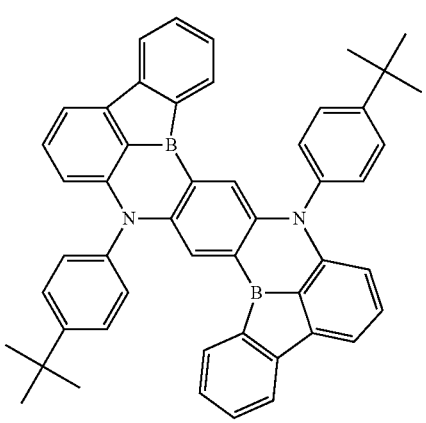
D15
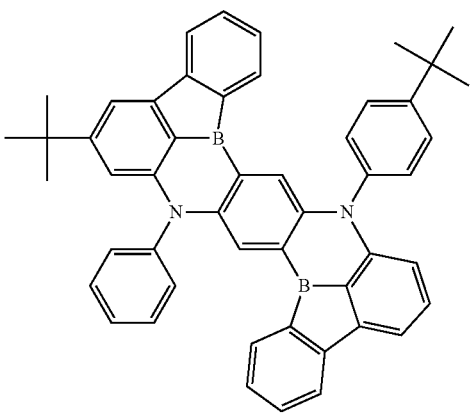
D16
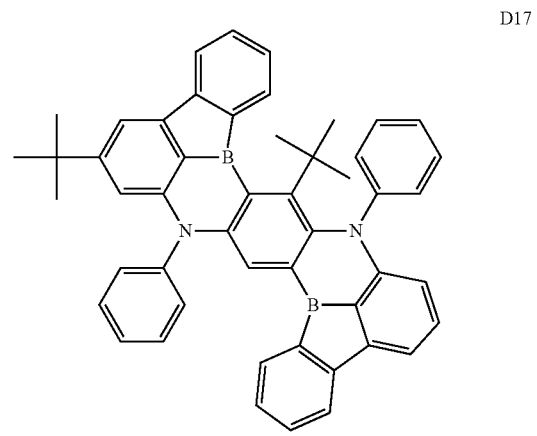
D17
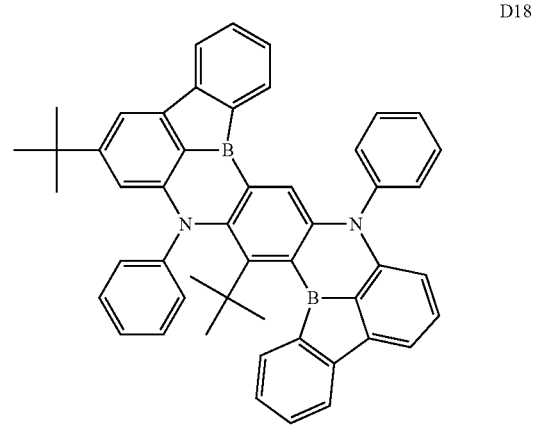
D18

-continued
D19
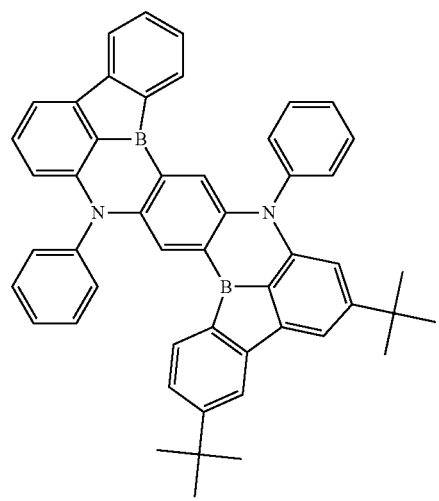
D20
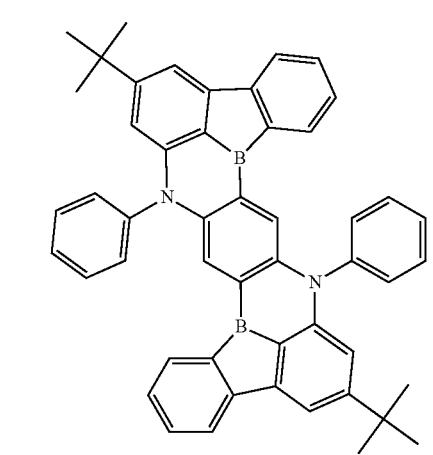
D21
D22
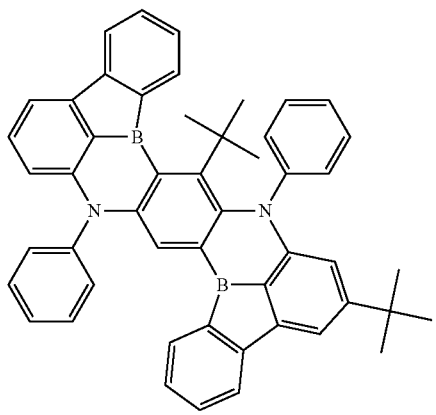
D23
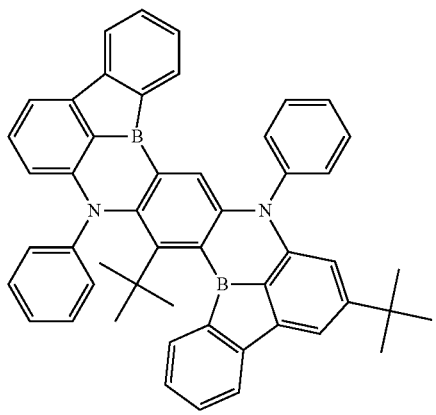
D24
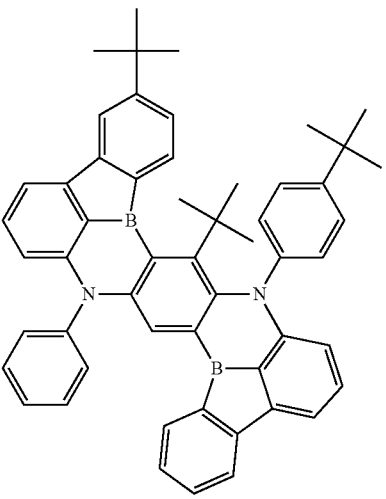

D25
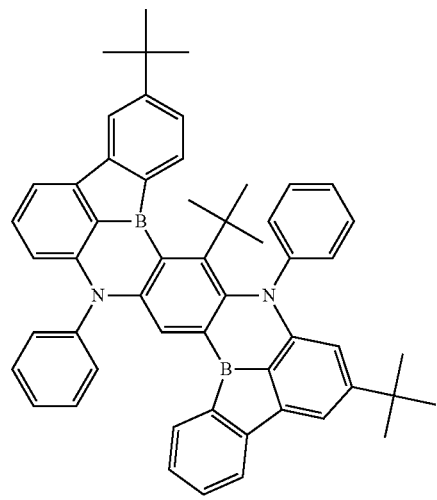
D26
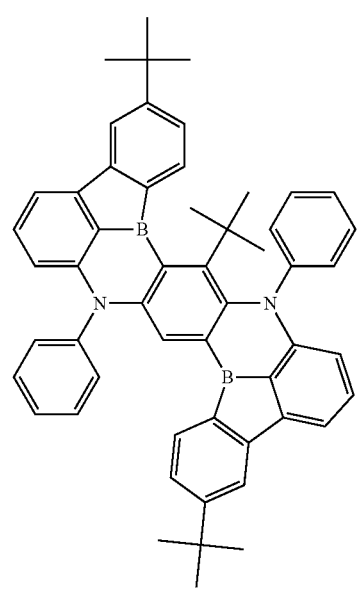
D27
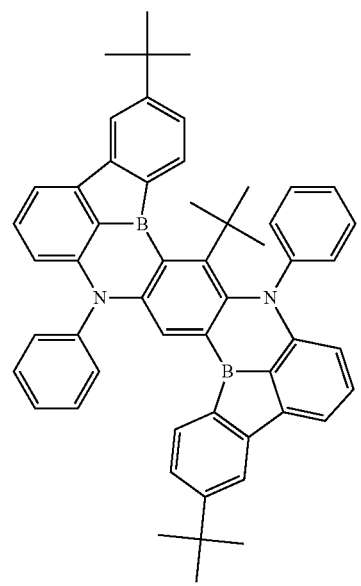
D28
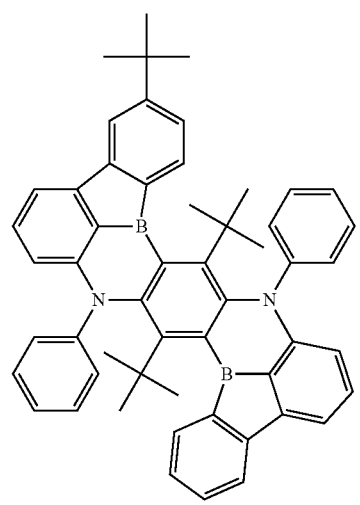
D29
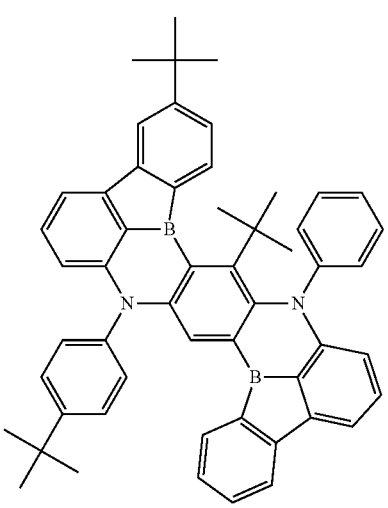
D30
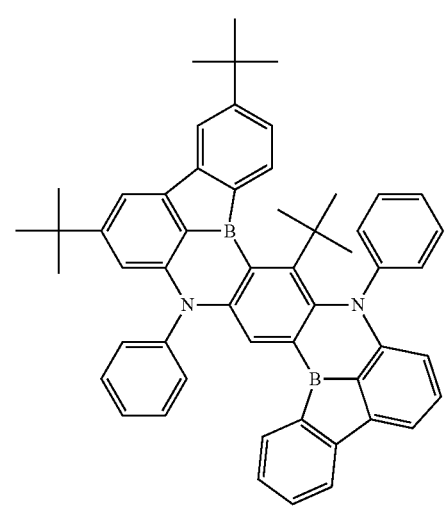

-continued
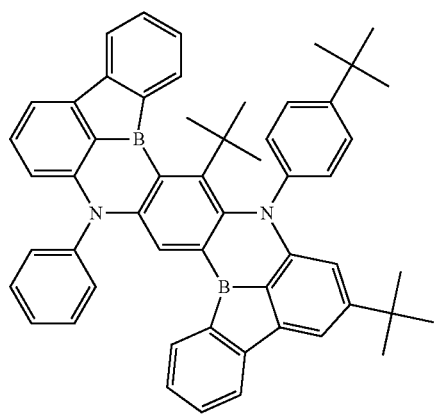
D31
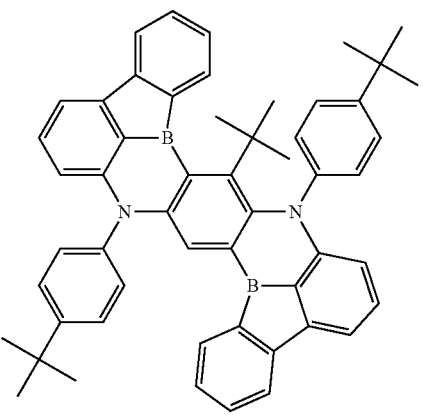
D34
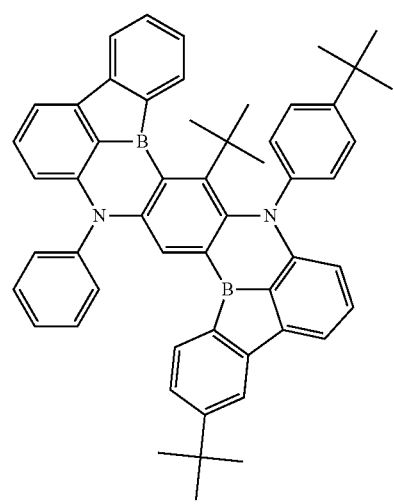
D32
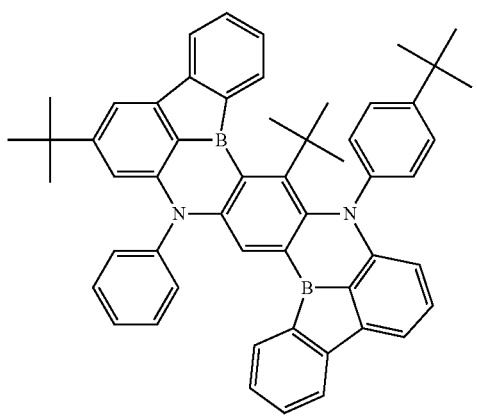
D35
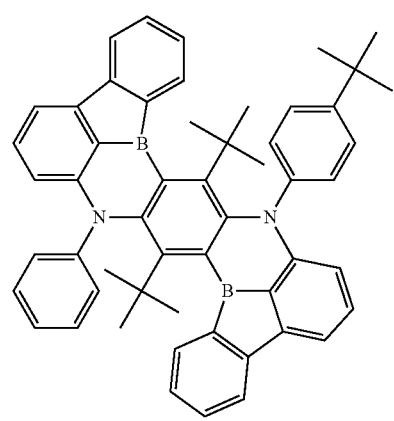
D33
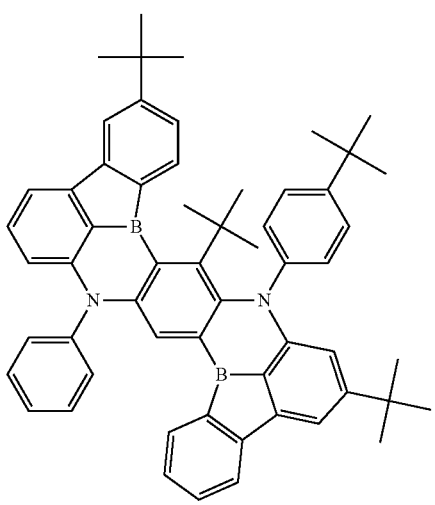
D36

-continued
D37
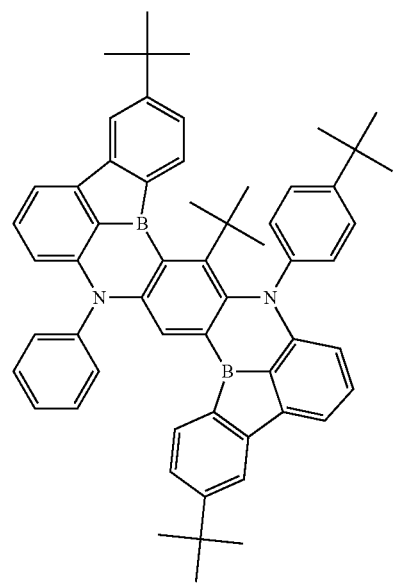
D38
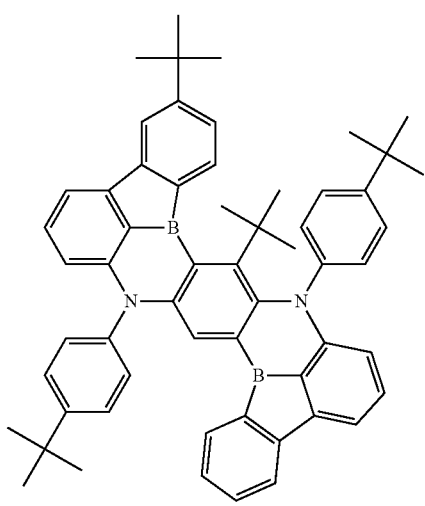
D39
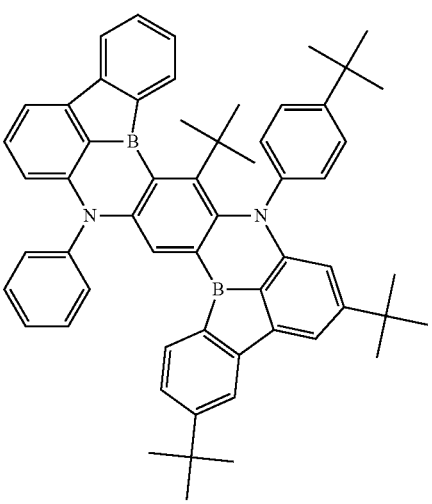
D40
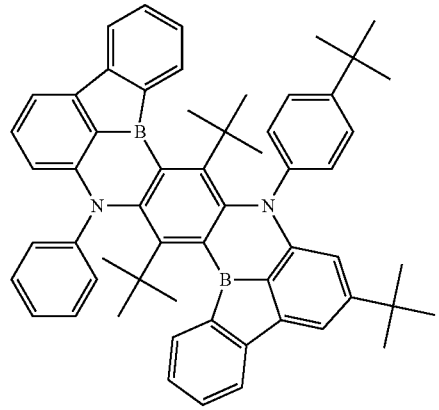
D41
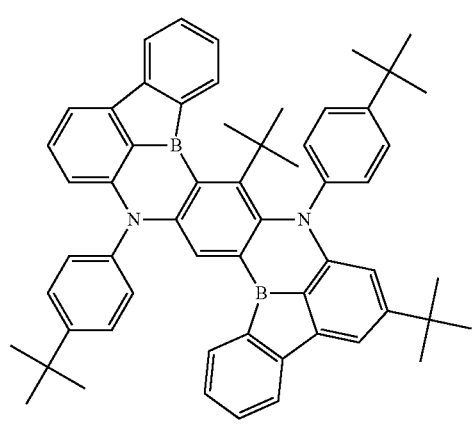
D42
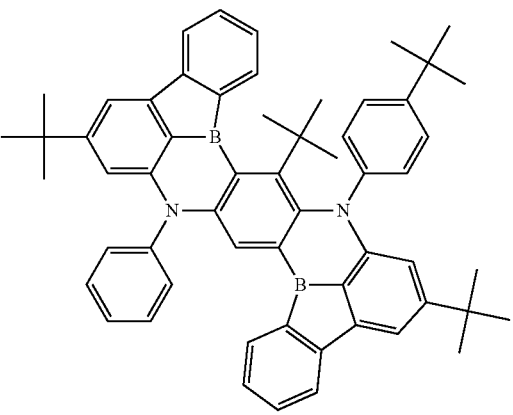

D43
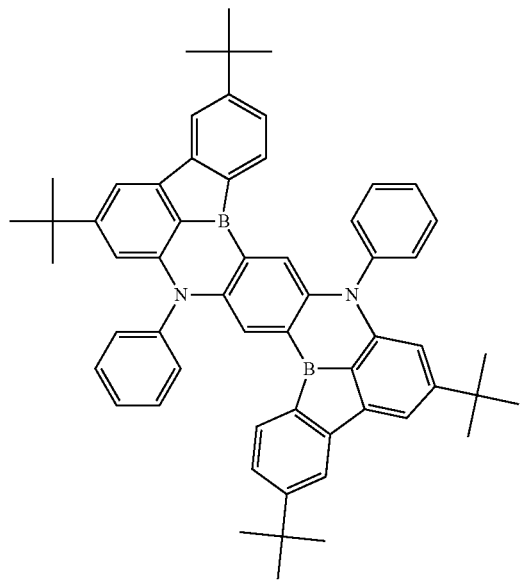
D44
D45
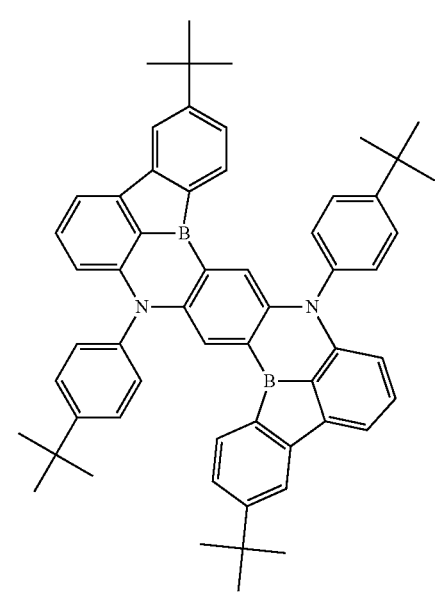
D46
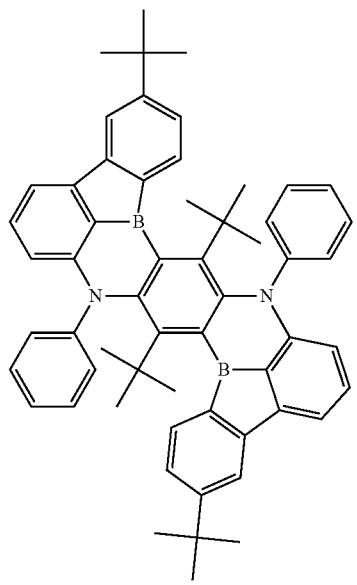
D47
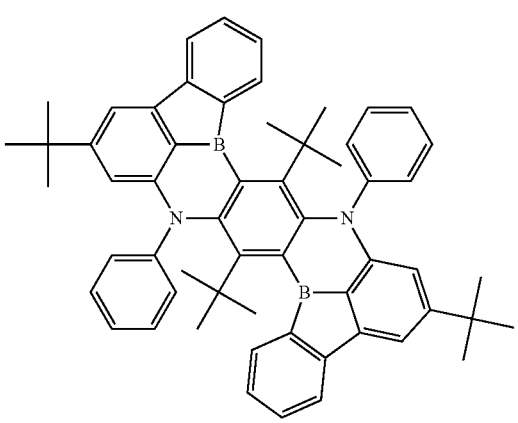
D48
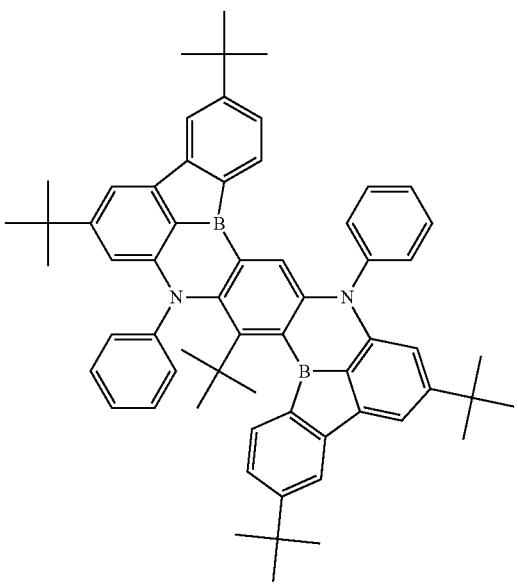

-continued
D49
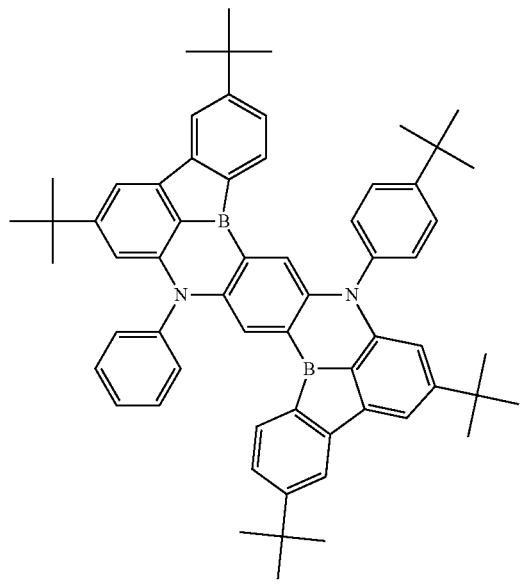
D50
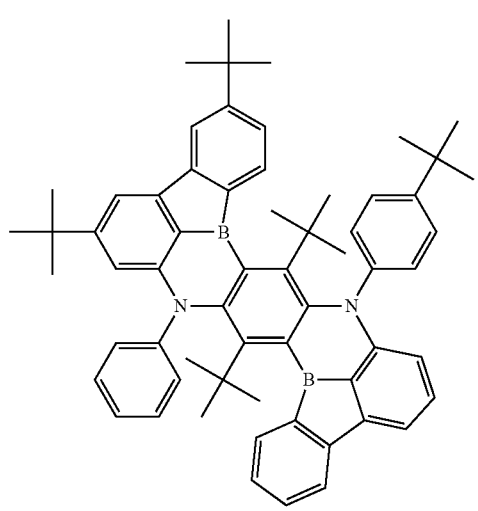
-continued
D51
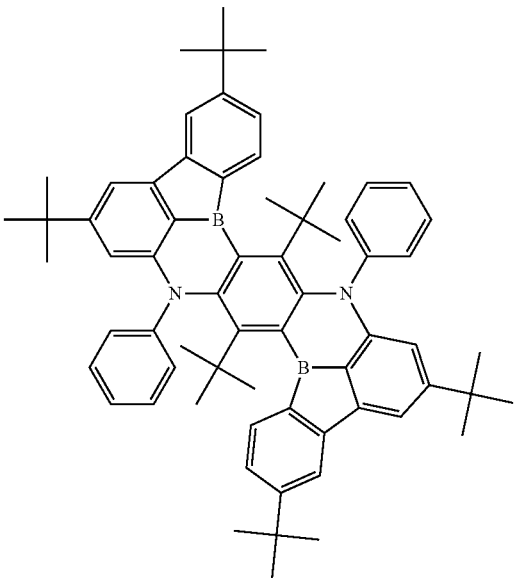
D52
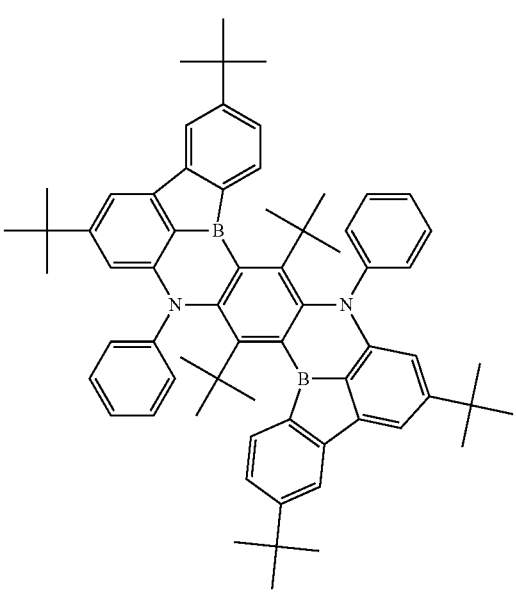

D53
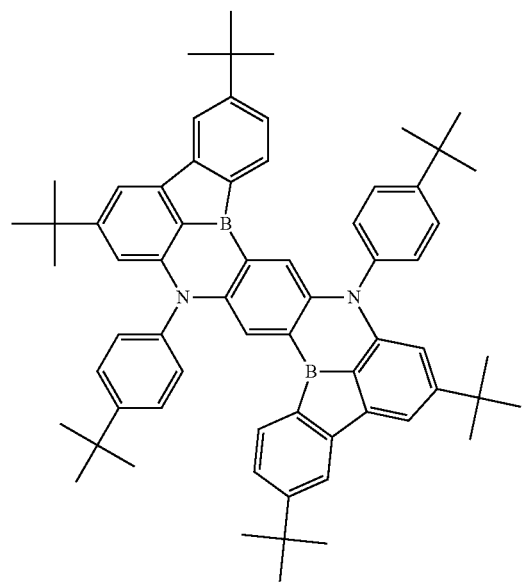
D54
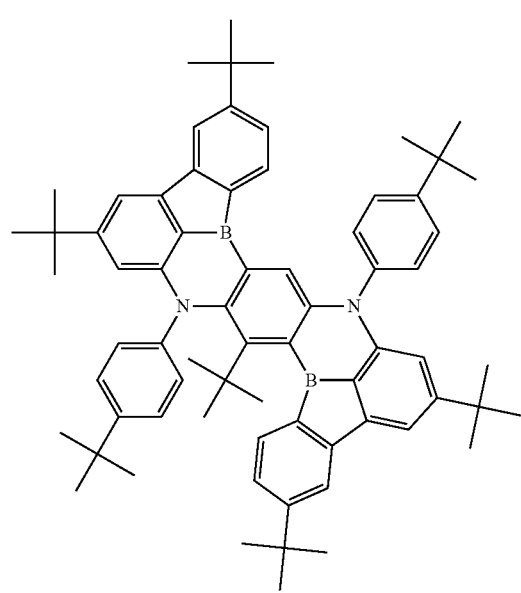
D55
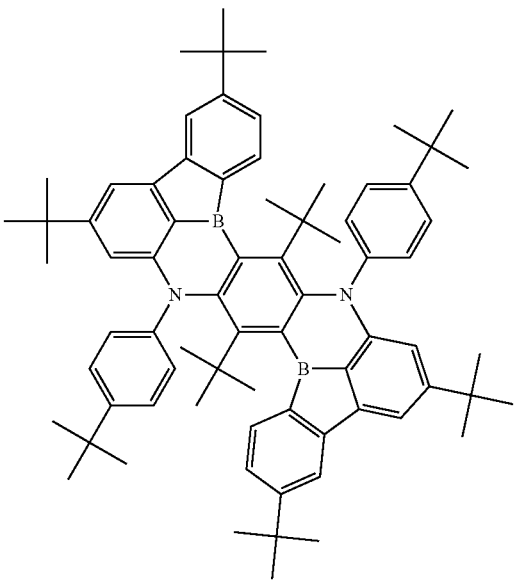
D56
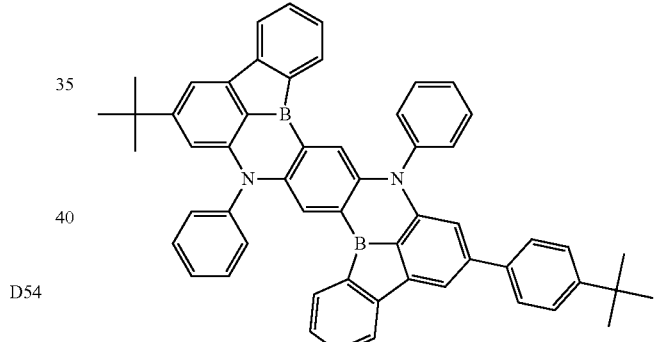
D57
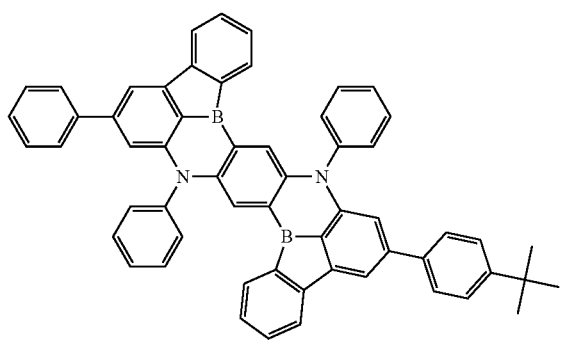

D58
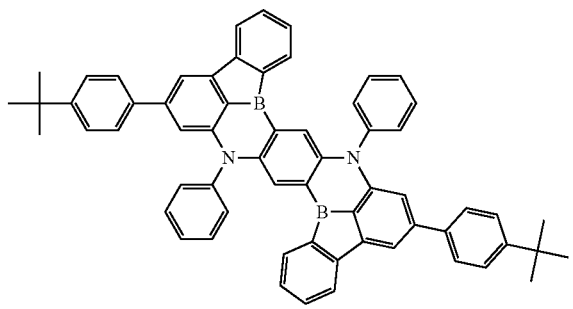
D59
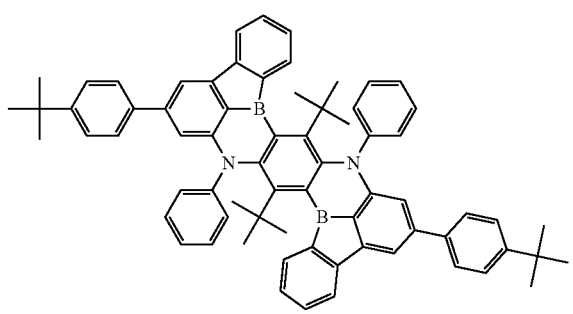
D60
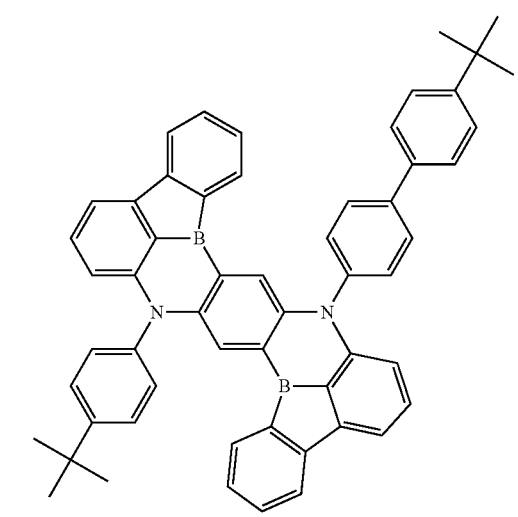
D61
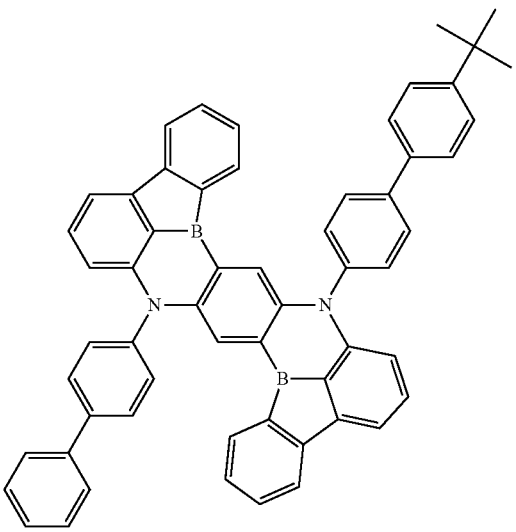
D62
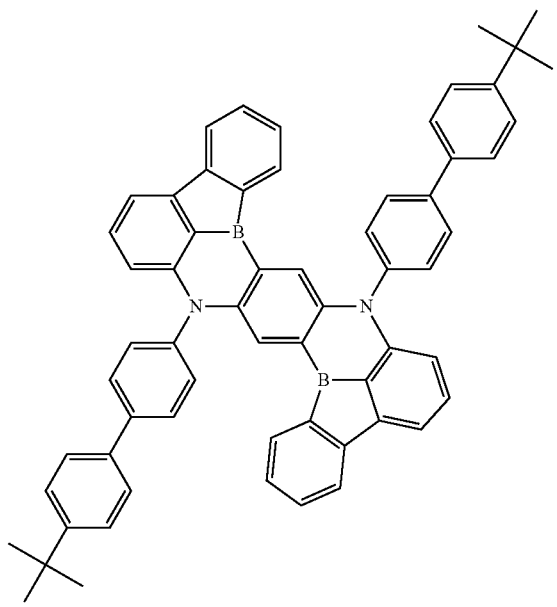

D63
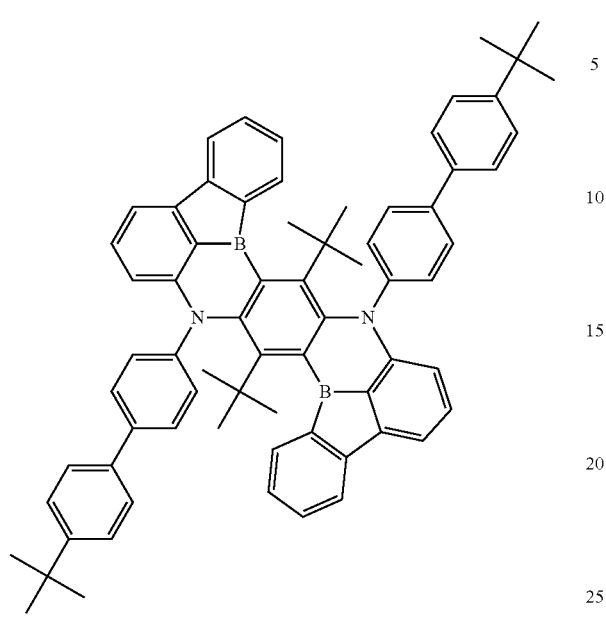
D65
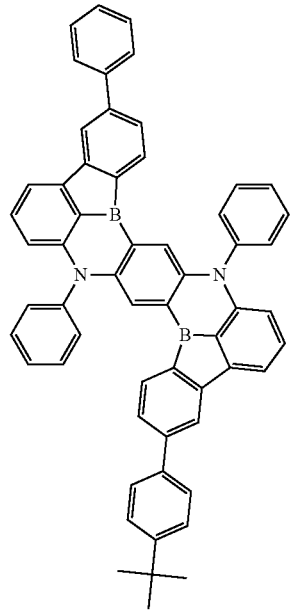
D64
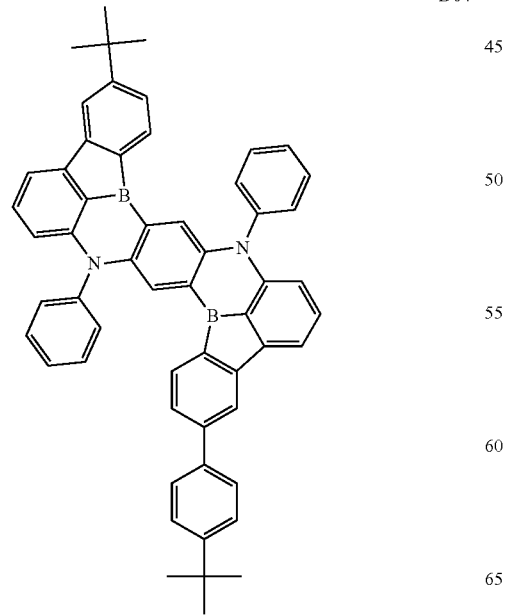
D66
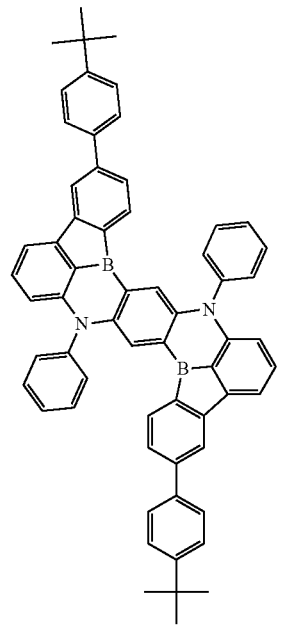

D67
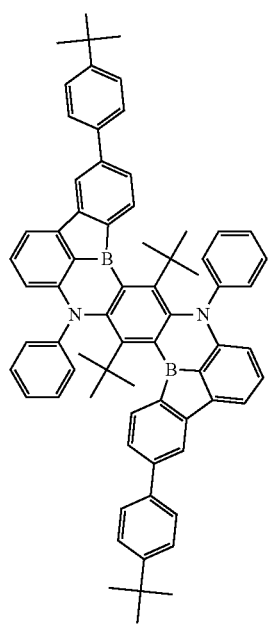
D68
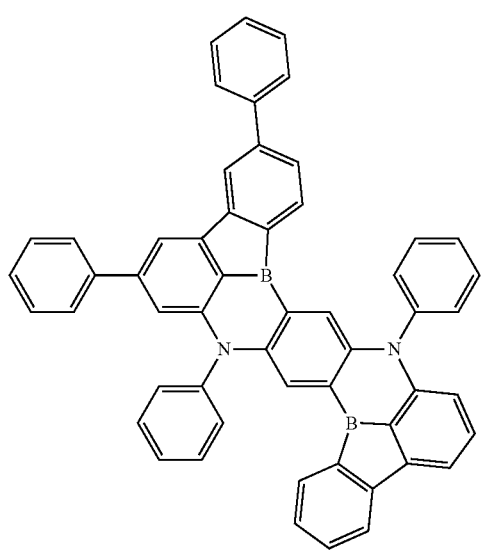
D69
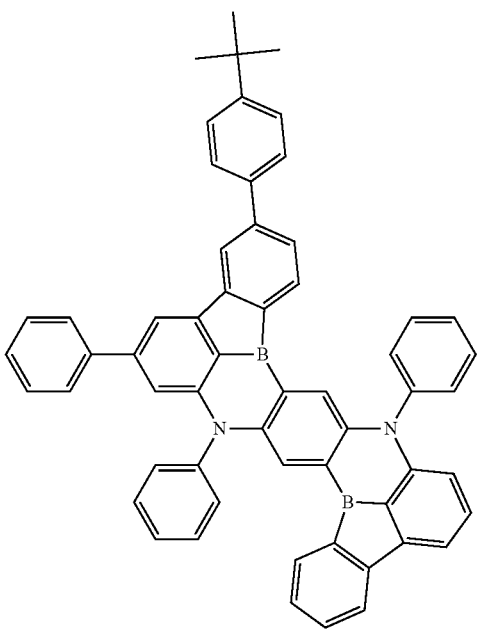
D70
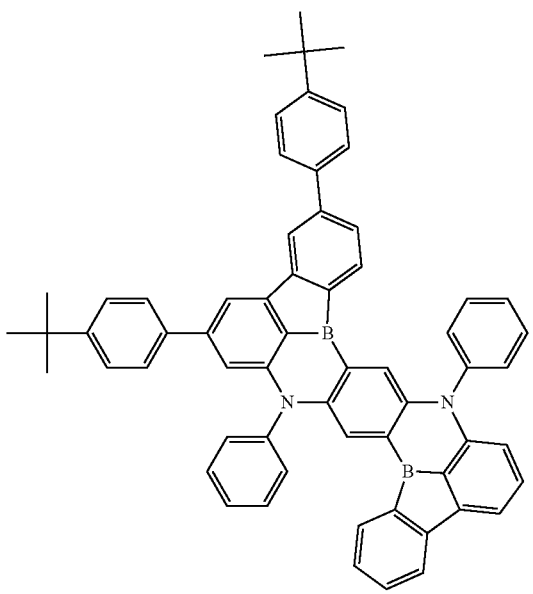

-continued
D71
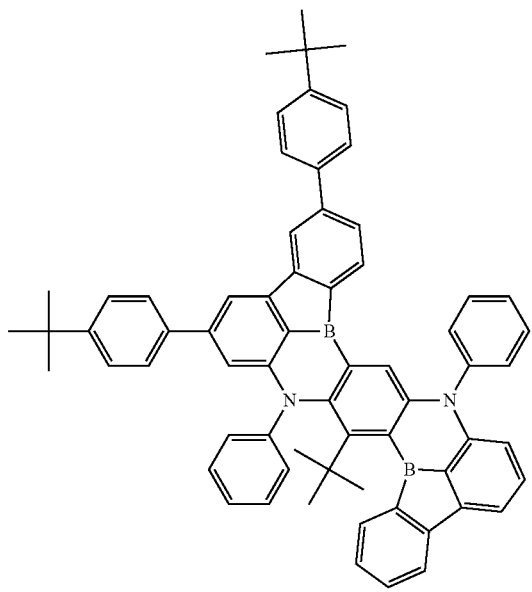
D72
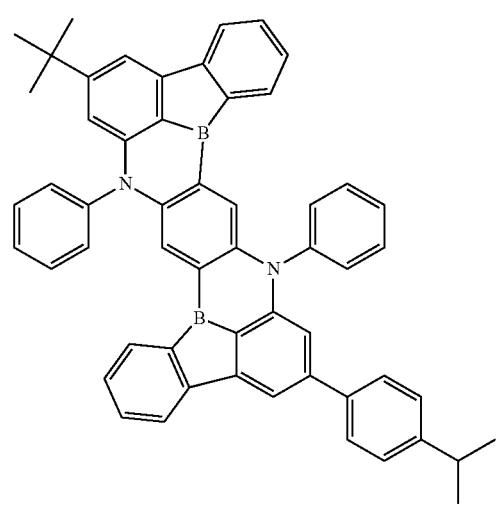
D73
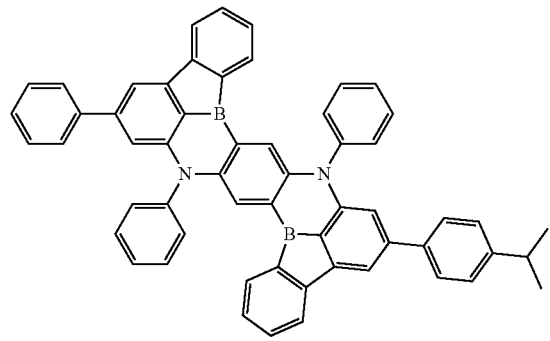
-continued
D74
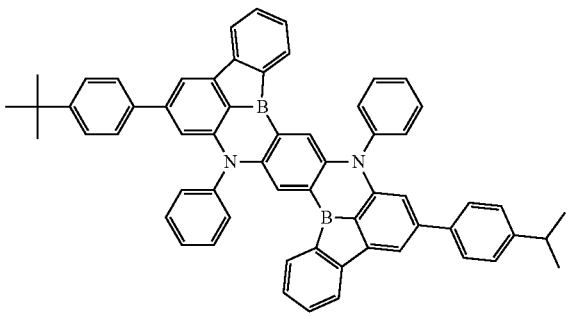
D75
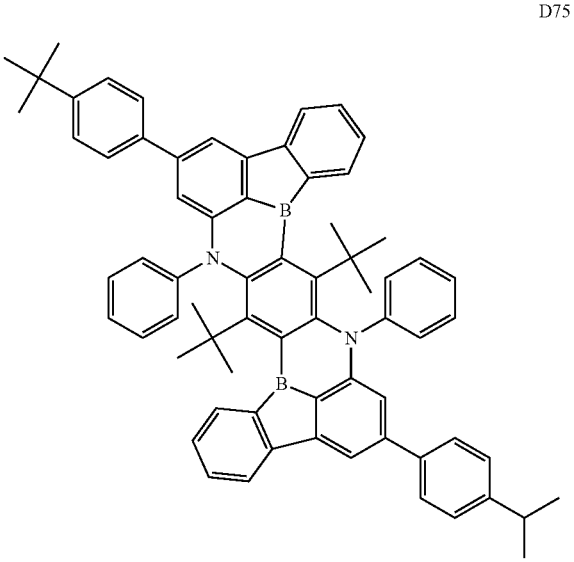
D76
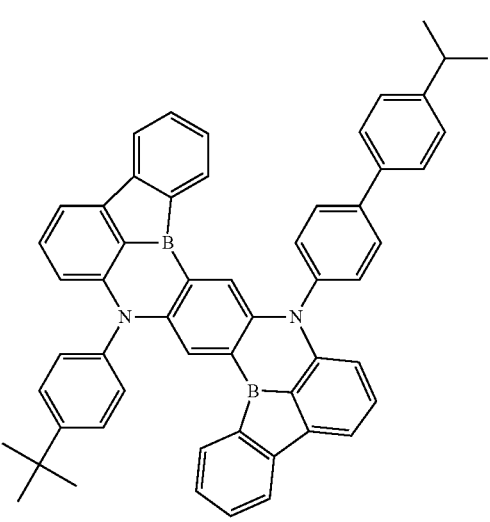

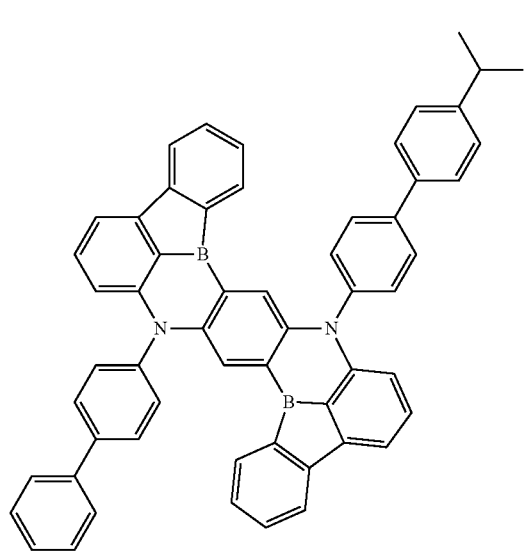
D77
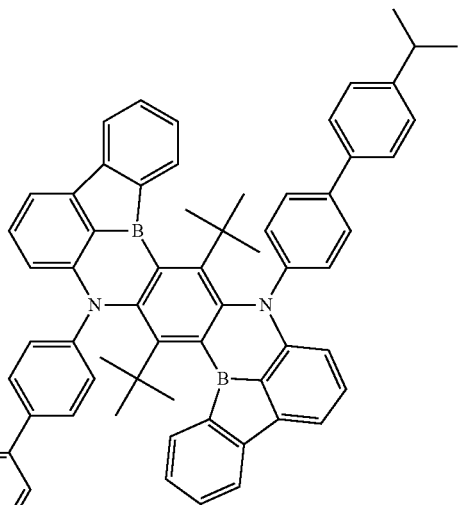
D79
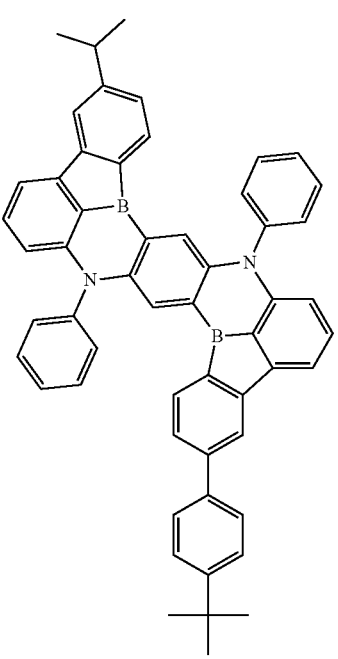
D80
D78

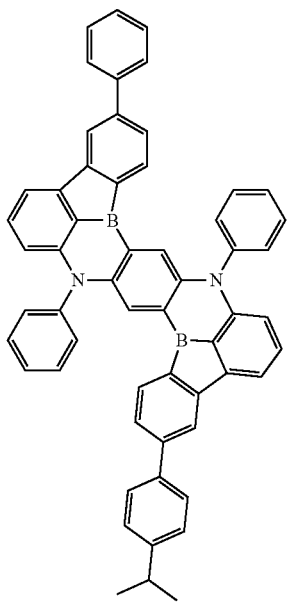
D81
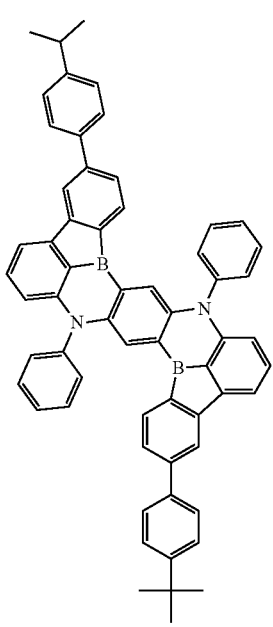
D82
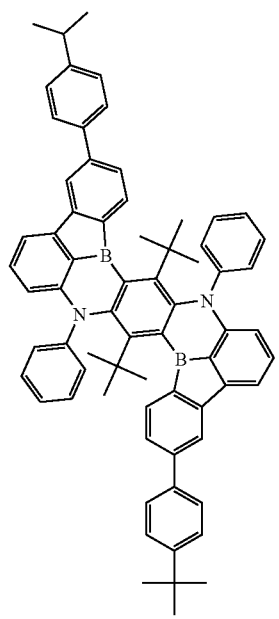
D83
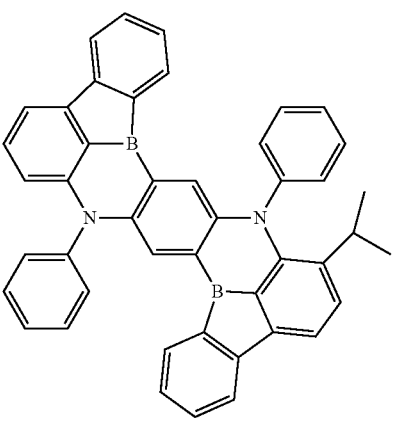
D84
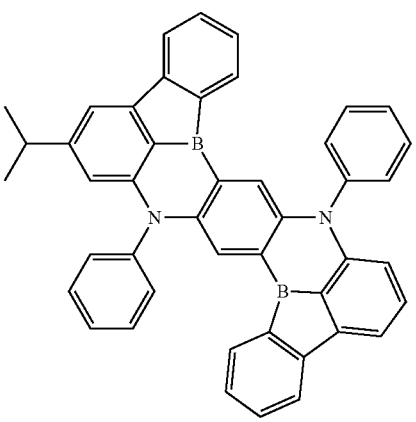
D85

D86
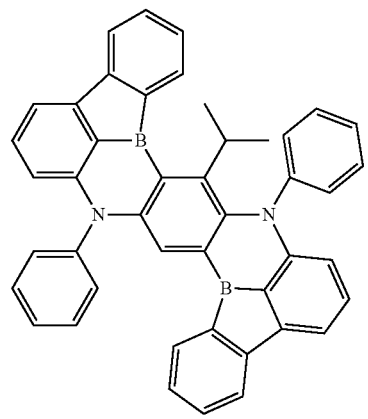
D87
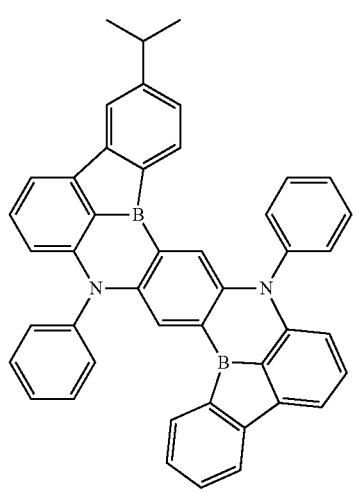
D88
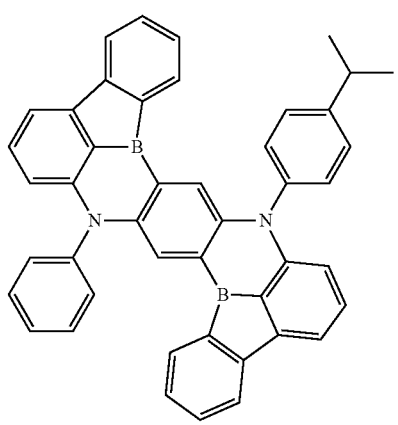
D89
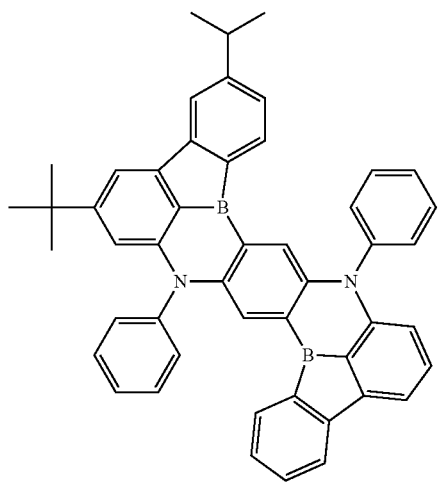
D90
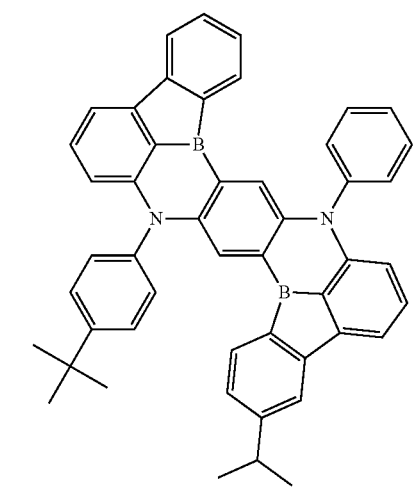
D91
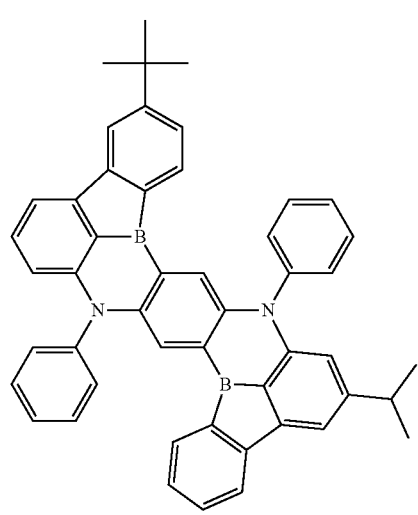

-continued
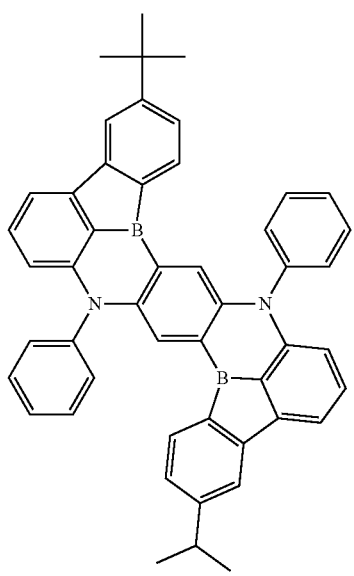
D92
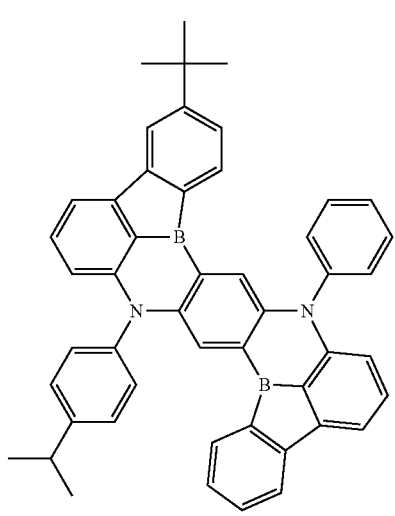
D93
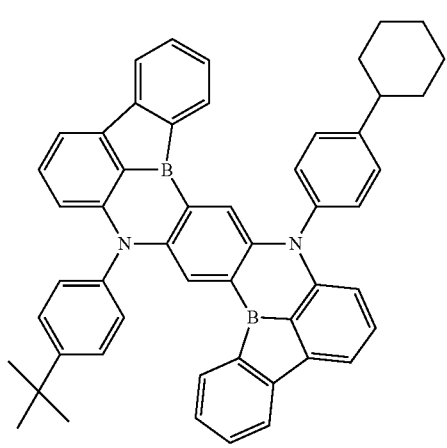
D94
-continued
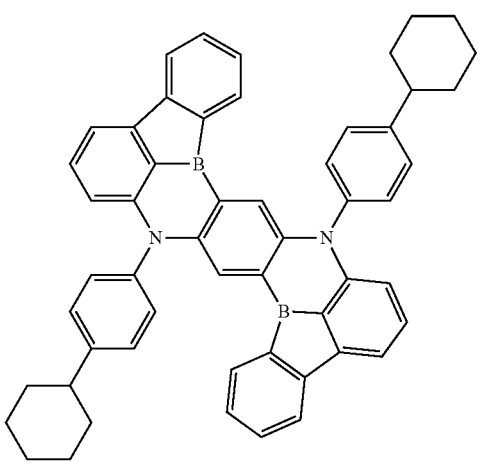
D95
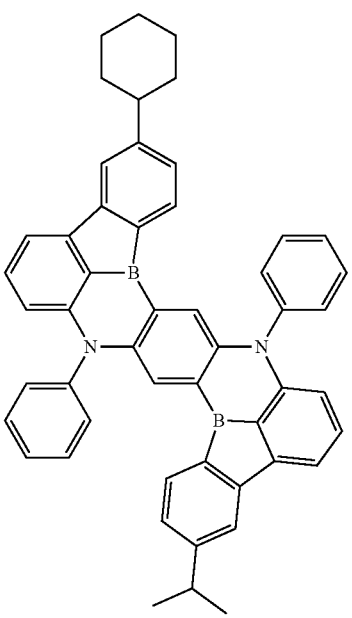
D96

D97
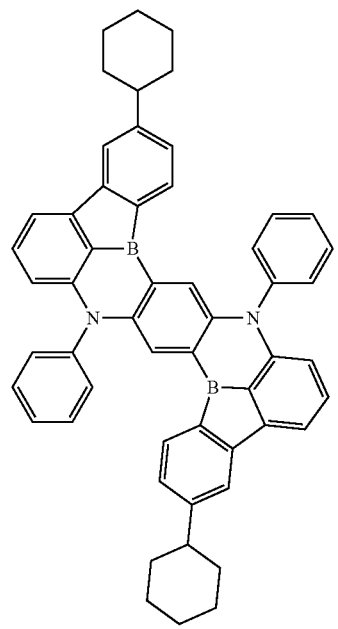
D98
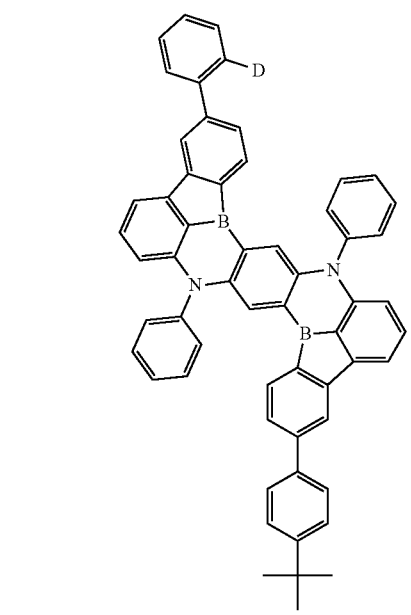
D99
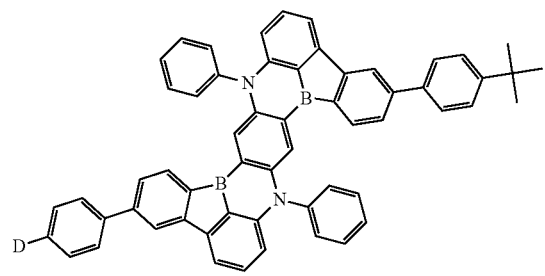
D100
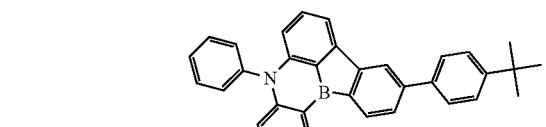
D101
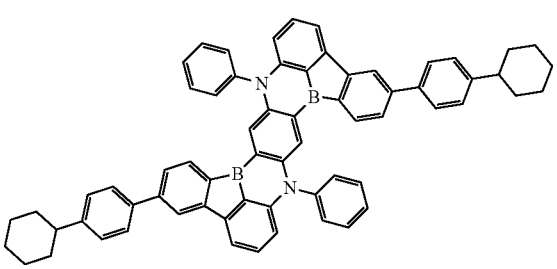
D102
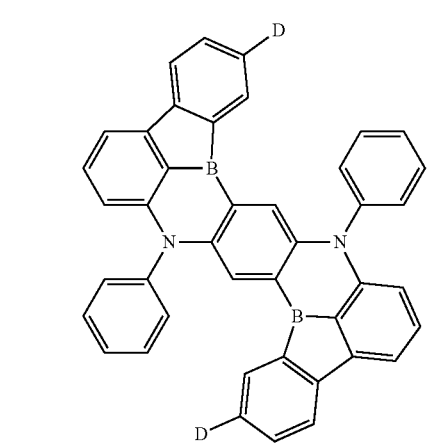

D103

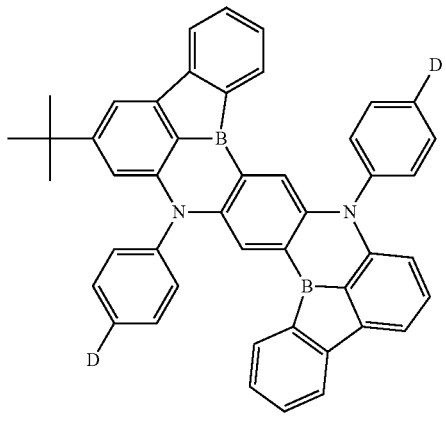

D104

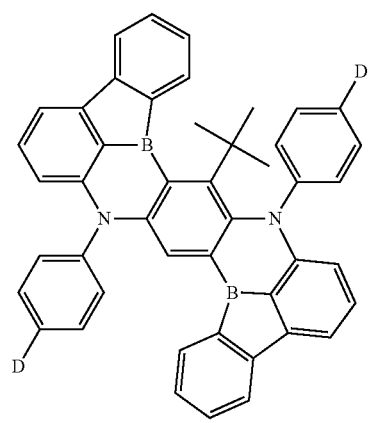

D105

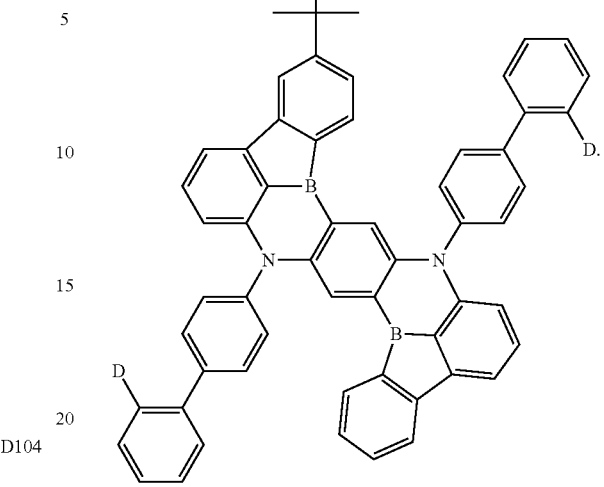

15. An OLED device, comprising an anode, a cathode, and an organic thin-film layer disposed between the anode and the cathode, wherein the organic thin-film layer comprises the organic compound according to claim 1.

16. The OLED device according to claim 15, wherein the organic thin-film layer comprises a light-emitting layer, and the light-emitting layer comprises the organic compound.

17. The OLED device according to claim 16, wherein the organic compound is used as a doped material of the light-emitting layer.

18. A display panel, comprising the OLED device according to claim 15.

19. An electronic device, comprising the OLED device according to claim 15.

* * * * *

UNITED STATES PATENT AND TRADEMARK OFFICE
CERTIFICATE OF CORRECTION

| | | |
|---|---|---|
| PATENT NO. | : 12,435,270 B2 | Page 1 of 1 |
| APPLICATION NO. | : 17/830610 | |
| DATED | : October 7, 2025 | |
| INVENTOR(S) | : Ying Liu, Dong Jiang and Dongyang Deng | |

It is certified that error appears in the above-identified patent and that said Letters Patent is hereby corrected as shown below:

In the Claims

Column 70 Line 56: "wherein $R_1'$ and $R_4'$ are identical groups, $R_2'$ and $R_g'$ are identical groups" should be -- wherein $R_1'$ and $R_4'$ are identical groups, $R_2'$ and $R_5'$ are identical groups --.

Signed and Sealed this
Twenty-third Day of December, 2025

John A. Squires
*Director of the United States Patent and Trademark Office*